United States Patent

Maruyama et al.

[11] Patent Number: 5,883,437
[45] Date of Patent: Mar. 16, 1999

[54] METHOD AND APPARATUS FOR INSPECTION AND CORRECTION OF WIRING OF ELECTRONIC CIRCUIT AND FOR MANUFACTURE THEREOF

[75] Inventors: Shigenobu Maruyama, Ebina; Mikio Hongo; Satoru Todoroki, both of Yokohama; Masaaki Okunaka, Fujisawa; Hideo Matsuzaki, Mobara; Takanori Ninomiya, Hiratsuka; Kazushi Yoshimura, Kamakura; Fumikazu Ito, Fujisawa, all of Japan

[73] Assignee: Hitachi, Ltd., Tokyo, Japan

[21] Appl. No.: 580,531

[22] Filed: Dec. 28, 1995

[30] Foreign Application Priority Data

Dec. 28, 1994 [JP] Japan .................................. 6-326920
Jan. 30, 1995 [JP] Japan .................................. 7-012278
Mar. 3, 1995 [JP] Japan .................................. 7-043783

[51] Int. Cl.$^6$ .......................... H01L 23/48; H01L 29/52; H01L 29/40
[52] U.S. Cl. .............................. 257/773; 257/57; 257/59; 257/72; 257/529
[58] Field of Search .................... 257/773, 776, 257/48, 72, 664, 665, 750, 757, 920, 768–771, 649, 650, 350, 54, 59, 529, 530

[56] References Cited

U.S. PATENT DOCUMENTS

| | | | |
|---|---|---|---|
| 4,874,719 | 10/1989 | Kurosawa | 257/750 |
| 5,138,266 | 8/1992 | Stearns | 324/537 |
| 5,164,565 | 11/1992 | Addiego et al. | 219/121.68 |
| 5,327,011 | 7/1994 | Iwamatsu | 257/750 |
| 5,389,814 | 2/1995 | Srikrishnan et al. | 257/665 |

FOREIGN PATENT DOCUMENTS

| | | |
|---|---|---|
| 58-38874 | 3/1983 | Japan . |
| 1-45874 | 10/1989 | Japan . |
| 2-19838 | 1/1990 | Japan . |
| 2-10188 | 4/1990 | Japan . |
| 2-210391 | 8/1990 | Japan . |
| 4-277692 | 10/1992 | Japan . |
| 5-10999 | 1/1993 | Japan . |
| 5-88191 | 4/1993 | Japan . |
| 5-232493 | 9/1993 | Japan . |
| 6-27494 | 2/1994 | Japan . |
| 6-1045255 | 4/1994 | Japan . |
| 59-177358 | 10/1994 | Japan . |

*Primary Examiner*—Mahshid D. Saadat
*Assistant Examiner*—Jhihan B. Clark
*Attorney, Agent, or Firm*—Antonelli, Terry, Stout & Kraus, LLP

[57] ABSTRACT

A method and apparatus for inspecting wirings of an electronic circuit substrate to detect a defect in the wiring and for enabling correction thereof. The inspection method and apparatus include electrostatically coupling at least one electrode to a wiring pattern, applying a time varying voltage between the electrode and wiring pattern at different locations so as to detect a current flow and determine a defect by a variation in the detected current flow at the different locations and a portion of the defect. A defect in the form of a disconnected or half-disconnected point of the wiring may be corrected by supplying a solution of a metal complex to the disconnected or half-disconnected point, heating the solution and end point areas of the disconnected or half-disconnected point by laser light and precipitating a metal thin film establishing a connection of the wiring.

13 Claims, 24 Drawing Sheets

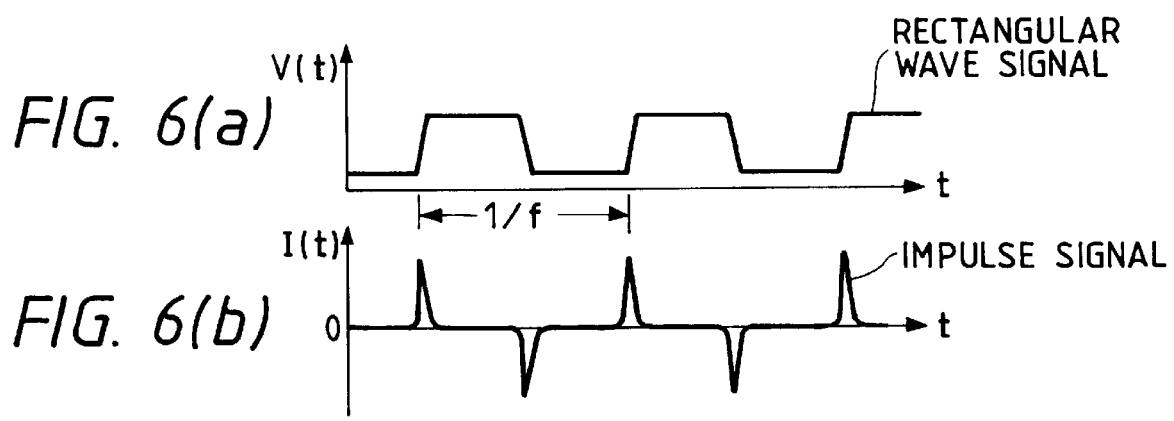
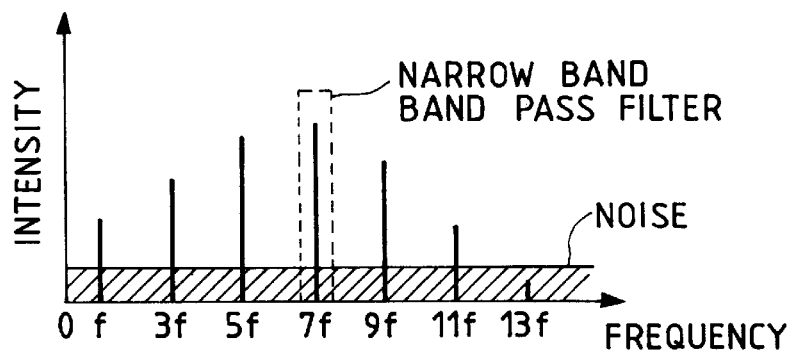
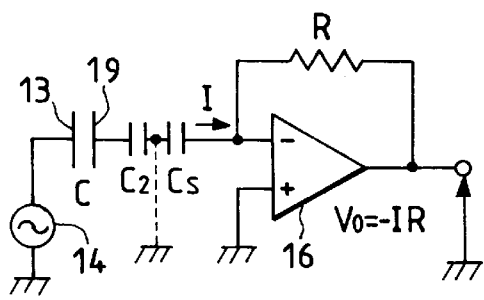 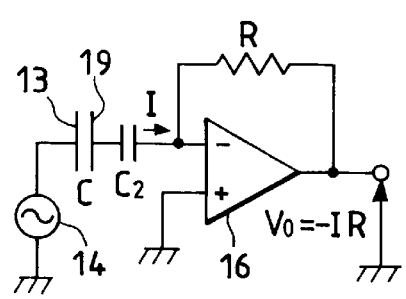

SELECTION ORDER

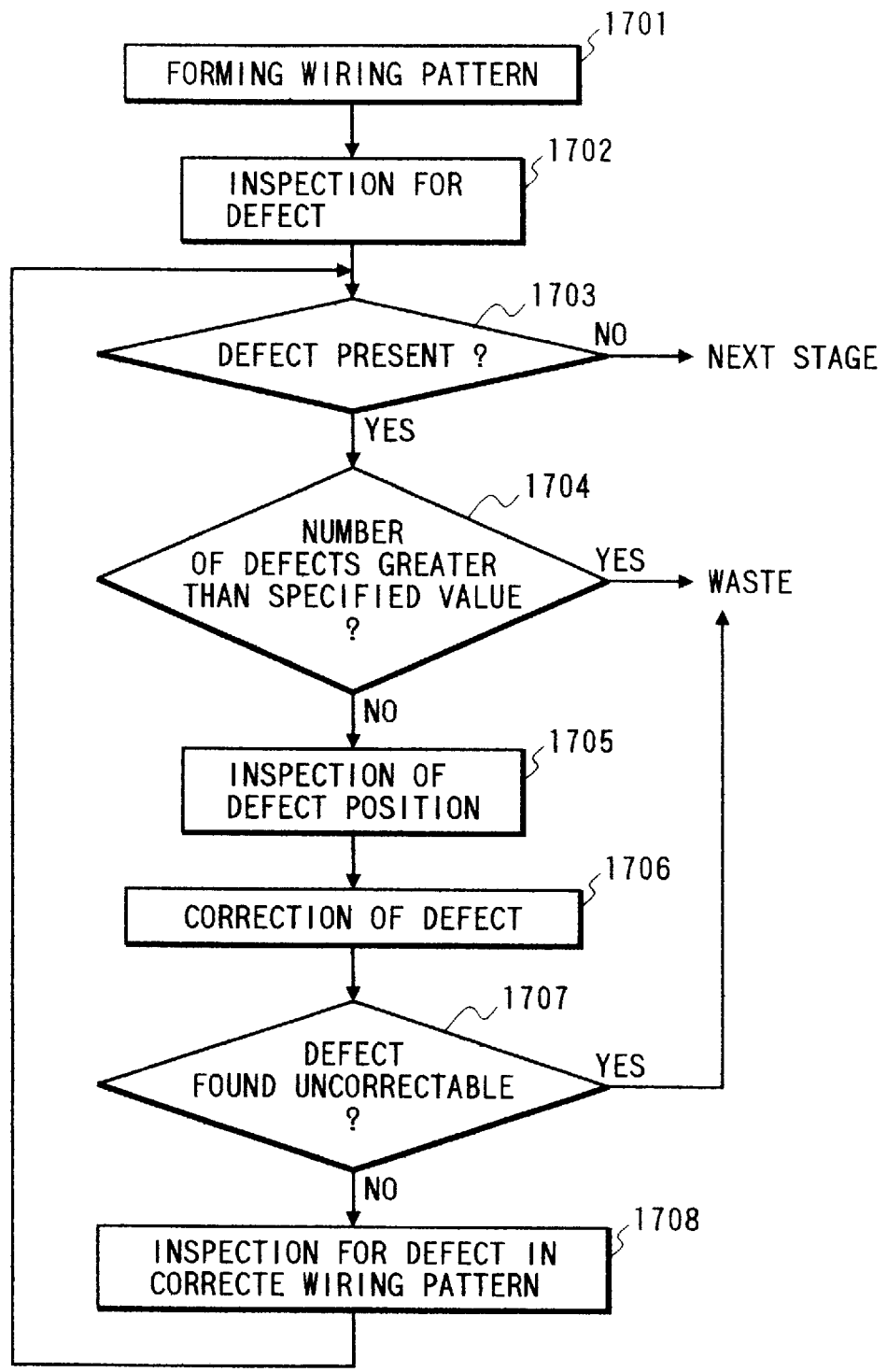

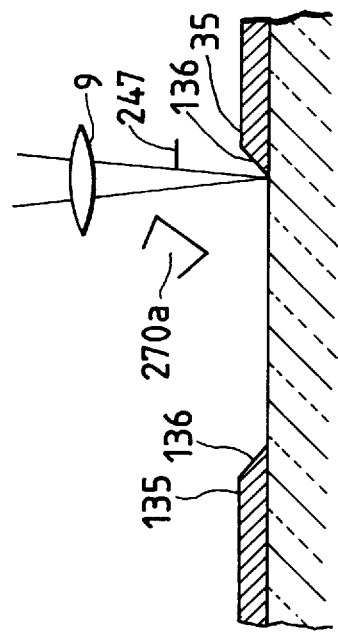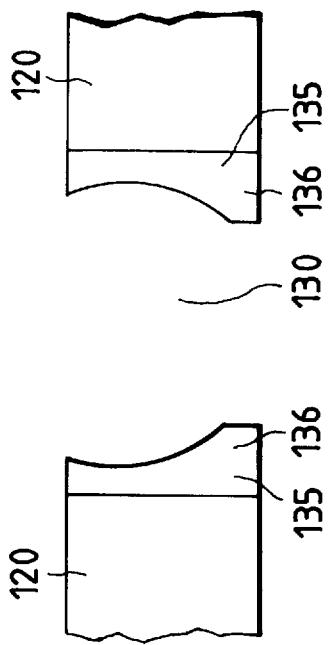
FIG. 20(a)
FIG. 20(c)
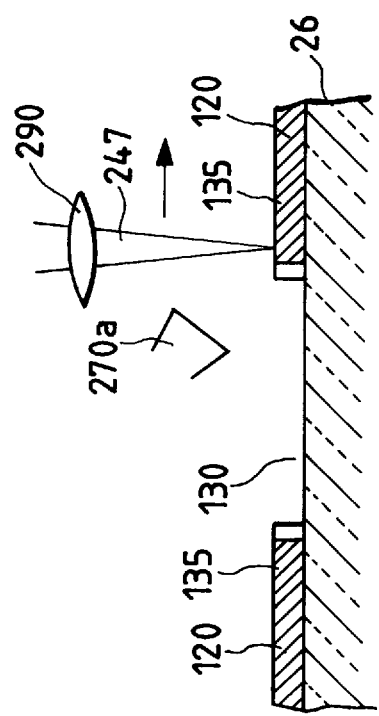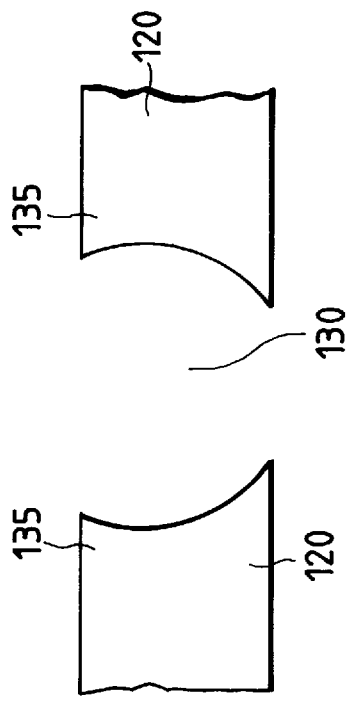
FIG. 20(b)
FIG. 20(d)

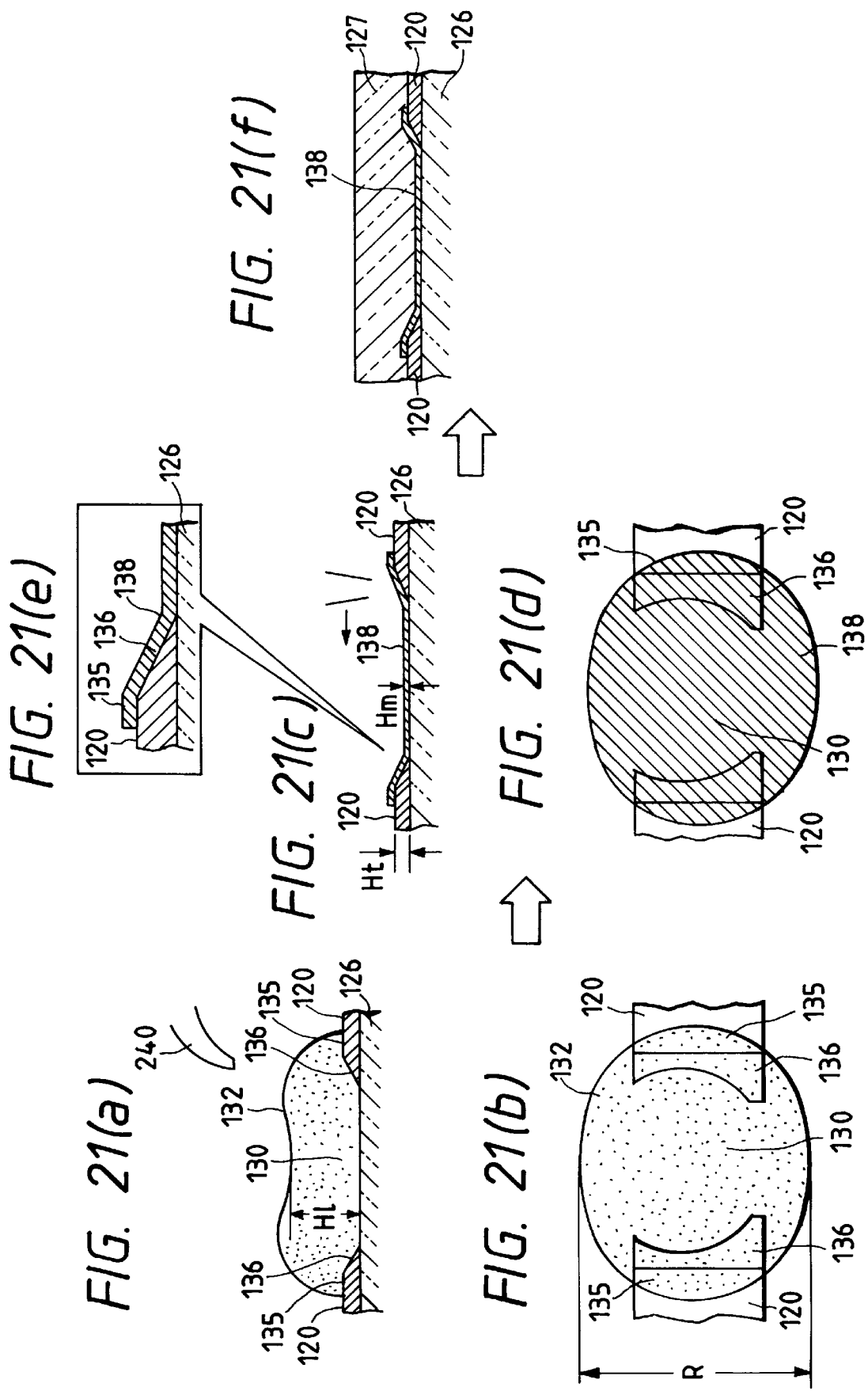

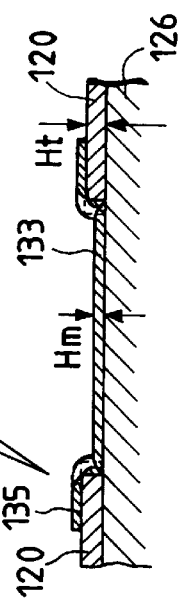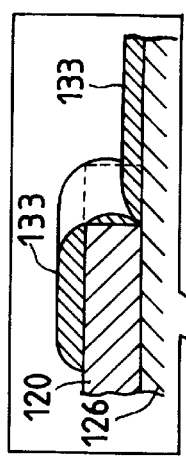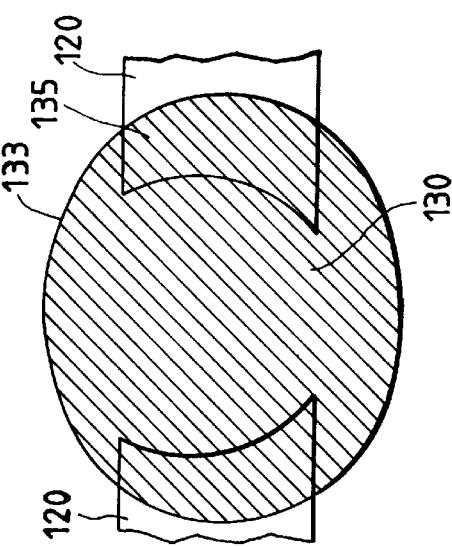
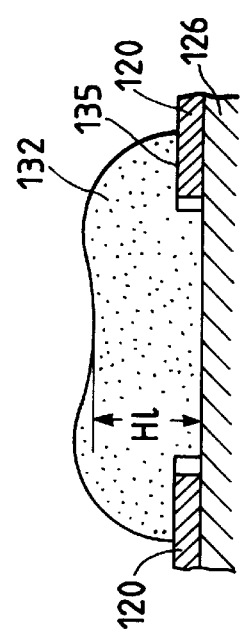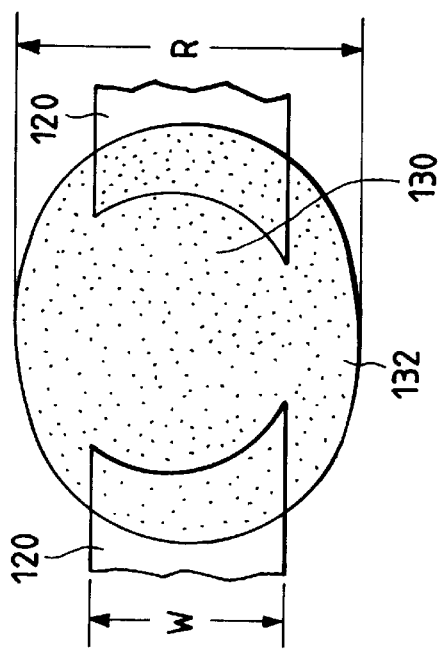

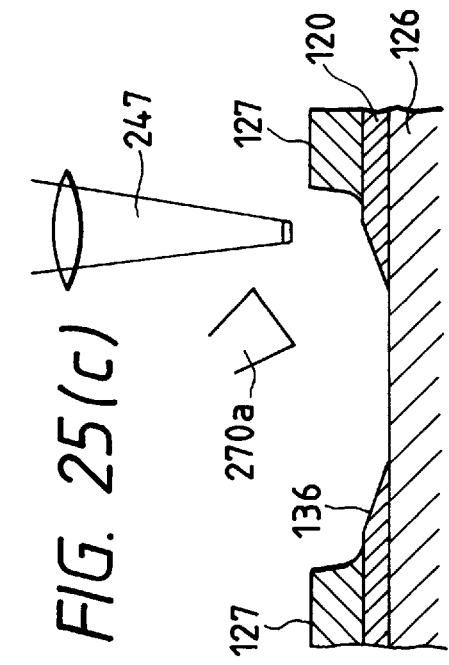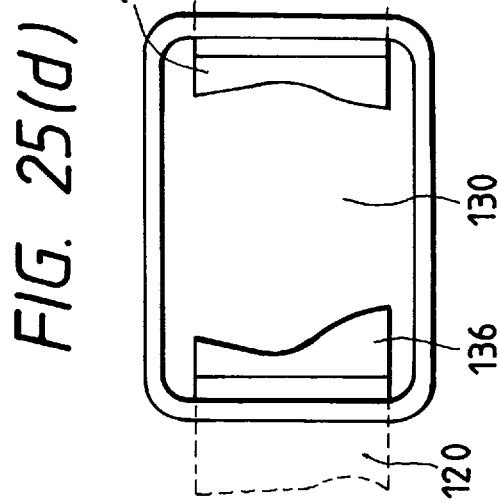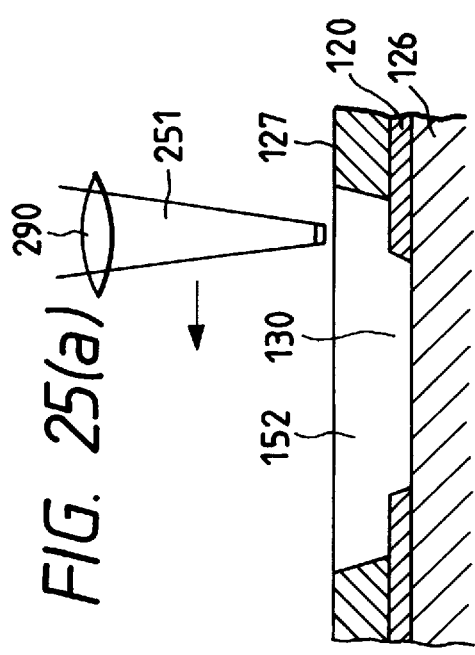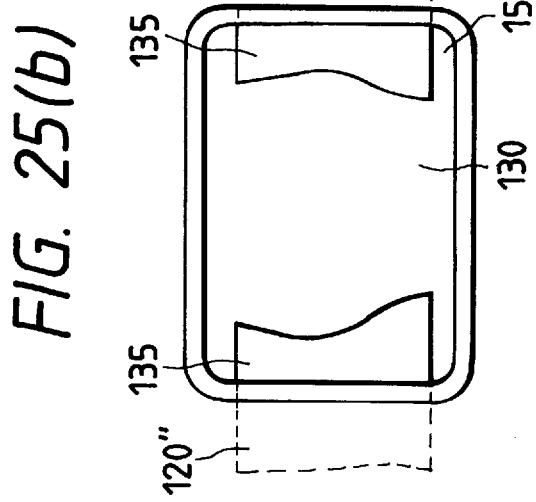

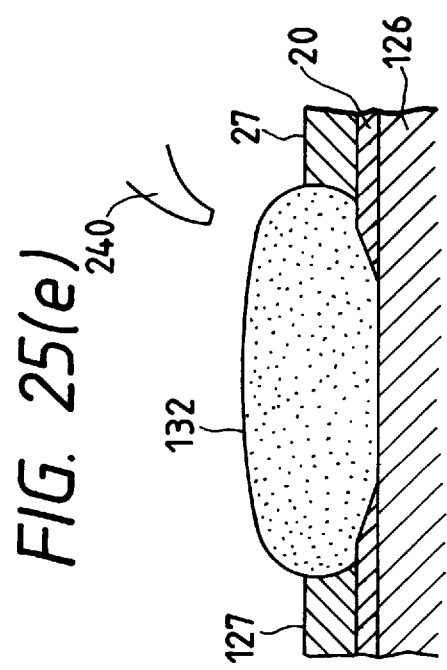
FIG. 25(e)
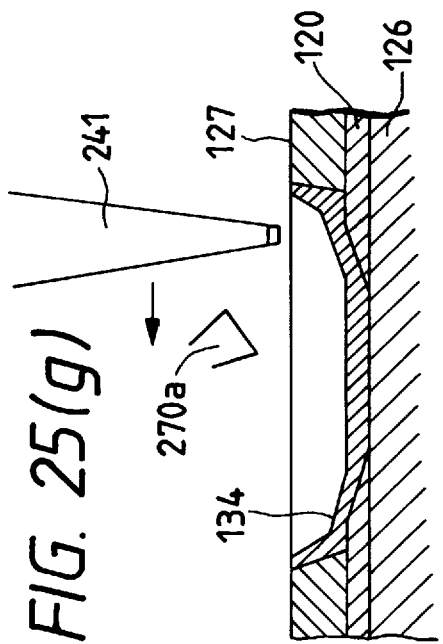
FIG. 25(g)
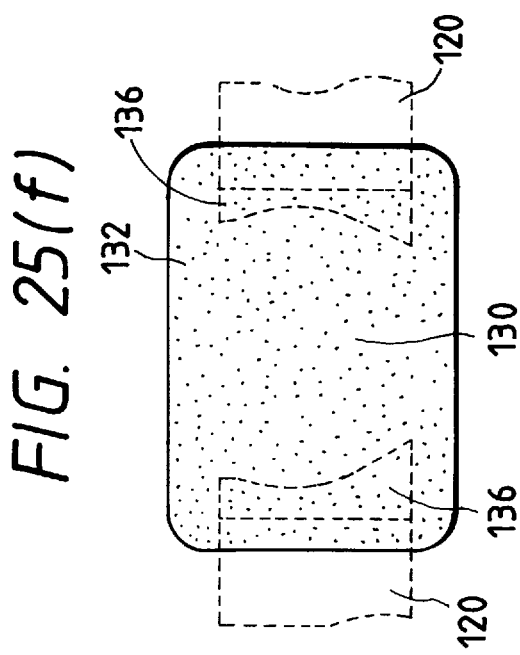
FIG. 25(f)
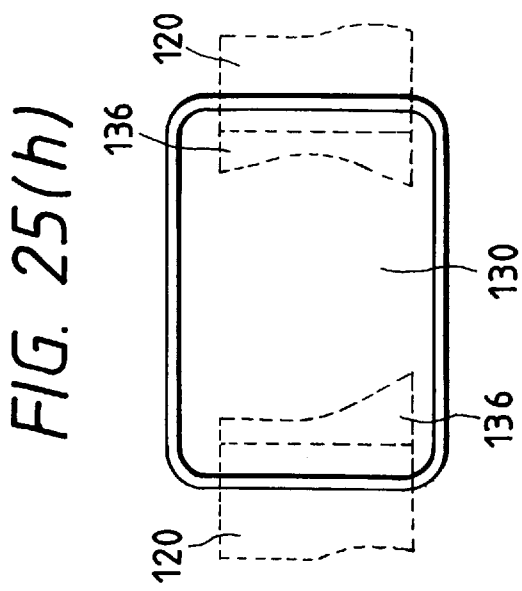
FIG. 25(h)

METHOD AND APPARATUS FOR
INSPECTION AND CORRECTION OF
WIRING OF ELECTRONIC CIRCUIT AND
FOR MANUFACTURE THEREOF

The present invention relates to a wiring pattern inspection method and a wiring pattern inspection device in which a defect of a wiring pattern formed on an insulating substrate is detected together with its position. In addition, the present invention also relates to a method for manufacturing a wiring pattern substrate in which the wiring pattern having a defect therein is detected, its position is specified and then the defect is corrected. In particular, the present invention provides an inspection method and inspection device which are preferable for inspecting a wiring pattern of a planer substrate for display, and a manufacturing method which is preferable for manufacturing the planer displaying substrate as well as relating to a method of repairing disconnection of wirings provided on a substrate of a liquid crystal display apparatus and a semiconductor integrated circuit and a TFT (Thin Film Transistor) substrate used for a liquid crystal display apparatus and a method of repairing disconnection of wirings thereof. Further, the present invention relates to a technique for correcting disconnection of wiring provided on a multi-chip module (MCM) substrate for use with large scale electronic equipment such as a liquid crystal display and a semiconductor integrated circuit or an electronic computer and, more particularly to a technique of correcting the defect by supplying a very small amount of liquid material to the disconnected portion of wiring.

BACKGROUND OF THE INVENTION

As a prior art method for inspecting a wiring pattern, it is well known to provide an electrical conduction method in which probes are contacted with both ends of the wiring pattern, a cut wire of the wiring pattern is detected in response to a value of a current in the case of applying a voltage and a short circuited state of the wiring is detected in response to a presence or a non-presence of flow of current toward the probe contacted with another wiring pattern. However, a problem with such prior art method is that it was necessary to specify the position of a defect under observation with a microscope and that it took much time and labor due to the fact that the position of a defect could not be specified.

A defect inspection device manufactured by U.S. Photon Dynamics in which a planer substrate for display is processed and an electro-optical effect is utilized is described in No. 524 (Apr. 1, 1991) of the Nikkei Electronics, pp 78 to 79. This inspection device has a feature of providing a capability in which a wire cut or disconnection and a defect of a short circuited circuit are detected with an accuracy of a specifying position of a pixel unit. However, since it is necessary to float an electrical field sensing section having an electro-optical effect from a wiring pattern forming surface of the planer substrate for display by several tens $\mu$m, it requires much time to make a position alignment. In addition, since the electrical field sensing section is small with respect to the planer substrate, it is necessary to repeat the sensing operation several times and its inspection time is long. Further, there is a possibility that the substrate is damaged if the electrical field sensing section contacts the wiring pattern.

U.S. Pat. No. 5,138,266 discloses a method in which a wiring pattern and a planer electrode are electrostatically coupled to each other and a presence of either a cut wire of the wiring pattern or a short-circuited state is detected. However, a planer electrode having such a size as one containing an entire wiring pattern is used and although the presence of a defect with the wiring pattern being applied as a unit can be detected, it is not possible to specify the position of the defect within the wiring pattern.

In addition, Japanese Patent Application Laid-Open No. Sho 58-388874 (1983) discloses a method for applying an AC voltage to one end of the wiring pattern, detecting an AC voltage by a probe through an inductor layer from the other end of the wiring pattern and inspecting a presence or a non-presence of a cut wire or disconnection by reference to a value of the applied voltage. However, there is no description about a method for sensing the position of the defect in the cut wire in each of the wiring patterns.

Methods for sensing a defect of each of the pixels of a TFT substrate are known in which the presence or non-presence of a defect of each of the pixels is inspected, but such methods do not disclose sensing of the position of the defect of the wiring pattern. Further, such prior art relates to the fact that electrical coupling through an electrostatic capacitance is applied and has the following problems.

Japanese Patent Application Laid-Open No. Hei 6-27494 (1994) discloses a method for varying with time a potential of each of the pixels of a TFT substrate and sensing the presence or non-presence of the defect of the pixel by applying a voltage variation detected through an electrostatic capacitance between the pixel and a probe arranged in non-contact manner on the pixel. Since it is necessary to make an accurate position setting of the probe from each of the pixel electrodes with a specified small gap, there is a problem that it takes much time for the inspection of the entire substrate. In addition, there is no description about the method for sensing the position of the defect in a cut wire of the wiring pattern.

Japanese Patent Application Laid-Open No. Hei 5-10999 (1993) discloses a method for arranging an inspection electrode at a surface of opposite side of each of the electrodes of a liquid crystal display substrate, applying a pulse voltage to each of the electrodes and inspecting a good condition or a bad condition of each of the pixels in response to a pulse detected by the inspection electrodes. This method has a problem that it is necessary to provide many probes and a selection circuit in order to select the pixels arranged in matrix, resulting in that the entire device becomes complex. Also, there is no description in the publication about a method for detecting the position of the defect of the cut wire in the wiring pattern.

Japanese Patent Application Laid-Open No. Hei 2-210391 (1990) discloses a method for inspecting characteristics of a transistor of each of pixels of a TFT substrate with reference to a frequency having a maximum displacement in phase when a frequency of an AC signal is changed by oppositely facing an inspection electrode against an arranging direction of the pixels in one row of the TFT substrate, applying an AC signal and detecting a displacement in phase between the applied AC signal and an AC signal to be detected. Also in this publication, it is assumed that no defect is present at the wiring pattern and a method for detecting the position of the defect in the wiring pattern is not indicated.

Further, a method of repairing disconnections of a wiring pattern on a substrate of an integrated circuit and display device is described in the Japanese Patent Application Laid-Open No. Hei 2-19838 (1990). This prior art describes that a disconnection fault point of a wiring pattern formed on a glass substrate is coated with a composition which can precipitates a conductive substance only at a relatively high temperature (a nitrate of metal, for example, manganese nitrate and moreover an organic metal compound such as ruthenium, etc.) and the periphery of such disconnection fault is irradiated with a laser beam to precipitate a conductive substance (a low resistance manganese dioxide, low resistance ruthenium oxide) in view of repairing a wiring pattern.

As another known prior art, a method of repairing a white point fault of a photomask is described in Japanese Patent Application Laid-Open No. Sho 59-177358 (1984). This prior art describes that liquid drops of an organic metal solution including Cr, Mo metals are deposited on a white fault point of a photomask under an inactive gas atmosphere and the deposited point is irradiated with a laser beam to correct the white fault by depositing metal thin films of Cr and Mo.

Additionally, a method of repairing a disconnected Cu circuit pattern of a printed circuit board is described in Japanese Patent Application Laid-Open No. Hei 2-101188 (1990). This prior art describes that an end part of disconnected Cu circuit pattern of the printed circuit board is cut obliquely with a knife with respect to the substrate to form a taper, a plating solution is supplied to a plating part including this end part and this plating part is plated by irradiating the plating solution with a laser beam.

In an electronic circuit substrate represented by a liquid crystal display or a semiconductor integrated circuit, the circuit wiring formed on the substrate is being made finer and given higher density with improved display performance and integration. Such circuit wiring is normally formed by a series of processes such as resist coating, exposure, development, etching, and resist peeling, but as the tendency of the electronic circuit substrate toward higher performance advances, the yield of good products in the above processes lowers. Particularly, a disconnection defect of wiring resulting from foreign particles during resist exposure is fatal, and it is regarded as a defective product in many cases even if a disconnection defect takes places only at one place on the substrate. Accordingly, in order to improve the yield of manufacture, that is, to reduce the product cost, the technique of correcting an absence of such as a disconnection or cut wire or a defective wiring pattern is indispensable.

As a conventional technique for forming wiring on a substrate, a method of Japanese Patent Application Laid-Open No. Hei 6-104255 (1994) has been disclosed. More specifically, this method provide for scanning a stage carrying a substrate while supplying conductive material paste at any position on the substrate using a dispenser, and to irradiate a laser light in synchronism with its supply for heating the conductive material paste in order to continuously form a metal film. In this case, it is sufficient to supply the conductive material paste to only a portion where a metal film is to be formed, and since the metal film is obtained by irradiating a laser light onto all the supplied conductive material paste, it is not necessary to remove paste adhered to unnecessary portions.

Also, in Japanese Patent Application Laid-Open No. Hei 4-277692 (1992), there is disclosed a method to form a groove pattern on a ground film in a disconnected portion by means of a laser light, to supply organic metal solution into the groove for setting by heating, and further to irradiate a laser light for making it into a conductive material in order to connect the disconnected portions. This method makes it possible to prevent the material from adhering to the unnecessary portion by controlling the amount of supplied organic metal solution, and improves the reliability for the joints because the connected area between the wiring disconnected end portion and the formed metal is increased.

As described above, the prior art methods for inspecting a wiring pattern had some problems in that the position of a defect in the wiring pattern could not be specified and it took much time for performing the inspection for entire substrate.

Additionally, since a circuit wiring provided on a circuit substrate represented by a liquid crystal display device and a semiconductor integrated circuit element is usually produced by a series of processes including coating of photoresist-exposure-development-etching-separation of resist, disconnection failure of wiring has been generated due to existence of foreign materials generated during this process. Meanwhile, such circuit wiring has been ultra-miniaturized in accordance with improvement of display performance and integration density. Applicants have determined that the prior art described above is deficient in not sufficiently referring to the problem of connecting a disconnected point of a fine wiring with almost the same function as the circuit, a similar resistance value and with higher reliability considering the possibility of application as an actual product.

The prior art concerning the formation of wiring on the substrate has the following problems because the conductive material paste is supplied in synchronism with the irradiation of laser light.

The liquid material, in which the material is crystallized or decomposed/precipitated by heating to obtain a metal film, has generally great volume shrinkage after heating, and therefore, when the disconnected width is almost larger than the wiring width or than the laser irradiation size for heating the liquid material, a step-cut of the formed metal occurs near the disconnected end portion. The phenomenon will be described with reference to FIGS. 28(a)–28(j), which show plan views and corresponding cross-sectional views. When a wiring is disconnected as represented by end points 522 and 522' on the surface of a substrate 521 in FIGS. 28(a)–28(d), a dispenser (not shown) supplies liquid material 523 to the disconnected portion while scanning a stage (not shown) as shown in FIGS. 28(e)–28(h). Subsequently, the supplied liquid material 523 reaches an irradiation region 524' for laser light 524 by a scanning of the stage (not shown). When the laser light is irradiated onto metal wiring of Al, Cu or the like, which is normally often used as wiring material for a circuit substrate, the greater part of the laser light is only reflected, but a part thereof is absorbed to enable the wiring to be heated. In this respect, these wiring materials have generally high thermal conductivity, and therefore, the temperature at the disconnected end point 522 is raised due to the conductive heat caused by the irradiation of the laser light 524.

As shown in FIGS. 28(e)–28(i), the liquid material 523 supplied near the disconnected end portion 522 is sufficiently heated for decomposition, thus satisfactorily achieving the connection between the end portion 522 and the precipitated metal film 523'. Since, however, exceedingly great volume shrinkage occurs when the supplied liquid material 523 is heated to become a metal film, an influx 525 of the liquid material 523 before the heating occurs on the precipitated metal film 523', but does not affect the connecting capability at the disconnected end portion 522.

In this way, in the vicinity of the laser irradiation region 524', the treatment always goes on accompanied by an influx 525 of the liquid material 523 on the precipitated metal film 523'. The laser light 524 moves relative to the substrate 521, and successively heats the liquid material 523 on the substrate 521 to thereby form a metal film 523', reaching near the disconnected end point 522' as shown in FIGS. 28(g)–28(h). However, in the vicinity of the disconnected end point 522', an influx 525 of the liquid material 523 on the end point 522' occurs to thereby reduce the volume of the liquid material 523 on the end point 522'. This further reduces the thickness of a metal film 23' precipitated in the vicinity of the end point 522' as shown in FIGS. 28(i)–28(j) to cause a step-cut 526 of the metal film 523'. In other words, influenced by the thickness distribution of the metal film after the precipitation, the disconnected portions are not electrically connected, or the connection is made with a high electric resistance, resulting in failure to correct the disconnection defect. Further, at the initial stage when the laser light 524 is irradiated onto the disconnected end point 522', heat dissipates from the end point so that the temperature of the end point is not increased, and this leads to a problem that heating of the liquid material on such end point is insufficient.

On the other hand, in the prior art in which a groove pattern is formed in a ground film of the disconnected portion, and the liquid material is supplied into the groove to connect the disconnected portions, an ultraviolet laser light for forming the groove pattern is newly required, resulting in a larger apparatus and higher product cost. Also, it takes longer time to correct the defect.

SUMMARY OF THE INVENTION

It is an object of the present invention to overcome the deficiency of the prior art by specifying a position of a defect in the wiring pattern and/or providing for shortening of an inspection time.

It is another object of the present invention to detect the defect, repair the defect within a short period of time and to provide for manufacturing of the substrate of the wiring pattern.

It is a further object of the present invention, to provide a method of repairing disconnection of a wiring wherein a disconnected or half-disconnected point of a fine wiring is connected with a resistance almost equal to that of wiring and with a higher reliability for use as the actual product.

It is another object of the present invention to provide a TFT substrate and a method of repairing wirings thereof wherein a disconnected or half-disconnected point of at least an upper wiring in a TFT substrate is connected with substantially equal resistance as the upper wiring and with a higher reliability for use as the actual TFT product.

It is still another object of the present invention to provide a TFT substrate and a method of repairing wirings thereof wherein after the TFT substrate is covered with a protection film, a disconnected or half-disconnected point of at least an upper wiring is connected with substantially the same resistance as the upper wiring and with a higher reliability for use as the actual TFT product.

It is a further object of the present invention to provide a low-priced and highly reliable method of correcting disconnection concerning a technique of correcting wiring on an electronic circuit substrate, and an apparatus for implementing the method, and to provide a low-priced and highly reliable electronic circuit substrate.

In accordance with the present invention, for inspection of a wiring pattern, a wiring pattern and an electrode are insulated from each other and electrostatically coupled, a voltage varying with time is applied between the wiring pattern and the electrode, and a current flowing between the wiring pattern and the electrode is detected. The voltage applying operation and current detection are carried out for a plurality of positions in the wiring pattern, a variation in the detected current between the electrode and the wiring pattern at the plurality of positions with respect to the wiring pattern is detected, and a defect is detected in response to the detected variation.

The present invention provides for repairing disconnection of wirings by supplying a solution or a coating film including a metal complex to a disconnected or half-disconnected point of a disconnected or half-disconnected wiring and irradiating the disconnected or half-disconnected point with a laser beam so that a metal thin film is continuously precipitated between the end points covering the end point areas of the disconnected or half-disconnected wiring through the thermal decomposition reaction of the metal complex.

The present invention also provides for repairing disconnection of wirings by supplying a solution or a coating film including a metal complex to a disconnected or half-disconnected point of a disconnected or half-disconnected wiring and irradiating the disconnected or half-disconnected point with a laser beam so that a metal thin film is continuously precipitated, keeping a contact resistance between the metal thin film and the end point areas to 300 Ω or lower, between the end points covering the end point areas of the disconnected or half-disconnected wirings. Moreover, the present invention is characterized, in the method of repairing disconnection of wirings, in that the metal thin film is formed with a thickness which is thinner than the thickness of the disconnected or half-disconnected wirings.

The present invention further provides for repairing disconnection of wirings comprising a removing process for removing contaminants or oxides by processing, under the inactive gas or reducing gas atmosphere, the surfaces of end point areas of the disconnected or half-disconnected wiring at the disconnected or half-disconnected point and a wiring connection process for connecting the disconnected or half-disconnected wiring by supplying a solution or a coating film including a metal complex to a disconnected or half-disconnected point including the end point areas of each wiring from which the contaminants or oxides are removed by the removing process and then irradiating the disconnected or half-disconnected areas with a laser beam so that a metal thin film is continuously precipitated between the end points covering the end point areas of the disconnected or half-disconnected wiring through the thermal decomposition reaction of the metal complex.

The present invention further provides for repairing disconnection of wirings comprising a sloping or tapered surface forming process for forming a sloping or tapering surface at the surfaces of the end point areas of disconnected or half-disconnected wiring at the disconnected or half-disconnected point and a wiring connection process for connecting the disconnected or half-disconnected wiring by supplying a solution or a coating film including a metal complex to the disconnected or half-disconnected point of the disconnected or half-disconnected wirings having the sloping surfaces formed by the sloping surface forming process and then irradiating the disconnected or half-disconnected point with a laser beam so that a metal thin film is continuously precipitated between the end points covering the sloping surfaces of the end point areas through the thermal decomposition reaction of the metal complex.

The present invention further provides for repairing wirings of a TFT substrate comprising a disconnected point detecting process for detecting a disconnected or half-disconnected point of at least upper wiring formed on a TFT substrate and an upper wiring connection process for connecting the upper wiring by supplying a solution or a coating film including a metal complex to a disconnected or half-disconnected point of at least the upper wiring detected by the disconnected point detecting process and irradiating the disconnected or half-disconnected point with a laser beam so that a metal thin film is continuously precipitated between the end points covering the end point areas of the disconnected or half-disconnected upper wiring through the thermal decomposition reaction of the metal complex.

The present invention further provides for repairing wirings of a TFT substrate comprising a disconnected point detecting process for detecting a disconnected or half-disconnected point of at least upper wiring formed on a TFT substrate and an upper wiring connection process for connecting the upper wiring, while the wirings are separated from the adjacent picture element electrodes, by supplying a solution or a coating film including a metal complex to a disconnected or half-disconnected point, in separation from the adjacent picture element electrodes, of at least the upper wiring detected by the disconnected point detecting process and irradiating the disconnected or half-disconnected point with a laser beam so that a metal thin film is continuously precipitated between the end points covering the end point areas of the disconnected or half-disconnected upper wiring through the thermal decomposition reaction of the metal complex.

The present invention further provides for repairing wirings of a TFT substrate comprising a disconnected point detecting process for detecting a disconnected or half-disconnected point of at least upper wiring formed on a TFT substrate and an upper wiring connection process for connecting the upper wiring by supplying a solution or a coating film including a metal complex to a disconnected or half-disconnected point of at least the upper wiring detected in the disconnected point detecting process and then irradiating the disconnected or half-disconnected point with a laser beam so that a metal thin film is continuously precipitated between both end points covering the end point areas of the disconnected or half-disconnected upper wiring through the thermal decomposition reaction of the metal complex, keeping a contact resistance between the metal thin film and the end point areas to 300 $\Omega$ or lower.

The present invention further provides for repairing wirings of a TFT substrate comprising a disconnected point detecting process for detecting a disconnected or half-disconnected point of at least upper wiring formed on a TFT substrate; a sloping surface forming process for forming sloping surfaces to the surfaces of the end point areas opposed with each other at the disconnected or half-disconnected point of at least upper wiring detected in the disconnected point detecting process; and an upper wiring connection process for connecting said upper wiring by supplying a solution or a coating film including a metal complex to a disconnected or half-disconnected point including the end point areas of the upper wiring having the sloping surfaces formed in the sloping surface forming process and then irradiating the disconnected or half-disconnected point with a laser beam so that a metal thin film is continuously precipitated with a thickness which is thinner the than thickness of the upper wiring between the end point areas covering the end point areas of the disconnected upper wiring through the thermal decomposition reaction of the metal complex.

The present invention further provides for repairing wirings of a TFT substrate, wherein a metal thin film in the upper wiring connection process is mainly composed of Pd or Au or platinum which may be connected in a low connection resistance with the upper wiring formed of an Al wiring.

The present invention further provides a method of repairing wirings of a TFT substrate, wherein the metal complex included in a solution or coating film is mainly composed of at least a palladium complex (for example, palladium trifluoroacetic acid ($Pd(CF_3COO)_2$), or palladium pentafluoropropionic acid ($Pd(CF_3CF_2COO)_2$).

The present invention further provides for repairing wirings of a TFT substrate comprising a disconnected point detecting process for detecting a disconnected or half-disconnected point of at least an upper wiring formed on a TFT substrate and an upper wiring connection process for connecting disconnected upper wirings by supplying a CVD gas to a disconnected or half-disconnected point of at least upper wiring detected in the disconnected point detecting process and then irradiating the disconnected or half-disconnected point with a focused energy beam so that a metal thin film is continuously precipitated between the end points covering the end point areas of the disconnected or half-disconnected upper wiring.

The present invention further provides for repairing wirings of a TFT substrate comprising a disconnected point detecting process for detecting a disconnected or half-disconnected point of at least an upper wiring formed on a TFT substrate and an upper wiring connection process for connecting disconnected upper wirings by supplying a CVD gas to a disconnected or half-disconnected point of at least upper wiring detected in the disconnected point detecting process and then irradiating the disconnected or half-disconnected point with a focused energy beam so that a metal thin film is continuously precipitated, in separation from the adjacent picture element electrodes, between the end points covering the end point areas of the disconnected or half-disconnected upper wiring.

The present invention further provides for repairing wirings of a TFT substrate comprising a disconnected point detecting process for detecting a disconnected or half-disconnected point of at least an upper wiring formed on a TFT substrate; a boring process for exposing end point areas of upper wiring at the disconnected or half-disconnected point by irradiating a protection film covering the disconnected or half-disconnected point of at least upper wiring detected in the disconnected point detecting process with an energy beam; and an upper wiring connection process for connecting disconnected or half-disconnected upper wiring by supplying a solution or a coating film including a metal complex to the disconnected or half-disconnected point exposed through a protection film in the boring process, and then irradiating the disconnected or half-disconnected point with a laser beam so that a metal thin film is continuously precipitated between end points covering the end point areas of the disconnected or half-disconnected upper wiring through the thermal decomposition reaction of the metal complex.

The present invention further provides for repairing wirings of a TFT substrate comprising a disconnected point detecting process for detecting a disconnected or half-disconnected point of at least an upper wiring formed on a TFT substrate; a boring process for exposing end point areas of upper wiring at the disconnected or half-disconnected point by irradiating a protection film covering the disconnected or half-disconnected point of at least upper wiring detected in the disconnected point detecting process with an energy beam; and an upper wiring connection process for connecting disconnected or half-disconnected upper wiring, under the condition being separated from the adjacent picture element electrodes, by supplying a solution or a coating film including a metal complex, in separation from adjacent picture element electrodes, to the disconnected or half-disconnected point exposed through a protection film in the boring process and then irradiating the disconnected or half-disconnected point with a laser beam so that a metal thin film is continuously precipitated between end points covering the end point areas of the disconnected or half-disconnected upper wiring through the thermal decomposition reaction of the metal complex.

The present invention further provides for repairing wirings of a TFT substrate comprising a disconnected point detecting process for detecting a disconnected or half-disconnected point of at least an upper wiring formed on a TFT substrate; a boring process for exposing end point areas of upper wiring at the disconnected or half-disconnected point by irradiating a protection film covering the disconnected or half-disconnected point of at least upper wiring detected in the disconnected point detecting process with an energy beam; and an upper wiring connection process for connecting disconnected or half-disconnected upper wiring by supplying a solution or a coating film including a metal complex to the disconnected or half-disconnected point exposed through a protection film in the boring process and then irradiating the disconnected or half-disconnected point with a laser beam so that a metal thin film is continuously precipitated between end points covering the end point areas of the disconnected or half-disconnected upper wiring through the thermal decomposition reaction of the metal complex; and a protection film covering process for covering the metal thin film connected in the upper wiring connection process with a protection film.

The present invention further provides a TFT substrate wherein a disconnected or half-disconnected point of an upper wiring (upper layer wiring) formed on a TFT substrate is connected by connecting the upper wiring (drain wiring) with a metal thin film continuously precipitated between the end points covering the end point areas of the disconnected or half-disconnected upper wiring (drain wiring).

The present invention further provides a TFT substrate wherein a disconnected or half-disconnected point of an upper wiring (upper layer wiring) of Al formed on a TFT substrate is connected by connecting the upper wiring (drain wiring) with a metal thin film, which is mainly composed of Pd or Au or platinum which enables low resistance connection, continuously precipitated between the end points covering the end point areas of the disconnected or half-disconnected upper wiring (drain wiring).

The present invention further provides a TFT substrate wherein a disconnected or half-disconnected point of an upper wiring (upper layer wiring) of Al formed on a TFT substrate is connected by connecting the upper wiring with a metal thin film precipitated, in separation from the adjacent picture element electrodes, continuously between the end points covering the end point areas of disconnected or half-disconnected upper wiring.

The present invention further provides a TFT substrate wherein a disconnected or half-disconnected point of an upper wiring (upper layer wiring) of Al formed on a TFT substrate is connected by connecting the upper wiring with a metal thin film precipitated continuously, in separation from the adjacent picture element electrodes which is formed narrower than 4 times the width of the upper wiring, between the end points covering the end point areas of disconnected or half-disconnected upper wiring.

The present invention further provides a TFT substrate rein a disconnected or half-disconnected point of an upper wiring (upper layer wiring) of Al formed on a TFT substrate is connected by connecting the upper wiring with a metal thin film precipitated continuously between the end points covering the end point areas of disconnected or half-disconnected upper wiring, keeping a contact resistance between the metal thin film and the end point areas to 300 Ω or lower.

The present invention further provides a TFT substrate wherein a disconnected or half-disconnected point of an upper wiring (upper layer wiring) formed on a TFT substrate is connected by connecting the upper wiring with a metal thin film precipitated continuously with a thickness thinner than the thickness of the upper wiring between the end points covering the end point areas having the sloping surfaces of the disconnected or half-disconnected upper wiring.

The present invention further provides a TFT substrate wherein a disconnected or half-disconnected point of an upper wiring (upper layer wiring) formed on a TFT substrate is connected by connecting the upper wiring with a metal thin film precipitated continuously between the end points covering the end point areas of the disconnected or half-disconnected upper wiring and the metal thin film is covered with a protection film.

The present invention also provides a liquid crystal display device comprising a TFT substrate. For example, when producing a TFT substrate used in a liquid crystal display device, a disconnected or half-disconnected point of an upper wiring (upper layer wiring) generated with deposition of foreign matters particularly in the film forming process and etching process can be easily and reliably corrected by connecting the disconnected or half-disconnected wiring with a metal thin film having the resistance almost equal to the normal upper wiring without giving any influence on the adjacent picture element electrodes. As a result of it, the production yield can be improved remarkably without disposing the TFT substrate.

Especially, since a lower wiring (gate wiring) is formed, in the TFT substrate, by forming a pattern with etching from the film formed first on a glass substrate, it is also easy to repair the disconnected or half-disconnected lower wiring. However, in the TFT substrate, the picture element electrodes, thin film transistor and source electrode are also formed regarding the upper wiring (upper layer wiring) providing an almost completed construction, the disconnected or half-disconnected point of the upper wiring must be connected with high reliability without providing any influence on the adjacent picture element electrodes, without generating any difference in the brightness of picture element as a liquid crystal display device, and without remarkable increase of a resistance value from that of the normal upper wiring. Moreover, since a TFT substrate is considerably large in size, the present invention enables easy repair with high reliability particularly of disconnected or half-disconnected upper wiring (upper layer wiring) in such a very large TFT substrate.

In accordance with the present invention, a small amount of an organic solvent solution obtained by dissolving a metal complex, for example, a complex of palladium trifluoroacetic acid or complex of palladium pentafluoropropionic acid, into an organic solvent such as acetonitrile, toluene, alcohol and is locally supplied to a disconnected or half-disconnected point. The metal complex is irradiated with a laser beam to precipitate a metal thin film through the thermal decomposition reaction. This metal thin film is mainly composed of Pd and has a thickness Hm which is thinner as about 1/k (k=Hm/H1) for the thickness H1 of the supplied organic solvent solution. A value of k is determined depending on a rate of metal such as Pd included in the organic solvent solution. Moreover, spreading of the organic solvent solution when it is locally supplied to the disconnected or half-disconnected point is determined by the viscosity thereof. Therefore, the present invention can maintain a termination resistance of an upper wiring to a target value, that is, about 0.1 k$\Omega$ to 1 k$\Omega$ (about 1 k$\Omega$ in maximum) including a contact resistance by eliminating the broken or nearly broken condition of a metal thin film such as Pd precipitated by the thermal decomposition reaction, that is, the condition where a resistance value is in the range from 100 k$\Omega$ to several M$\Omega$ by reducing spreading of the organic solvent solution when it is locally supplied to the disconnected or half-disconnected point by increasing viscosity thereof, or by making small a reduction of thickness Hm of a metal thin film of Pd for the thickness H1 of the organic solvent solution supplied in such a condition that a rate of metal such as Pd included in such organic solvent solution is increased, for example, to become equal to or thicker than the upper wiring in the thickness, or by forming the approximately tapered portions to the end point areas of upper wiring at the disconnected or half-disconnected point.

In accordance with the present invention, a disconnected or half-disconnected upper wiring can be connected with a small contact resistance and higher reliability without any contact with picture element electrodes and thin film transistor adjacent to the upper wiring at the time of connecting the disconnected or half-disconnected upper wiring in the TFT substrate by supplying a solution or a coating film including a metal complex to the disconnected or half-disconnected point and then irradiating the solution or coating film including the metal complex so that a metal thin film is precipitated for connection through the thermal decomposition reaction.

Moreover, even in the case of a high density printed circuit board, there are other wiring patterns adjacent to the disconnected or half-disconnected point and some wiring patterns have the thickness of about 1.0 $\mu$m and a resistance value including the contact resistance must be approximated as closely as possible to the resistance value of the wiring pattern. Therefore, the present invention is effective for repair of disconnected or half-disconnected wiring of the wiring pattern in the high density printed circuit board.

On heating of the liquid material supplied to the disconnected portion of wiring on an electronic circuit substrate, the present invention enables control of the flow of the liquid material at each disconnected end portion before heating, and uniformizing of the film thickness distribution of a metal film precipitated between the disconnected end portions. More specifically, after locally supplying liquid material to the wiring disconnected portion on an electronic circuit substrate, a laser light is brought close to the disconnected portion and scans the portion while irradiating the wiring. The irradiation of laser light is once stopped when a metal film is precipitated by heating the liquid material near one disconnected end portion to precipitate a metal film. After a metal film is precipitated by starting the irradiation of laser light at the other disconnected end portion again in the same manner, a metal film is formed between the disconnected end portions by further continuing the scanning of the laser light to electrically connect the disconnected portions. In other words, after locally supplying liquid material to the wiring disconnected portion on an electronic circuit substrate, the laser light is collectively irradiated onto the liquid material to thereby form a metal film between the disconnected end portions, thus electrically connecting the disconnected portions. In accordance with the present invention, the metal film is heated again in an atmosphere of inactive gas after locally supplying liquid material to the wiring disconnected portion on an electronic circuit substrate, and by irradiating the laser light for heating the liquid material to precipitate a metal film.

The present invention provides a wiring correcting apparatus having a mechanism for carrying an electronic circuit substrate to position it; a mechanism for observing the surface of the electronic circuit substrate; a mechanism for locally supplying the liquid material to the wiring disconnected portion on the electronic circuit substrate; a mechanism for irradiating a laser light onto the electronic circuit substrate; and a mechanism for supplying inactive gas to the laser irradiation region on the electronic circuit substrate.

The present invention provides for correcting an electronic circuit substrate by using a low-priced and highly reliable method, and by improving the yield of manufacture for the electronic circuit substrate.

As the liquid material, there is used a metal complex such as Pd, Au and Pt, for example, metal complex solution obtained by dissolving palladium trifluoroacetic acid complex ($Pd(CF_3COO)_2$) in an organic solvent such as acetonitrile, N-methyl-2-pyrrolidone, toluene, xylene and alcohol. This metal complex solution is injected into a glass pipet, whose tip has been formed into 1 to 2 $\mu$m in inside diameter with a microsyringe. The tip of the pipet is brought into contact with the surface of the substrate, and at the same time, inactive gas such as nitrogen is supplied into the pipet in a pulse fashion to discharge the metal complex solution through the tip of the pipet. Further, by controlling the contact position of the tip of the pipet on the substrate, it becomes possible to supply the material with high accuracy. The metal complex solution is locally supplied to the wiring disconnected portion on the electronic circuit substrate. After supplying the solution, a laser light formed into a suitable size is scanned while irradiating it on the wiring, and is brought close to the disconnected portion to heat the metal complex solution at one disconnected end portion and in its vicinity. When the laser light is irradiated on the material such as Al and Cu, which are normally used often as circuit wiring, the greater part of the laser light is only reflected, but a part thereof is absorbed to enable the wiring to be heated. In this respect, these materials have generally high thermal conductivity, and therefore, the temperature at the disconnected end is raised due to the conductive heat caused by the irradiation of the laser light. The organic solvent in the metal complex solution near the disconnected end portion evaporates and further the complex is decomposed to precipitate a metal film, thus achieving good connection between the end portion and the precipitated metal film. However, extremely great volume shrinkage occurs when the supplied solution is heated to become a metal film, and therefore, an influx of the solution before the heating occurs on the precipitated metal film, but this does not affect the connecting capability at the disconnected end portion. At this point of time, after stopping the irradiation of the laser light once, a metal film is caused to precipitate by starting the irradiation of the laser light at the other disconnected end portion again in the same manner. Thereafter, the laser light is continuously scanned to form a metal film between the disconnected end portions, thus electrically connecting the disconnected portions. As a result, it is possible to secure the connecting capability between the both disconnected end portions and the precipitated metal film, and also to uniformize the film thickness distribution of the precipitated metal film between the disconnected end portions. In other words, highly reliable correction of disconnection can be achieved by suppressing the film thickness distribution of the precipitated metal film between the disconnected end portions caused when the solution before the heating flows on the precipitated metal film.

As regards precious metal group such as Pd, Au and Pt, its combination with oxygen can be dissociated by heating it at not less than a fixed temperature. Accordingly, after locally supplying the metal complex solution on the disconnected portion of wiring on an electronic circuit substrate, and irradiating the laser light for heating the solution to precipitate a metal film between the disconnected end portions, heating it again in an atmosphere of inactive gas reduces the oxygen which has been combined with the metal, thus making it possible to obtain a good quality of metal film. As a result, the connected resistance between the disconnected end portions is reduced.

By correcting products which have previously been discarded as defective goods owing to occurrence of a disconnection defect, it becomes possible to restore the commercial value of a previously defective electronic circuit substrate and to improve the yield of manufacture, thus lowering the price for the electronic circuit substrate.

These and other objects, features and advantages of the present invention will become more apparent from the following description when taken in conjunction with the accompanying drawings.

BRIEF DESCRIPTION OF THE DRAWINGS

FIGS. 6(a)–6(b) show a rectangular wave signal applied to the embodiment of FIGS. 5(a)–5(c) and a detected current waveform.

FIG. 7 shows harmonic wave signal from the detected signal of FIG. 6(b).

FIGS. 8(a)–8(b) show equivalent circuits for the embodiment of FIGS. 5(a)–5(c).

FIG. 17 is a flow chart for manufacturing the wiring pattern substrate in accordance with the present invention.

FIGS. 20(a)–20(d) show a process to form an approximately tapered shape at the end point area of the wiring at the disconnected point in the TFT substrate of the present invention.

FIGS. 21(a)–(f) show a process to repair (connect) the disconnect point with a metal thin film in the TFT substrate of the present invention.

FIGS. 24(a)–24(e) are diagrams for showing that a metal thin film may be broken or nearly broken when the disconnected point of wiring in the TFT substrate is repaired with the metal thin film.

FIGS. 25(a)–25(h) show a process to repair the disconnected point with a metal thin film after the TFT substrate of the present invention is covered with a protection film.

DETAILED DESCRIPTION OF THE PREFERRED EMBODIMENTS

Figure 1A:
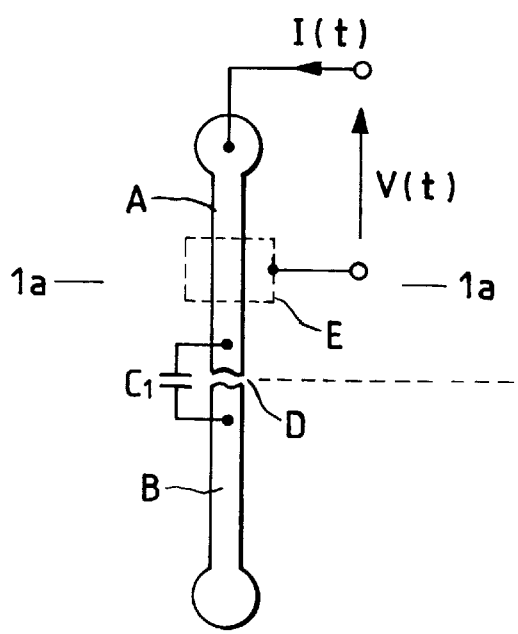
FIGS. 1(a)–1(c) are views for explaining a principle of detecting a disconnection defect such as a wire cut in accordance with the present invention.

Referring now to the drawings wherein like reference numerals are utilized to designate like parts, first the principle of inspection in accordance with the present invention is described with reference to FIG. 1.

Since in accordance with the present invention, a voltage applied between the wiring pattern and an electrode is varied with time, a current I (t) defined as:

$$I(t) = C \frac{dV(t)}{dt} \quad \text{(Equation 1)}$$

flows due to the electrostatic coupling even if these elements are insulated in a DC form, where t is a time [S], V(t) is an applied voltage [V], and C is an electrostatic capacitance between the wiring pattern and the electrode [F]. Hereinafter, a value of C is termed as an electrostatic characteristic. Since V(t) is a known value, I(t) is proportional to C and a value of C is made apparent with reference to the value of I(t). As apparent from equation 1 above, the time variation of V(t) may be of one which is periodically repeated or one in which there is variation having no periodic state occurring.

Figure 1B:
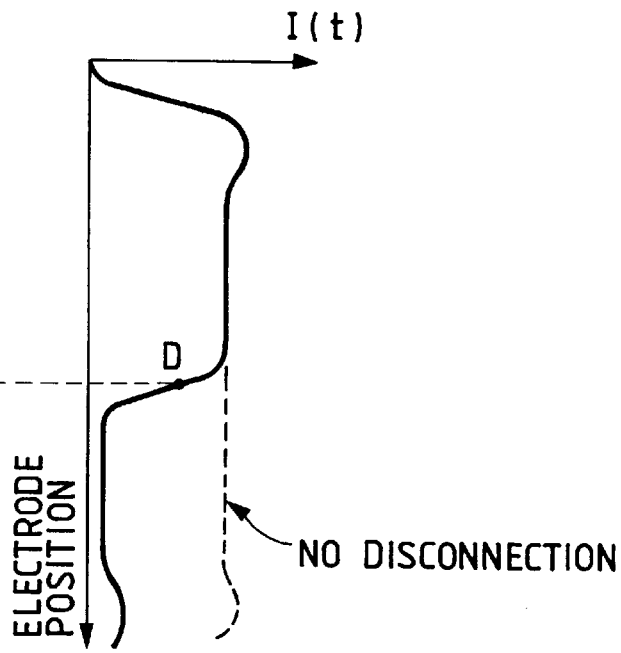
Figure 1C:
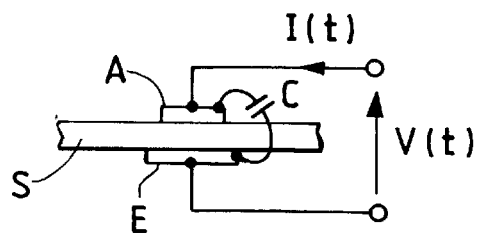

The cut wire or disconnection shown in FIG. 1(a) will first be studied. A voltage V(t) is applied between one end of the wiring pattern part A and the electrode E so as to detect the current I(t). If a distance (d) between the wiring pattern and the electrode is kept substantially constant as by an insulating substrate S and there is no wire cut, C is kept constant and a value of I(t) is also kept substantially constant irrespective of a positional relation between the wiring pattern and the electrode. However, if there is a wire cut as shown in FIG. 1(a), I(t) which is similar to that attained under a state of no cut wire is obtained when the electrode E is present at the wiring pattern A. However, if the electrode E is present at the cut side B, since an electrostatic capacitance $C_1$ between the cut wire and the wiring pattern is applied in series to C as shown in FIG. 1(c) representing a section along 1a—1a of FIG. 1(a), a total electrostatic capacitance C' is decreased as indicated in:

$$C' = \frac{C_1 C}{C_1 + C} = \frac{C}{1 + \frac{C}{C_1}} < C \qquad \text{(Equation 2)}$$

and I(t) is decreased. Accordingly, a value of I(t), i.e. at a part where the electrostatic characteristic varies corresponds to the cut wire at a disconnection D as shown by the corresponding dashed line (FIG. 1(b)).

Figure 2A:
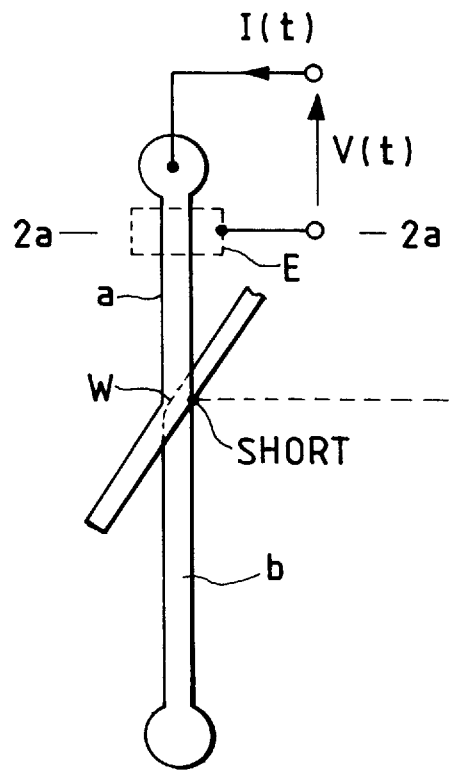
FIGS. 2(a)–2(c) are views for explaining a principle of detecting of a short-circuited state in accordance with the present invention.
Figure 2B:
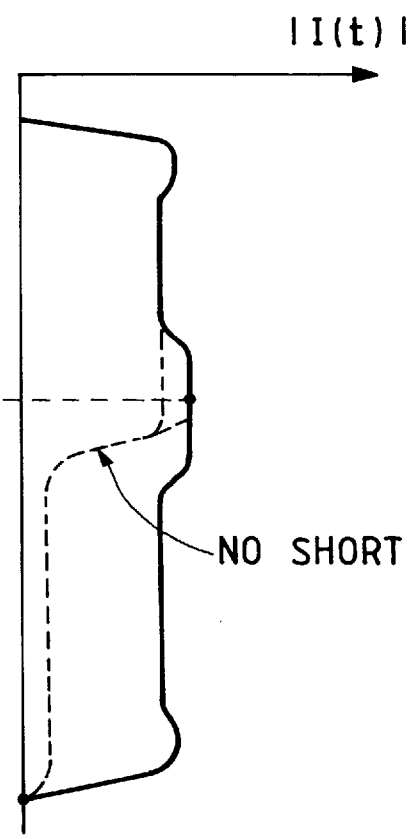
Figure 2C:
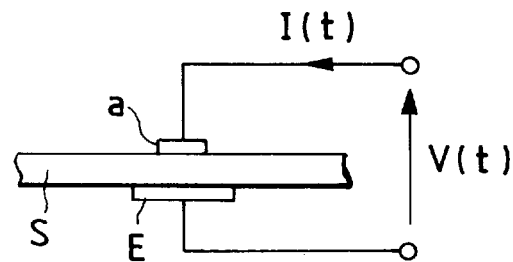

A detection of a short circuited state at a crossing section between the wiring patterns a and b as shown in FIG. 2(a) will be studied. If it is assumed that the wiring patterns a and b are formed substantially on the same plane and I(t) is detected in the same manner as that for the cut wire of FIG. 1(a), as shown in FIG. 2(c) which represents a section along 2a—2a of FIG. 2(a), the wiring pattern A of FIG. 1(a), as in the case of the cut wire corresponds to the wiring pattern a and the wiring pattern B corresponds to the wiring pattern b. If there is no short-circuited state, I(t) is decreased at the wiring pattern b, as shown in dashed line. In turn, if the wiring pattern b is short circuited by a crossing wiring pattern W in contact therewith due to a breakdown in insulation therebetween, for example, substantially the same I(t) is detected also in both cases that the electrode E is present at the side b and the electrode E is present at the side a (occasionally C is increased and I(t) is increased in response to the shape of the electrode). In this way, the position of the wiring pattern where a short-circuited state occurs can be detected in response to a value of I(t), i.e. a presence or a non-presence of variation in electrostatic characteristic or a value of the electrostatic characteristic (FIG. 2(b)).

Figure 3A:
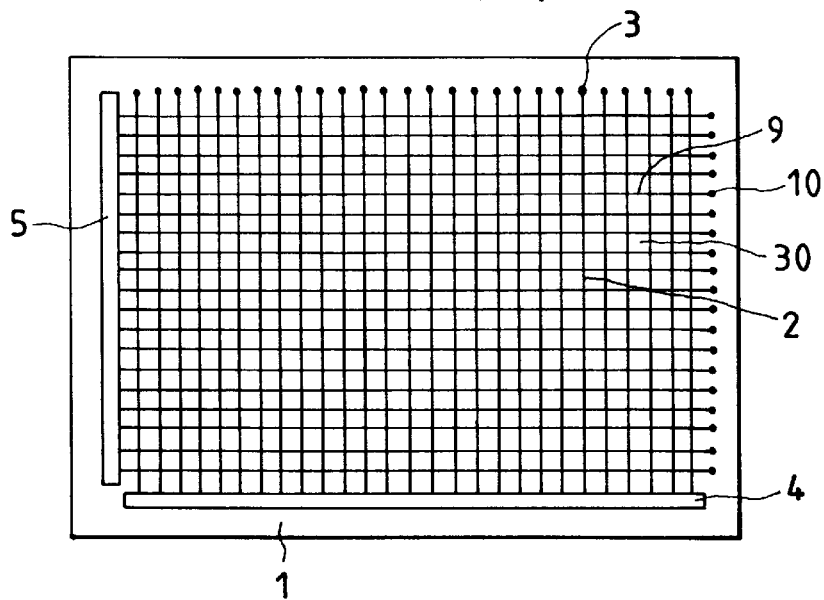
FIGS. 3(a)–3(d) are views showing a structure of a TFT liquid crystal substrate of the present invention to be inspected.

Embodiments of the present invention will be described with reference to a TFT liquid crystal substrate acting as a planer display substrate, for example, as shown in FIG. 3(a) representing a wiring pattern substrate. In principle, the present invention can be similarly applied to other planer display substrates such as STN liquid crystal substrate, a plasma displaying substrate and the like or in general, a general type of wiring pattern substrate comprised of the insulating plate and the wiring pattern.

Figure 3B:
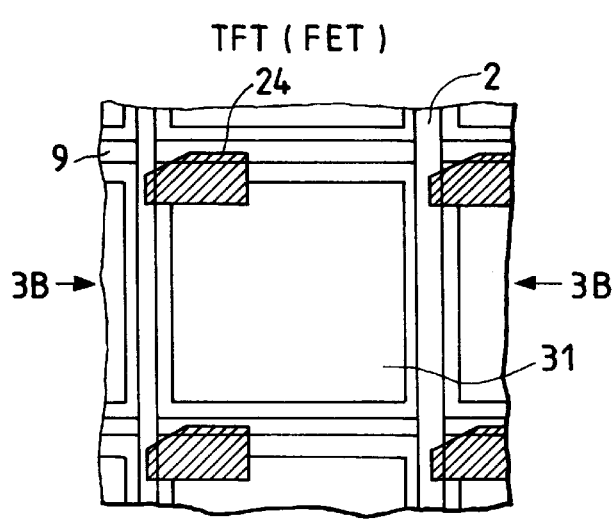
Figure 3C:
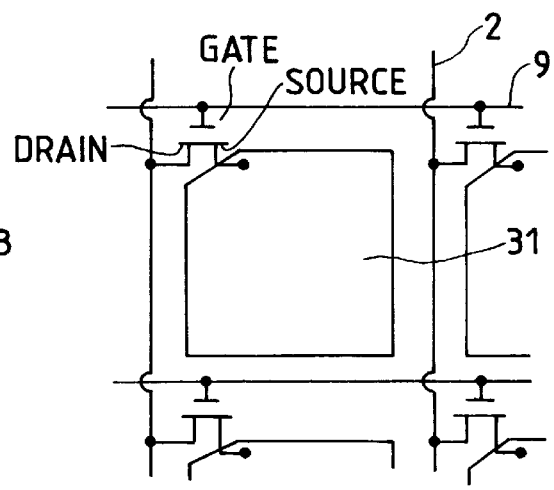
Figure 3D:
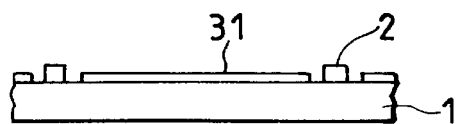

As shown in FIG. 3(a), the TFT liquid crystal substrate 1 is constructed so that the gate wires 9 (horizontal patterns) and drain wires 3 (vertical patterns) acting as wiring patterns are formed on the glass substrate in a grid pattern, and the TFTs 24 (thin film electrical field effect type transistors) are formed near the crossing sections as pixel switching elements. There are also provided a drain wire common electrode 4 and a gate wire common electrode 5. The other ends of the drain wires have a drain electrode 3 and the other ends of the gate wires have a wire electrode 10. FIG. 3(a) shows a configuration of the liquid crystal substrate, FIG. 3(d) shows a structure of one pixel 30 including the pixel electrode 31, FIG. 3(c) shows a circuit of one pixel, and FIG. 3(d) is a view taken along a section line 3B—3B of FIG. 3(b). In this case, as one example, the TFT liquid crystal substrate in which one end of the gate wire and one end of the drain wire are connected directly or through a resistor from each other by a common electrode will be described. As for the substrate having no common electrode, a probe is contacted properly to ends of the drain wire and the gate wire and fixed at an equal potential in response to needs such as detection of the presence or non-presence of the wire cut or improvement of S/N ratio.

The gate wire and the drain wire are insulated at the crossing section, the gate wire has gates of the TFT in a horizontal direction connected in common, and the drain wire has drains of the TFT in a vertical direction connected in common. In addition, the source of each of the TFTs is connected to a pixel electrode formed at a section enclosed by the gate wires and the drain wires.

If a voltage more than a specified value is not applied between the gate and the drain of the TFT, it can be assumed that a part between the drain and the source is kept substantially at an OFF state in DC form, so that it is assumed that the part between the drain and the source is connected by an electrostatic capacitance C2 as shown in FIG. 3(c) unless otherwise specified in the following description. In addition, it is assumed that there is no DC conduction between the gate and the drain as well as between the gate and the source and they are coupled through an electrostatic capacitance. However, for sake of convenience or easiness, these capacitances are ignored in the following description.

Figure 4:
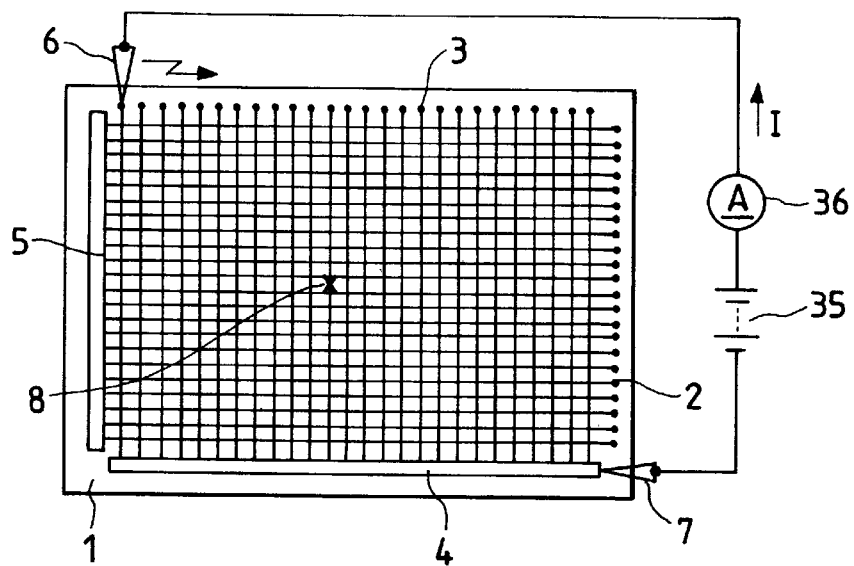
FIG. 4 is a view for explaining a detection of a cut wire in a drain wire in a TFT liquid crystal substrate.

An embodiment in which the position of a defect such as a disconnection or cut wire is specified after detecting the cut state of the drain wire, is described with reference to FIG. 4 which shows an operation for detecting a drain wire having the cut portion. In addition, in order to detect the cut state of the gate wire, it is sufficient to consider the configuration in which the planer display substrate is rotated by 90° in the configuration shown in FIG. 4 and there is no other specific differences, it can be realized by the same configuration. Operation in this case is assumed to be one in which the electrostatic capacitance between the gate and the source is defined as $C_2$, and the capacitances between the drain and the source as well as between the gate and the drain are ignored, resulting in that they are quite similar to each other.

At first, the substrate is inspected to determine whether or not a defect of a cut wire is present. As shown in FIG. 4, a probe 7 is contacted with the drain wire common electrode 4, another probe 6 is contacted with the drain wire electrode 3 placed at the other end of the drain wire 2, a voltage is applied from the voltage source 35 to measure the current by a current measuring unit 36. In the case that the current value is less than a specified value, it is judged that there is a cut wire. This inspection is similarly carried out in such a way that the other probe 6 is contacted with the drain wire electrodes one by one while the probe 7 of the drain wire common electrode is kept as it is, and then the presence or non-presence of the cut wire of all the drain wires is inspected.

Figure 5A:
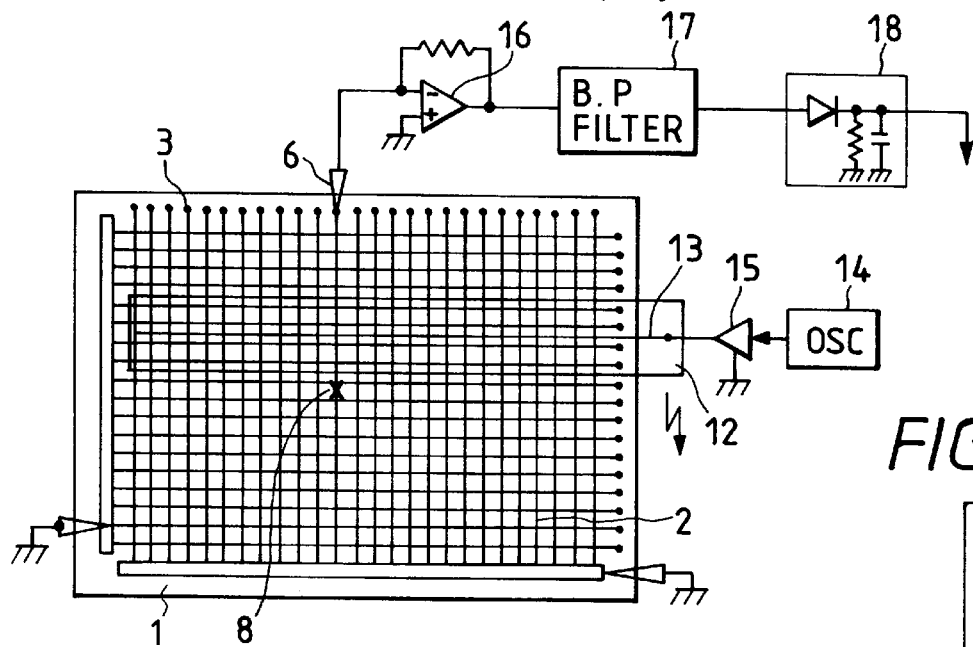
FIGS. 5(a)–5(c) are views of an embodiment for sensing the position of wire cut in a drain wire and showing an output obtained in accordance with the present invention.
Figure 5B:
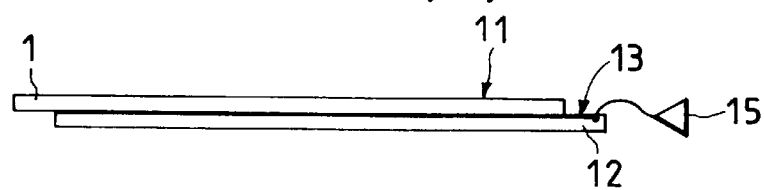

Referring now to FIG. 5(a), a method for specifying the position of a defect based on the principle of the present invention will be described. As shown in FIG. 5(a), a radiation substrate 12 is contacted with or approached to the rear surface of the glass substrate (at the opposite side of the wiring pattern forming surface). On the radiation substrate 12 is formed one radiation pattern 13 in a linear form in parallel with the gate wires. A side view is shown in FIG. 5(b). One end of the radiation pattern 13 is connected to a driver circuit 15 and driven by a rectangular wave signal having a frequency f obtained from an oscillator 14, as shown in FIG. 6(a). In addition, it is preferable that one end of the radiation pattern 13 opposite to the driver circuit is terminated at a terminal resistor in order to prevent a reflection of the applied rectangular wave signal. The radiation substrate 12 is positioned so that the radiation pattern and the drain wire 2 to be inspected and having a defect of a cut wire or disconnection extend transversely to one another. The probe 6 is contacted with the probing electrode 3 arranged at the drain wire 2 to be inspected. To the probe 6 is connected a current-voltage conversion amplifier 16. Since the current to be detected becomes a time differentiation of the applied signal voltage as indicated in the Equation 1, some impulse signals having rectangular wave signals differentiated are detected as shown in FIG. 6(b).

Although as a method for detecting an intensity of the detected signal, there is also a method for measuring wave height values of the impulse signals, the present embodiment uses a method for measuring an intensity of a specified frequency component contained in the impulse signal. That is, the voltage converted detected signal is amplified by an amplifier, thereafter only a basic wave or harmonic wave of the rectangular wave signal is selected by a narrow band-pass filter 17 having a central passing band nf (n=1, 3, 5, odd number) (FIG. 7). As the central passing band nf, the band having the best S/N may be selected in consideration of a noise spectrum to be detected. Then, an intensity of the detected signal is converted into a DC current by a tuning circuit 18 and provides an output, as shown in FIG. 5(c).

As to the drain wires other than the drain wire to be inspected, a probe is contacted with the drain wire common electrode 4 and dropped down to an earth potential, and also as to the gate wires, the probe is contacted with the gate wire common electrode in the same manner as above, thereby a sensing accuracy of the position of a defect can be improved. That is, there is a possibility that in the case that they are dropped down to the earth potential, the signals passed through these wires are induced at the drain wire to be inspected, a difference of intensity between the radiation pattern in the radiation substrate and the detecting signal at the position of a defect in the cut wire becomes quite low and it is highly influenced by noise.

FIGS. 8(a) and 8(b) illustrate equivalent circuits for the path from the oscillator shown in FIG. 5(a) to the current-voltage conversion amplifier. In this case, it is assumed that a part between the drain and the source is kept at an OFF state in a DC form and they are connected by the electrostatic capacitance $C_2$ and since a width of the drain wire is small as compared with that of the pixel electrode, the radiation pattern and the drain wire are connected approximately by a series-connected electrostatic capacitance of the electrostatic capacitance C between the radiation pattern and the pixel electrode and the aforementioned $C_2$. In addition, if the resistance values between the gate wire and the drain wire are not 0, it is necessary to consider the coupled capacitance $C_S$ between the drain wire connected to the current-voltage conversion amplifier and the drain wire cut and connected to the drain wire common electrode. In addition, when the radiation pattern is placed at the drain wire common electrode side against the cut wire position of the drain wire, a current through series-connected capacitances C, $C_2$ and $C_S$ is inputted to the current-voltage conversion amplifier as shown in FIG. 8(a) or when the drain wire common electrode is dropped down to the earth potential, the state becomes as one shown at the broken line in FIG. 8(a) and then a current of approximately 0 is inputted. As a result, only a low voltage output can be attained from the current-voltage conversion amplifier. In turn, in the case that there is a radiation pattern at the current-voltage conversion amplifier in respect to the position of the cut wire, it becomes a current through the series-connected capacitance of C and $C_2$ as shown in FIG. 8(b) and then a higher voltage output can be obtained.

Figure 5C:
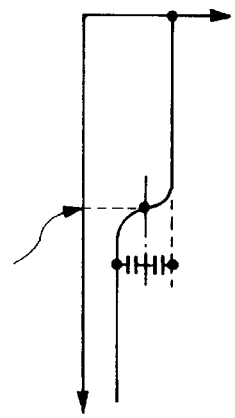

At present, if the radiation pattern 13 of the radiation substrate 12 is moved from the probe electrode 3 having the probe 6 contacted to the current-voltage conversion amplifier 16 along the drain wire 2 to be inspected and an intensity of the detecting signal is observed, an output of the tuning circuit is substantially decreased at a certain point as shown in FIG. 5(c). Then, the position of the radiation pattern 13 on the radiation substrate 12 where a mean value across a variation of the output is taken is defined as the position of a defect. In addition, as to the method for determining the position of a defect, it is possible to apply various kinds of methods as described later, and it is satisfactory to select the most accurate method.

Figure 9:
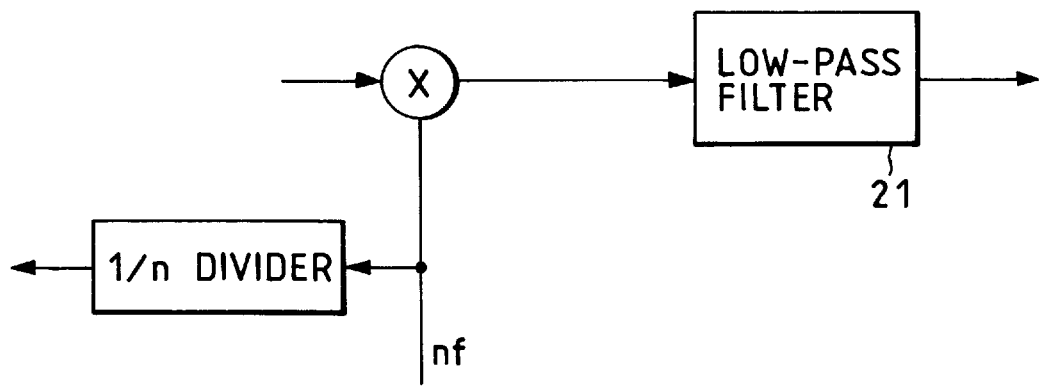
FIG. 9 shows another circuit for detecting an intensity of the detected signal in accordance with the embodiment of FIGS. 5(a)–5(c).

For detecting an intensity of the detecting signal, a combination of the band-pass filter 17 and the tuning circuit 18 has been applied has been shown in FIG. 5(a), although as shown in FIG. 9, it may also be applicable to combine the output of the current-voltage conversion amplifier 16 having a signal of the oscillator as a reference signal and a low-pass filter 21 (more accurately, the multiplier indicated in the equation 2 and the low-pass filter 21 using two reference signals having different phases displaced by 90° to each other) so as to provide a so-called lock-in amplifier. In this case, a rectangular wave having a frequency nf is oscillated from the oscillator 14, a rectangular wave having a frequency f which is an output of a 1/n frequency divider 20 is supplied to the radiation pattern of the radiation electrode, and as a reference signal, a rectangular wave having the frequency nf which is an output from the oscillator is applied, resulting in that it shows a frequency relationship which is similar to that of the aforementioned embodiment. An advantage of the use of the band-pass filter consists in the fact that an intensity of the detecting signal can be detected under a simple configuration. In turn, in the case that the synchronizing tuning is applied, this has some advantages that it is possible to make an easy realization of detection of signal at a narrow band as compared with that of the case in which the band-pass filter is utilized, resulting in that although the configuration is complicated, a detection of signal with a more accurate S/N can be carried out, and an improved sensing accuracy for the position of a defect can be expected. It is also possible to apply a sine wave as an output signal of the oscillator in place of the rectangular wave. In this case, if a value of n=1 is applied in the aforementioned frequency relation, the signal tuning circuit using the band-pass filter or the synchronizing tuning circuit may be used.

Figure 10:
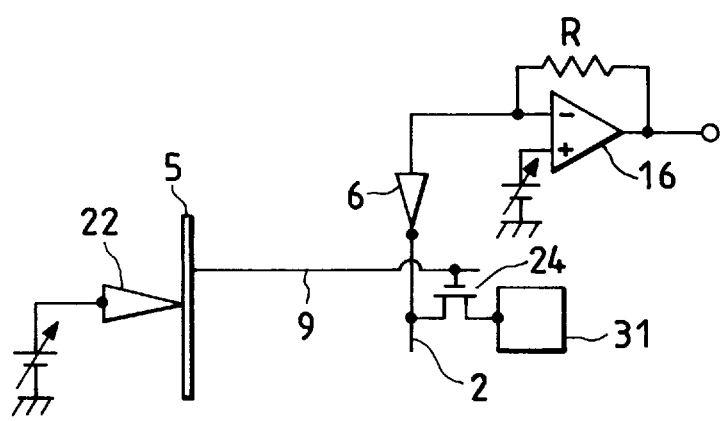
FIG. 10 shows a circuit for turning on a TFT in the TFT liquid crystal substrate.

In addition, in the above description, it is assumed that a part between the source and the drain in all the TFTs is set to be OFF in a DC form. As shown in FIG. 10, it is possible that a DC plus (+) voltage is applied to the gate wire 9, a DC bias voltage is applied to the current-voltage conversion amplifier 16 and a part between the source and the drain of TFT is turned ON. In this way, it is possible to improve an S/N of the detected signal.

In accordance with the above-described embodiment, there is provided a configuration in which one radiation pattern formed in the radiation substrate is physically moved so as to detect a variation of intensity of the detected signal, so that if the S/N ratio in signal detection is improved, a moving resolution of the radiation pattern becomes a sensing accuracy for the position of a defect as it is. In this way, such embodiment has an effect that a high accurate sensing of the position of a defect can be realized.

Figure 11:
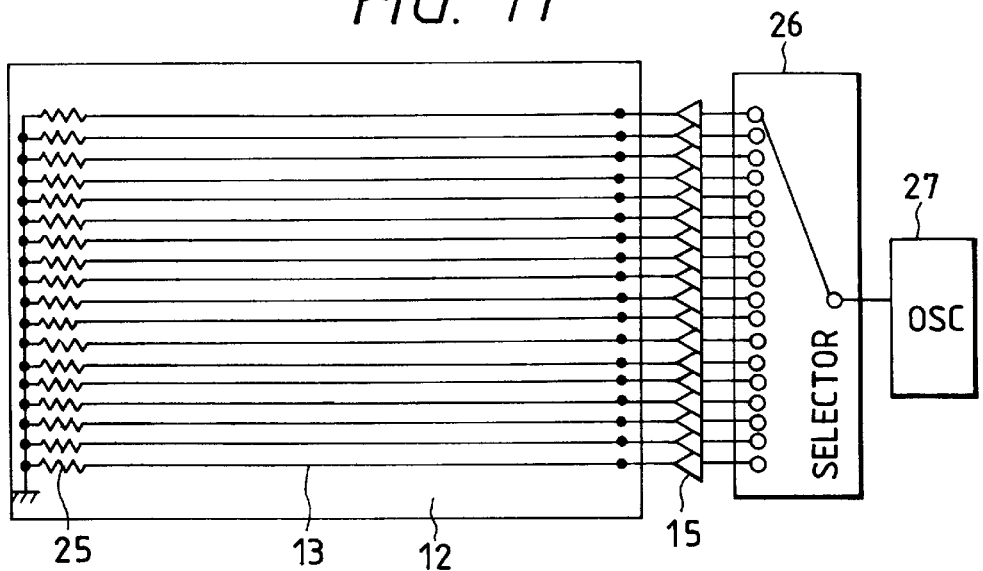
FIG. 11 shows another embodiment for detecting the cut wire position in the drain wire in accordance with the present invention.

Referring now to FIG. 11, the another embodiment for specifying the position of a defect will be described, wherein the radiation substrate 12, the driver circuit 15 and the oscillator 14 in the embodiment shown in FIG. 5(a) are replaced with those shown in FIG. 11 and all the remaining elements are the same as those of the previous embodiment. In the embodiment of FIG. 5(a) for specifying the position of the defect, although the radiation substrate is moved along the drain wire to be inspected, the embodiment is operated such that a plurality of radiation patterns are formed on the radiation substrate and basically the radiation patterns are electrically selected while the radiation substrate is being fixed and then the radiation patterns are moved in the same manner as that of such embodiment in an equal manner.

As shown in FIG. 11, a plurality of radiation patterns 13 are formed on the radiation substrate 12 in parallel under a specified width and interval and over a longer range than a length of the drain wire. The radiation patterns 13 extend transversely to the drain wires and the radiation substrate 12 is contacted with the rear surface of the glass substrate or approached to it. One end of each of the radiation patterns 13 is connected to the driver circuit 15. Inputs of each of the driver circuits 15 are connected to the outputs of a selection circuit 26. The rectangular wave signal outputted from an oscillator 27 is inputted to one driver circuit 15 only and the rectangular wave signal is given to one radiation pattern 13 only. In order to prevent a non-required radiation of signal caused by its rounding action, the non-selected radiation pattern is fixed by the driver circuit with a low to impedance at a specified potential such as earth potential. One end of the radiation pattern opposite to the driver circuit is terminated at a terminal resistor in order to prevent reflection of the applied rectangular wave signal in the same manner as that of the embodiment of FIG. 5(a).

The method for specifying the position of a defect in accordance with the embodiment of FIG. 11 is that radiation patterns 13 are selected one by one in sequence from a side corresponding to one end of the drain wire through the selection circuit 26 and the rectangular wave signal is applied. The position of a defect is specified with reference to a variation in intensity of the sensing signal at this time. The point corresponding to a middle point of each of mean values across the substantial variation in intensity is calculated in accordance with the following equation under interpolation and then a sensing accuracy of the position of a defect is improved.

$$Y_0 = \frac{Y_1(S_2 - S_0) + Y_2(S_0 - S_1)}{S_2 - S_1} \quad \text{(Equation 3)}$$

where, $Y_0$ is a detected defect position, $S_0$ is a value of middle point of each of mean values across a substantial variation in intensity, $S_1$ and $S_2$ are intensities of sensing signals against the radiation patterns giving a value across $S_0$ ($S_1 \leq S_0 < S_2$), and $Y_1$, $Y_2$ are positional coordinates of the radiation pattern at that time.

As a method for determining the position of a defect under interpolation, in addition to the foregoing, there is another method for calculating a variation in intensity of the sensing signal in approximate relation with the specified function. Further, it is also possible that a variation in intensity of the sensing signal is differentiated to obtain its peak value (a function is assumed and under an interpolation), the most steep variation part may be set as the position of a defect. In any way, the method for giving the most accurate position of a defect is made different in view of the configuration of the inspection device or the substrate to be inspected, so that one method is selected from some of the aforementioned methods under experiment and studying.

Figure 12:
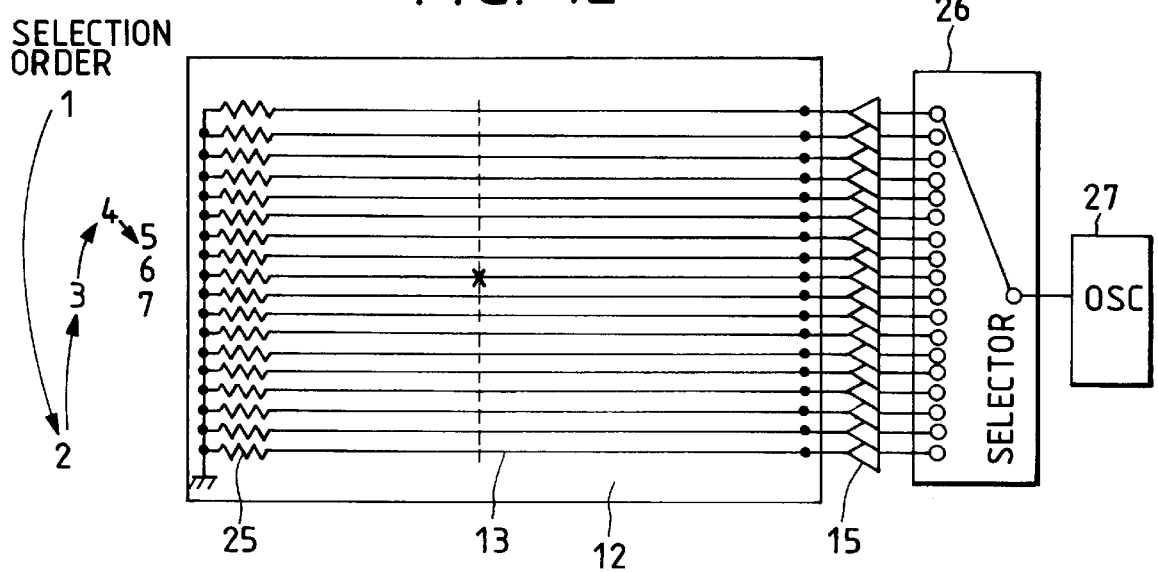
FIG. 12 shows a modification of the embodiment of FIG. 11 for selecting a radiation pattern.

In the foregoing description, although the selection of the radiation pattern through the selection circuit is carried out in sequence from one end of the drain wire to be inspected, it is also possible that a method in which intensities of sensing signals at both ends of the drain wire and their middle point are at first detected, as shown in FIG. 12, the sensing signal having a larger difference of the adjoining two points is selected, the radiation pattern at the middle point is selected and the intensity of the sensing signal is detected is repeated until the adjoining radiation patterns are selected, thereby the point giving a substantial variation in intensity can be found out rapidly. In order to improve a sensing accuracy of the position of a defect, it is also possible to perform a continuous selection of a plurality of radiation patterns across the point giving a substantial variation in intensity detected by the aforementioned method and to set the final position of the detected defect under the aforementioned interpolation.

Although the selection of the radiation pattern in the foregoing description is carried out one by one, it is also possible that a plurality of adjoining radiation patterns are selected and concurrently they may be driven by a rectangular wave. This method is effective for reducing a variation of the sensing signal in the case that the sensing signal shows a variation due to a difference in pitch of the radiation patterns as well as a pixel pitch in a vertical direction of the TFT liquid crystal substrate.

It is apparent that all the methods indicated in the embodiment of FIG. 5(a), such as a method for handling the common electrode, applying a bias voltage, and sensing a signal waveform given to the radiation pattern and sensing intensity of the sensing signal and the like can be applied to the embodiment of FIG. 11. In accordance with such embodiment, it has an effect that the position of a defect can be specified within a short period of time due to an electrical changing-over of the radiation patterns through the radiation substrate formed with a plurality of radiation patterns.

In the afore-described embodiments, the length of the radiation patterns on the radiation substrate is not described. In order to make the shortest inspection time, it is preferable that the radiation patterns are set to have a length longer than that of the gate wire and after setting the radiation substrate once against the TFT liquid crystal substrate, the radiation substrate is not moved toward the gate wires. In particular, in the case that there occur frequently a plurality of defects per one TFT liquid crystal substrate, this method is effective. However, if the radiation patterns are extended in their lengths, a signal turning around them through the gate wires is increased in size and it is sometimes looked as if $C_S$ indicated in FIG. 8(a) becomes increased. As a result, a rate of variation in intensity of the sensing signal is reduced and there is a possibility that a sensing accuracy for the position of defect is decreased. In view of this, if there is a low probability of occurrence of a plurality of defects or an increasing of inspection time at the time of occurrence of a plurality of defects is allowed, it is preferable that the length of the radiation patterns is short as less than 10 mm, for example. In addition, it is also preferable that the inspection is carried out separately twice with a half of the gate wire being applied. As described above, the length of the radiation patterns should be totally determined with reference to a probability of occurrence of a plurality of defects in the substrate to be inspected, a target inspection time and a sensing accuracy of the position of each of the defects and the like.

In the afore-described embodiments, the radiation substrate is arranged in such a way that the radiation patterns may be contacted with or approached toward the surface of the glass substrate opposite to the wiring pattern forming surface of the TFT liquid crystal substrate. In this case, there is an advantage that a possibility of damaging the formed wiring patterns is low. However, it is preferable that the radiation patterns may be approached toward the forming surfaces of the wiring patterns due to some reasons in arranging of the device. In this case, although it is necessary to perform a strict measurement and control of a spacing in particular, a larger sensing signal can be detected if the radiation patterns are approached to a smaller distance than a value of a thickness of the glass substrate x a specific induction rate of the glass substrate. With such an arrangement as above, it has an advantage that the signal having a higher S/N can be detected, resulting in that the sensing accuracy of the position of defect can be improved.

Figure 13:
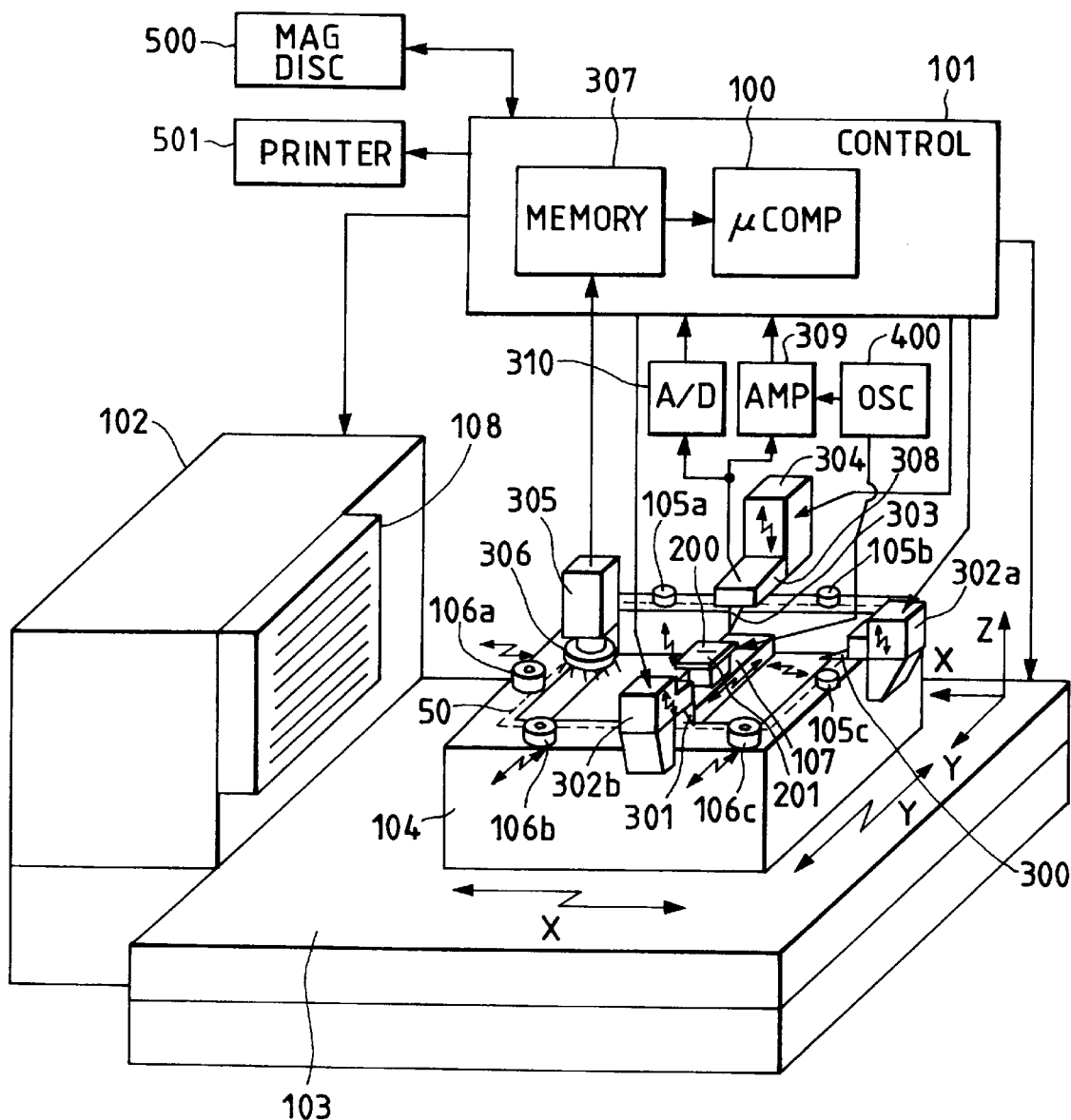
FIG. 13 shows a wiring pattern inspection device in accordance with the present invention.

Referring now to FIG. 13, there is shown a wiring pattern inspection device of the present invention will in which the operation of the entire device is controlled by a control device 101 including a microcomputer 100. A TFT liquid crystal substrate 50 is set at a supporting stage 104 on an XY stage 103 by a loader/unloader device 102. The direction of the X stage is set as a wiring direction of the gate wires and the direction of the Y stage is set as a direction of the drain wires. In addition, the TFT liquid crystal substrate 50 is set in such a way that the wiring pattern forming surface is placed to be up.

As shown in FIG. 13, the TFT liquid crystal substrate 50 is mechanically positioned on the XY stage 103 with position setting pins 105a to 105c, wherein the supporting stage 104 for supporting the substrate 50 with four sides of the substrate by pushers 106a to 106c, and a radiation substrate 201 formed with one radiation pattern 200 which is sufficiently short as compared with a length of the gate wire of a length of about 10 mm are arranged. The radiation pattern 200 is supplied with repeating signals from an oscillator 400. The radiation substrate 201 is supported on the XYZ stage 107 fixed on the XY stage 103 and it can be moved inside the supporting stage 104. That is, the radiation substrate 201 is positioned in such a way that the surface of the substrate formed with the radiation pattern 200 is contacted with or approached to the surface of the glass substrate of the TFT liquid crystal substrate 50, and the drain wire to be inspected and the radiation pattern 200 may be crossed to each other. In addition, motion of the radiation pattern 200 along the drain wires for sensing the position of the defect is carried out under an operation of the XYZ stage 107 in the Y-axis.

Over the XY stage 103 are arranged a probe 300 for contacting with the gate wire common electrode and a probe 301 contacted with the drain wire common electrode. The probes can be moved in a vertical direction by the actuators 302a and 302b. In addition, a probe 303 for contacting with the drain wire probing electrode formed at the opposite side of the drain wire common electrode is fixed to the device through the actuator 304. A TV camera 305 and a lighting 306 detect a position aligning mark on the TFT liquid crystal substrate 50. The position is corrected by the XY stage 103 with reference to information of the sensing position of the position aligning mark, the position aligning mark and the drain wire probing electrode, and then the probe 303 is correctly positioned with respect to the drain wire probing electrode. In order to attain this object, the TV camera 305 is connected to an image memory 307 in the control device 101 and the detected image is processed by the microcomputer 101 within the control device 101. As a method for sensing a position of the position aligning mark, it may also be applicable to select well-known methods.

The probe 300 is provided with an earth potential or a plus DC potential under control of the control device 101. The probe 301 is also provided with an earth potential or a plus DC potential under control of the control device 101. In turn, the probe 303 is connected to a current-voltage conversion amplifier 308. A bias voltage of input of the current-voltage conversion amplifier 308 can be changed over by the control device 101 to the earth potential or the plus DC potential.

The output of the current-voltage conversion amplifier 308 is inputted to the lock-in amplifier 309 having a synchronization tuning circuit and to the A/D conversion circuit 310. The amplitude information (an intensity information of the signal) acting as an output of the lock-in amplifier 309 and the digital conversion value of the analog voltage signal obtained from the A/D conversion circuit 310 are inputted to the control device 101.

For operation of the automatic inspection device, at first, the XY stage 103 is moved to the loader/unloader position, the TFT liquid crystal substrate 50 is taken out of a cartridge 108, and fixed on the supporting stage 104. At this time, the probe 300, the probe 301, and the probe 303 are retracted upwardly by the actuators 302a, 302b and 304. In addition, the radiation substrate 201 is retracted downwardly under an operation of the XYZ stage 107 in a Z-axis. Then, the TFT liquid crystal substrate 50 is moved to the inspection position under motion of the XY stage 103. The position aligning mark on the substrate is detected by the TV camera 305 and the lighting 306 at the inspection position and then the position of the position aligning mark on the TFT liquid crystal substrate 50 is detected. The position of the drain wire probing electrode in the coordinates of the XY stage 103 is calculated in response to the information of sensing position and the positional relation between the position aligning mark and the drain wire probing electrode. The probe 303 is position aligned one by one against the drain wire probing electrode in response to the result of this calculation.

After alignment of positions, the actuator 304 is operated downwardly and the probe 303 is contacted with the drain wire probing electrode. At this time, the actuators 302a and 302b for the probe 300 and the probe 301 are operated downwardly and contacted to each of the gate wire common electrode and the drain wire common electrode, respectively. To the probe 300 is applied an earth potential in advance, and to the probe 301 is applied a plus DC potential in advance. In addition, a bias voltage of the current-voltage conversion amplifier 308 connected to the probe 303 is assumed to be an earth potential. If a current value at the probe 303 inputted by the A/D conversion circuit 310 is less than a predetermined specified value, it is judged that there is a wire cut and the following position of the defect is sensed.

In the case that the value exceeds the specified value, it is judged that no cut wire is present and the probe 303 is once retracted upwardly by the actuator 304, thereafter the XY stage 103 is operated and the afore-described operation is repeated for the next drain wire.

As for the drain wire judged as one having a cut wire, the radiation pattern 200 in the radiation substrate 201 is positioned to be aligned with the drain wire under an operation of the XYZ stage 107 in an X-axis. In addition, the radiation pattern 200 is moved toward the drain wire probing electrode under an operation in the Y-axis. Then, the radiation substrate 201 formed with the radiation pattern 200 is approached to the surface of the glass substrate of the TFT liquid crystal substrate 50 under an operation in a Z-axis. The probe 300 is changed over to a plus DC potential (or an earth potential), the probe 301 is changed over to an earth potential, and a bias voltage of the current-voltage conversion amplifier 308 connected to the probe 303 is changed over to a plus DC potential (or an earth potential). The radiation pattern 200 of the radiation substrate 201 is supplied with a rectangular wave signal having a frequency divided by a 1/n frequency divider for the signal obtained from the oscillator 400, and the lock-in amplifier 309 is supplied with a signal obtained from the oscillator 400 as it is. Then, the Y-axis of the XYZ stage 107 is operated and a variation in intensity of the sensing signal of the lock-in amplifier 309 is detected while the radiation substrate 201 is being moved along the drain wires, wherein the position of a defect is determined in accordance with the afore-described method.

Upon determination of the position of defect, the actuator 304 is operated upwardly to retract the probe 303, the probe 303 is aligned in position with the next drain wire probing electrode, and the sensing of the presence or non-presence of the defect and the determining of the position of a defect are repeatedly carried out against all the drain wire probing electrodes.

Upon completion of the inspection of all the drain wires, the position of a defect is stored in a memory medium such as a flexible magnetic disc 500 and the like together with a manufacturing lot No. indicated in the TFT liquid crystal substrate 50 and also this position is displayed at a printer 501. Concurrently, all the actuators 302a, 302b and 304 are operated upwardly to retract the probe 300, the probe 301 and the probe 303 and the Z-axis of the XYZ stage 107 is operated downwardly to retract the radiation substrate 201, thereafter the XY stage 103 is operated to move the TFT liquid crystal substrate 50 toward the loader/unloader position. Then, the TFT liquid crystal substrate 50 is stored in the cartridge 108 by the loader/unloader device 102. Repeating the afore-described operation enables the presence or non-presence of and the position of a defect of cut wire in the drain wire of the TFT liquid crystal substrate to be full-automatically inspected. In accordance with such embodiment, since the presence or non-presence of and the position of a defect of cut wire in the drain wire in the TFT liquid crystal substrate 50 to be full-automatically inspected, the number of inspection steps can be substantially reduced.

Figure 14:
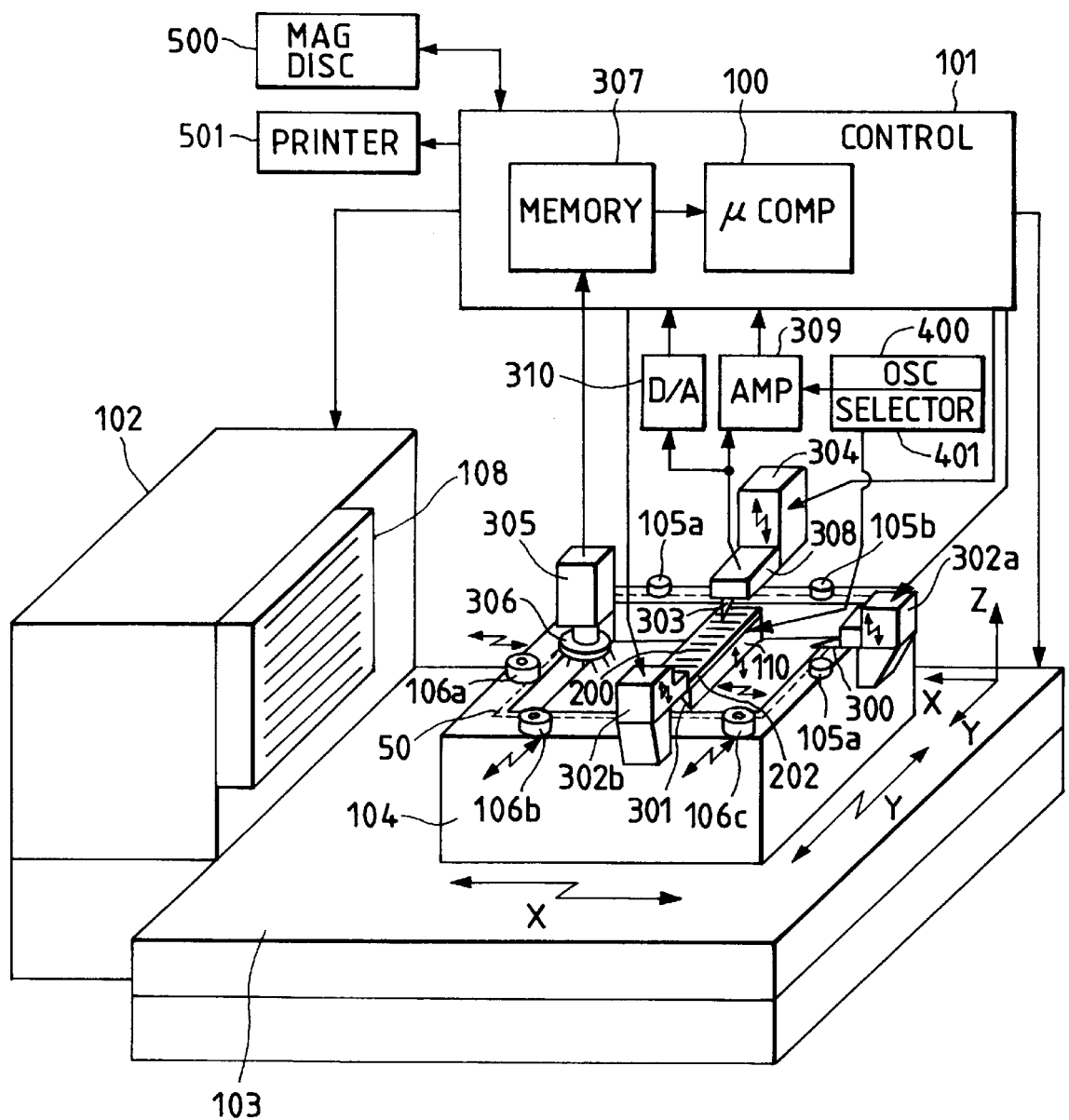
FIG. 14 shows another wiring pattern inspection device in accordance with the present invention.

Referring now to FIG. 14, another embodiment of the wiring pattern inspection device of the present invention will be described which differs from the previously described embodiment consists in the fact that a radiation substrate 202 is utilized which is formed with a plurality of radiation patterns 200. The radiation patterns 200 are sufficiently short as compared with a length of the gate wires of about 10 mm, and a forming range of a plurality of radiation patterns 200 is assumed to be longer than the drain wires. A width of a plurality of radiation patterns 200 and their forming pitch is more than ½ of a space between the gate wires, for example, 0.3 mm, respectively. The radiation substrate 201 in the embodiment of FIG. 13 is supported by the XYZ stage 107 and, the substrate 202 in the embodiment of FIG. 14 is supported by an XZ stage 110. That is, in the embodiment of FIG. 13, the radiation patterns 200 are moved along the drain wires under an operation of the Y-axis of the XYZ stage 107, and, the radiation substrate 202 is not moved in the direction of Y-axis, but it is selected by a selection circuit 401 from a plurality of radiation patterns 200, a rectangular wave signal obtained from the oscillator 400 is supplied and an equally similar effect is produced. A selecting method for the radiation patterns 200 and a method for determining the position of a defect are already described in the embodiment of FIG. 11 for specifying the position of a defect. In addition, in this case, the radiation substrate 202 is aligned in position to the drain wires under an operation of the X-axis of the XZ stage 110, thereafter the Z-axis is operated upwardly and contacted with the TFT liquid crystal substrate 50. Other configurations and operations except for the described differences are the same as those of the embodiment of FIG. 13. In accordance with the embodiment of FIG. 14, a faster inspection can be attained in addition to the effect produced by the embodiment of FIG. 13 of the wiring pattern inspection device of the present invention.

Figure 15:
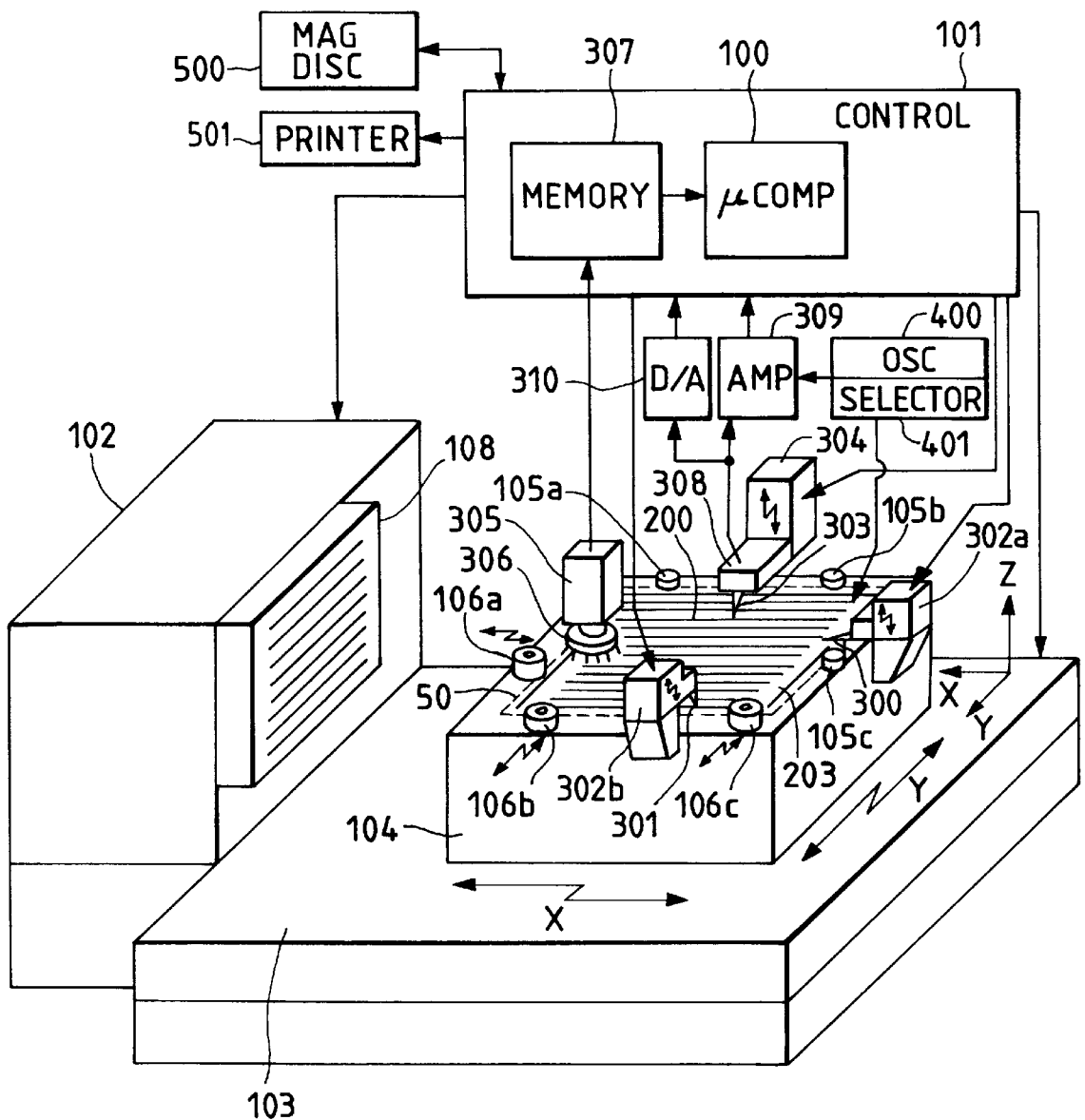
FIG. 15 shows a further wiring pattern inspection device in accordance with the present invention.

Referring now to FIG. 15, a further embodiment of the wiring pattern inspection device of the present invention differs from the embodiment of FIG. 14 in that a length of a plurality of radiation patterns on a radiation substrate 203 is longer as compared with that of the gate wires. Accordingly, the radiation substrate 202 in the embodiment of FIG. 14 is supported by the XZ stage 110 and the radiation substrate 203 in the present embodiment is directly fixed to the supporting stage 104 and no XZ stage 110 is used. The surface of the radiation substrate 203 is flush with the surface of the supporting stage 104, and the radiation patterns 200 are contacted with the glass surface of the TFT liquid crystal substrate 50 where no wiring patterns are formed. Other elements are the same as those of the embodiment of FIG. 14.

The present embodiment enables a reliability of an entire device to be improved, and a probability of producing damage against the TFT liquid crystal substrate 50 is reduced due to use of a smaller number of mechanical movable sections while also attaining the effects of the embodiment of FIG. 14 of the wiring pattern inspection device.

In the embodiments of the wiring pattern inspection device of the present invention described above, the presence or non-presence of the defect of cut wire in each of the drain wires is detected within the inspection device. However, it is also possible to inspect only the presence or non-presence of the defect by another electrical conduction inspection device for testing an electrical conduction, only the substrate having the defect is inspected by the wiring pattern inspection device so as to enable the position of a defect to be inspected. In this case, although it is necessary to add a keyboard, a flexible magnetic disc or a network or the like for use in inputting information about the position of the drain wire having the defect therein obtained from the electrical conduction inspection device to the embodiments of the afore-described wiring pattern inspection device, in turn, it is possible to eliminate the sensing section for use in sensing the presence or non-presence of the defect.

Normally, in the midway stage of the manufacturing step, it is an essential requirement to perform an inspection of the presence or non-presence of the defect in all the TFT liquid crystal substrates. Accordingly, this inspection must be carried out under the synchronizing speed with the manufacturing speed of the TFT liquid crystal substrate. In turn, detection of the position of a defect or the repairing of a defect or the like may be sufficiently carried out only for the substrate having the defect to be detected and so it is normally allowed to take much more time. In view of the foregoing, the present invention enables both inspection of the presence or non-presence of a defect and detection of the position of a defect to be separately carried out, resulting in that it is not necessary to speed up the speed of the inspection device or it is not necessary to apply the inspection device more than that required and so there is a possibility that the device can be attained entirely under a smaller amount of investment for a facility.

Figure 16:
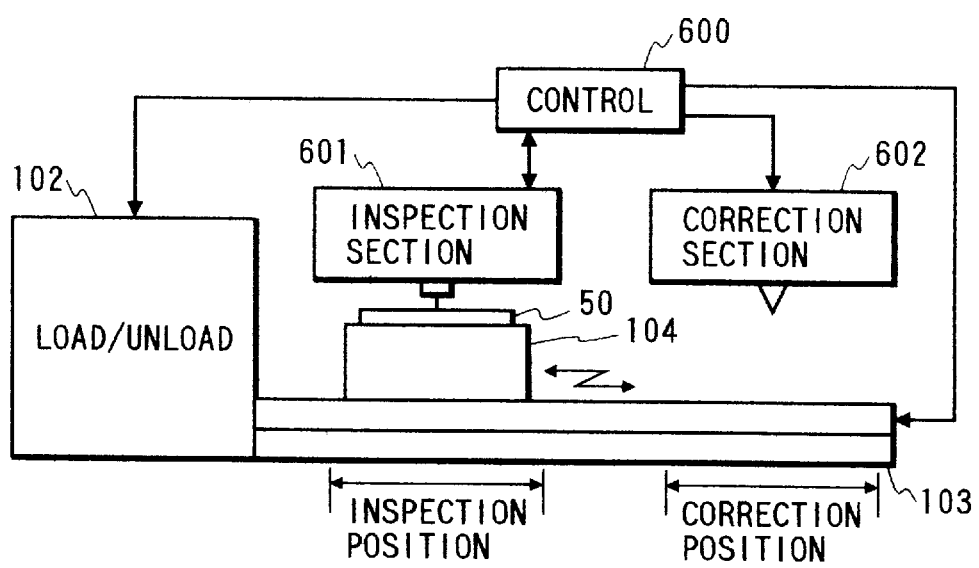
FIG. 16 shows a system of a wiring pattern inspection device and correction device in accordance with the present invention.

In FIG. 16 is illustrated a configuration of a device in which the repairing function for the defect of cut wire is added to the wiring pattern inspection device of the present invention. In the present embodiment, the stroke of the XY stage 103 is increased, the TFT liquid crystal substrate 50 having the position of defect detected is moved to the repairing position, and the position of the defect is repaired. The entire device is comprised of the XY stage 103, the supporting stage 104 storing the radiation substrate therein, an inspection section 601 and a repairing or correction section 602, and the entire device is controlled by a controlling section 600. In this figure, the loader/unloader 102 is also illustrated. As a method for repairing the pattern, a method for crystallizing metal in gas with a laser CVD, a method for coating metallic paste and a method for coating the metallic complex and crystallizing metal with laser or the like can be properly applied in response to the product to be inspected.

The coordinates of the position of a defect are converted into coordinates with the detected position aligning mark on the TFT liquid crystal substrate 50 and applied for the position alignment during the correction. That is, the position aligning mark on the TFT liquid crystal substrate is detected by the TV camera and the lighting placed similarly even at the correcting position and then the position aligning of the correcting device is carried out with reference to the detected position and the coordinates of the position of the defect converted in coordinates with the position aligning mark being applied as a reference mark.

After performing the correcting operation, the TFT liquid crystal substrate 50 is returned to the inspecting position, the detection of the presence or non-presence of the defect is carried out for the corrected drain wires and it is also possible to confirm that the correction is positively carried out. By adding the correcting function to the inspection device, there is provided an effect that a compact configuration of the device can be realized, resulting in that an entire price of the facility can be reduced. In addition, since it is not necessary to place the TFT liquid crystal substrate on the inspection device and the correcting device, the present invention may produce the effects that preparation time can be saved and also an occurrence of new defect caused by improper handling during a placing operation can be restricted.

FIG. 17 is a flow chart of a manufacturing method for making a wiring pattern substrate based on the wiring pattern substrate of the present invention as described above wherein a wiring pattern is formed in step 1701. At first, the presence or non-presence of the defect is inspected by testing an electrical conduction against all the drain wires in step 1702, and a determination of a defect is made in step 1703 with a substrate having no defect transferred to the next operation. The number of defects in the substrate is detected in step 1704 and if the number of defects is less than a specified value, the position of the defect is detected in response to a variation in electrostatic characteristic of the present invention against the drain wire having the defect in step 1705, the correcting device is aligned in position with the position of the defect and then the defect is corrected in step 1706. If the number of defects exceeds the specified value in step 1704, the substrate is rejected as waste. Similarly, if the size of the defect is abnormally large so that the defect can not be corrected as determined in step 1707, the substrate is also rejected as waste. As for the corrected defect, its electrical conduction is inspected again in step 1708 and in turn in the case that no defect can be found in step 1703, the substrate is transferred to the next operation and if the defect is found again at the substrate, the position of the defect is detected again and the foregoing processing is repeated. In accordance with the method for manufacturing the afore-described wiring pattern substrate, since the inspection and the correction are totally carried out, there is no loss in the steps and further the substrate having the defect is not flowed to a next operation due to re-inspection after correction.

In the afore-described embodiments, it has been described that one TFT liquid crystal substrate is formed on one substrate, although even in the case that a plurality of TFT liquid crystal substrates are formed on one substrate, the TFT liquid crystal substrate to be inspected is installed at a predetermined position in the supporting stage, thereby each of the TFT liquid crystal substrates can be inspected and corrected in the same configuration and operation. It is of course apparent that a plurality of inspection devices or correction devices may be installed within one device in response to the number of TFT liquid crystal substrates on one substrate while only one supporting stage or XY stage is utilized. Further, the present invention does not merely perform the inspection against the TFT liquid crystal substrate described above, but can be applied to planer display substrates such as STN liquid crystal substrate and a plasma display substrate and the like in the same configuration and operation and also in general to wiring patterns formed on an insulating member.

In accordance with the wiring pattern inspection method and device of the present invention, since the position of the defect can be detected at a fast speed, the inspection time is reduced. Further, as compared with the automatic inspection with reference to an outer appearance, it is possible to restrict the price of the device to be as low as possible. Moreover, applying of the wiring pattern inspection device of the present invention enables a rapid inspection and correction of the wiring pattern defect as found in a planer display substrate to be carried out and in particular, when a large number of product substrates are formed in the substrate of large area, the present has an effect that a final yield of the product can be substantially improved without substantially increasing a mean step time.

A method of repairing a cut wire of disconnection of wiring and a TFT substrate and a method of repairing wiring thereof of the present invention will be explained with reference to FIGS. 18(*a*) and 18(*b*) which shows in plan view and sectional view a part of a TFT substrate having a glass substrate 128 with a gate wiring 121 formed thereon. In regard to the gate wiring 121, an aluminum thin film is formed by sputtering and it is then patterned by photolithography and etching. In this case, disconnection or half-disconnection of wiring occurs due to deposition of foreign matter. Since the gate wiring is set on the glass substrate 128, such disconnection or half-disconnection of wiring can be repaired easily. Next, this gate wiring 121 is covered with a gate insulating film ($Al_2O_3$) 125. Moreover, the glass substrate 128 and the gate insulating film 125 are covered with a gate insulating film (SiN) 126 by CVD (Chemical Vapor Deposition). Next, a picture element electrode 124 is then formed on the gate insulating film 126. In addition, a semiconductor film (a-Si) 123 is formed at the TFT section on the gate insulating film 126. The semiconductor film 123 of the TFT section and the picture element electrode 124 are connected with a source electrode (Al/Cr) 122. Moreover, a drain wiring (upper wiring (upper layer wiring), data wiring) (Al/Cr) 120 connected to the semiconductor film 123 of the TFT section is formed crossing the gate wiring 121. This drain wiring (upper wiring (upper layer wiring), data wiring) 120 is formed in the thickness Ht of 0.2 to 0.3 $\mu$m and in the width W of about 10 $\mu$m. Since the Al/Cr thin film is formed by sputtering and is then patterned by photolithography and etching, a disconnection 130 or a partial or half-disconnection 131 is generated due to deposition of foreign matters. The drain wiring 120 is arranged adjacent to picture element electrodes 24 with an interval of about 20 $\mu$m. In the TFT section, a protection film (SiN) 127 (not shown) is formed by the CVD method thereon. In addition, an orientation film of polyimide is formed on this protection film 127. A liquid crystal display device is formed on the TFT substrate through a combination of a liquid crystal and a color filter.

Figure 18A:
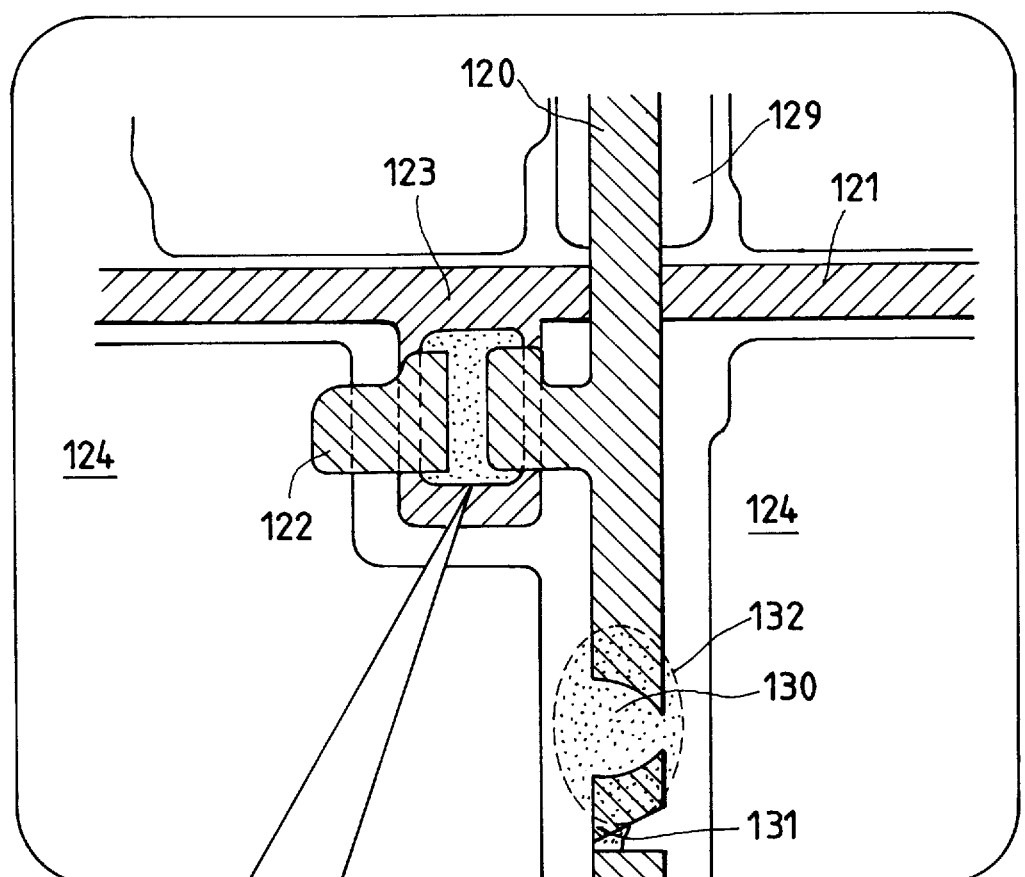
FIGS. 18(a) and 18(b) show in a plan view and in a sectional view a TFT section in a TFT substrate of the present invention.
Figure 18B:
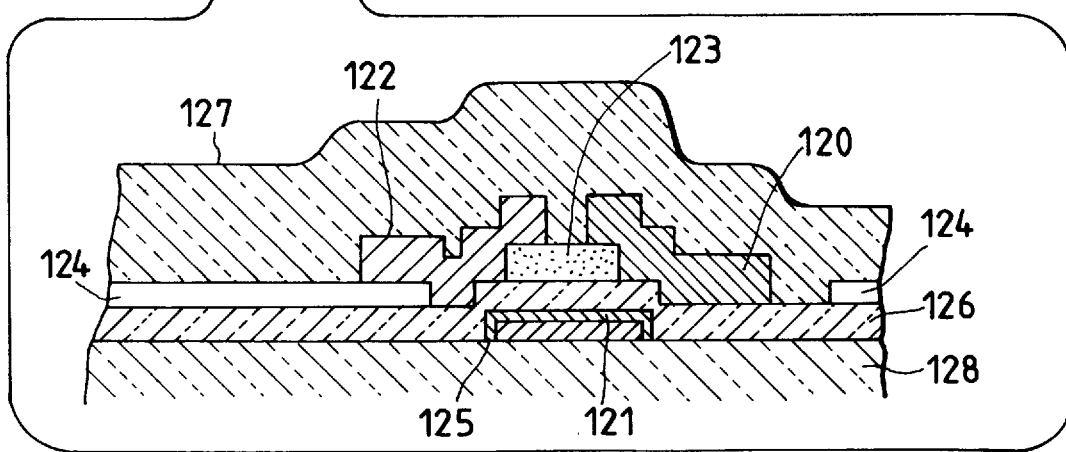

The TFT substrate also has the constructions other than that shown in FIGS. 18(a) and 18(b) and the present invention is effective for repair of disconnection 130 or half-disconnection 131 occurring at a stacked upper wiring (upper layer wiring) (corresponding to the drain wiring 120 in the case of the construction shown in FIGS. 18(a) and 18(b)) 120 among the other wirings, because when the wirings are stacked, the construction is substantially approximated to the final product of the TFT substrate.

First, repair of disconnection 130 or half-disconnection 131 occurring in an upper wiring (drain wiring) 120 before the upper wiring (upper layer wiring) (drain wiring: data wiring) 120 is covered with the protection film 127 in the TFT substrate will be explained with reference to FIG. 19 which is a schematic diagram showing an apparatus for connecting a disconnected or half-disconnected point in an upper wiring (upper layer wiring) of the TFT substrate using a solution or a coating film including a metal complex. Numeral 210 designates a stage which holds a TFT substrate 220 and moves in the directions of X and Y axes and $\theta$ (rotating) axis; a TFT substrate 220; a metal complex supplying section 240 having a microridge or capillary of which an end point diameter is squeezed to 1 $\mu$m to 2 $\mu$m, which supplies, to a disconnected or half-disconnected point of the upper wiring 120 on the TFT substrate 220, a very small amount (about $1 \times 10^{-12}$) of an organic solvent solution 132 which is obtained by dissolving a metal complex such as palladium trifluoroacetic acid complex or palladium pentafluoropropionic acid complex into an organic solvent such as acetonitrile, toluene or alcohol, etc. The metal complex supplying section 240 described above may be replaced with an apparatus which can supply a small amount of coating film including such metal complex to a disconnected or half-disconnected point of the upper wiring 120 on the TFT substrate 220. The metal complex supplying section 240 is loaded on a fine movement stage 240a so that the end point position can be adjustably controlled for the axis of the irradiation of laser beam in order to supply a small amount of organic solvent solution 132 by accurately positioning to the disconnected or half-disconnected point of the upper wiring 120 on the TFT substrate 220. There is provided a YAG laser source 250 for emitting the YAG laser beam for processing the end point areas of the disconnected or half-disconnected point of the upper wiring; an argon laser source 260 for emitting a laser beam to precipitate a metal thin film through the thermal decomposition reaction by irradiating the organic solvent solution 132 supplied to the disconnected or half-disconnected point of the upper wiring 120; an inactive gas or a reducing gas supplying section 270 having a nozzle 270a to supply an inactive gas or reducing gas to the disconnected or half-disconnected point of the upper wiring 120; a light source 280 for observing the surface of the TFT substrate 220; a condenser lens 290 for condensing a laser beam; a variable aperture 210 for adjusting light flux of the laser beam projected to he surface of the TFT substrate 220 depending on the disconnected or half-disconnected point of the upper wiring 120; a TV camera 211 for picking up an image to observe the surface of TFT substrate 220, light flux of laser beam projected on the surface of TFT substrate 220 and the end point of the metal complex supplying section; a TV monitor 212 for displaying an image picked up by the TV camera 211; an input arrangement 213 including, for example, a keyboard, mouse, disk and a communication unit through which a positional data of the disconnected or half-disconnected point of the upper wiring 120 of the TFT substrate and a design data (reference pattern data) of the upper wiring 120 of the TFT substrate can be inputted. Particularly, in the case of changing an amount of solution or coating film supplied from the metal complex supplying section 240 depending on the scale of the disconnected or half-disconnected point of the upper wiring 120 displayed on the TV monitor 212, data can be inputted using the input arrangement 213. Numeral 214 designates a control apparatus for controlling the stage 210, metal complex supplying section 240, fine movement stage 240a, YAG laser source 250, argon laser source 260 and inactive gas or reducing gas supplying section 270 based on the data (information) inputted from the input arrangement 213 and image information obtained from the TV camera 211.

Although not illustrated, a disconnected point 130 or half-disconnected point 131 of the upper wiring is detected by a continuity test, continuity inspection and in some cases by visual inspection between the upper wiring 120 and gate wiring 121 or in the upper wiring 120 and then approximate coordinates (picture element position) data and data indicative of a type of disconnection are stored in the disc, etc. When this disc is inputted from the input arrangement 213 described above, the stage 210 is moved under the control from the control apparatus 214 and thereby the disconnected point 130 or the half-disconnected point 131 of the upper wiring is positioned almost to the position of the laser beam irradiation axis. Moreover, the control apparatus 214 accurately positions the disconnected or half-disconnected points 130, 131 of the upper wiring 120 through fine movement of the stage 210. Moreover, the laser beam flux irradiated is adjusted by a variable aperture 215. In this case, the control apparatus 214 can automatically control the variable aperture depending on an image of the variable aperture 215 picked up by the TV camera 211 or an image of the surface of the TFT substrate.

For repairs, first as shown in FIG. 20(a), while an inactive gas such as nitrogen gas or argon gas or a reducing gas such as hydrogen gas is supplied in a predetermined amount to the periphery of the disconnected point 130 or half-disconnected point 131 of the upper wiring 120 of a TFT substrate 220 accurately positioned from a nozzle 270a provided at the inactive gas or reducing gas supplying section 270, each end point area 135 of the disconnected wiring 130 or half-disconnected wiring 131 of the upper wiring (Al wiring)

120, shown in plane view in FIG. 20(b), is irradiated with the YAG laser beam 247 emitted from the YAG laser source 250 which is condensed narrower than the width, for example, of the upper wiring 120 by the condenser lens 290 as the condensed YAG laser beam 247 through the scanning by rotation of a galvano mirror (not illustrated) or movement of a table or stage 210 in view of processing each end point area 135 approximately in the shape of tapered area (the angled area is rounded) 136 from the conditions shown in FIGS. 20(a), 20(b) to the conditions shown in FIGS. 20(c), 20(d) by scattering or removing a part of each end point area 135 of the upper wiring (Al wiring) 120 of the disconnected wiring 130 or half-disconnected wiring 131. The desired approximately tapered, shape can be obtained by controlling an output and irradiation time of the YAG laser beam 247 emitted from the YAG laser source 250 with a control apparatus 214. As shown in FIGS. 20(c), 20(d), this approximately tapered shape is considered to eliminate the broken or nearly broken condition of the precipitated metal thin film, as shown in FIGS. 25(c)–25(e), such as Pd and it is apparent that such shape may be replaced by the shape where the upper angled area is rounded. Since the approximately tapered shape is persistently processed by the thermal processing using the laser beam, the upper angled area at the end point area 135 of the thin upper wiring (Al wiring) 120 having the thickness Ht of 0.2 μm to 0.3 μm may be rounded. However, the approximately tapered shape 136 can also be strictly processed, for example, by a sputtering process, dry etching process or assist dry etching process wherein a high luminance ion emitted from a liquid metal ion source is focused by an electrostatic optical system and is deflected for scanning by deflection electrodes as required. In the case of processing by projecting simultaneously the focused ion beam, variable masking technology is necessary. Namely, each end point area 135 of the upper wiring (Al wiring) 120 of the disconnected wiring 130 or half-disconnected wiring 131 can be processed into the approximately tapered shape 135 with a physical arrangement or chemical arrangement other than the method using the YAG laser beam.

Figure 23:
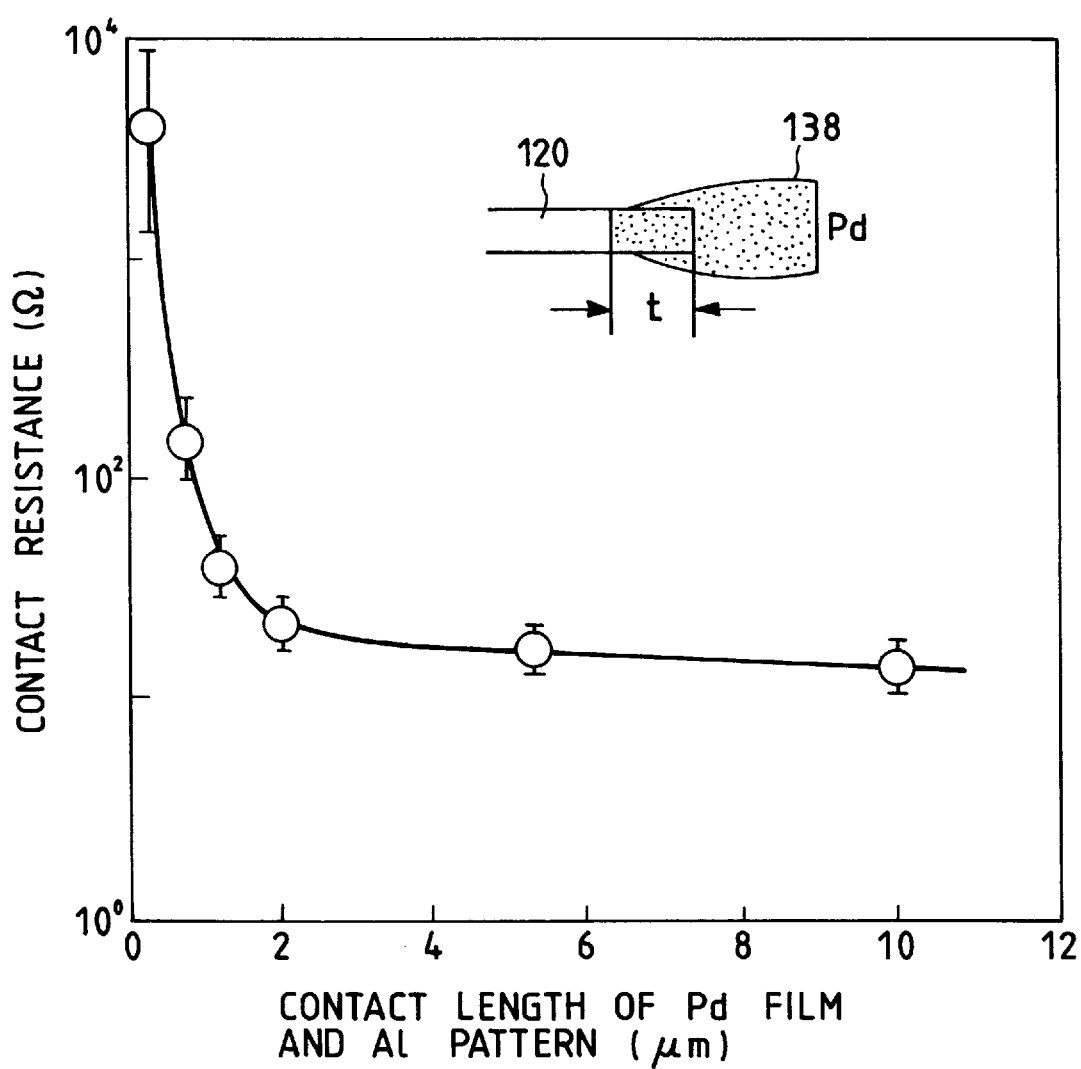
FIG. 23 shows a relationship between length t ($\mu$m) of a Pd film and Al pattern and a contact resistance value ($\Omega$).

Thereafter, the metal complex solution 132 which is obtained, for example, by dissolving palladium trifluoroacetic acid $(Pd(CF_3COO)_2)$ complex into the acetonitrile solution is supplied in a predetermined amount (very small mount) as shown in FIGS. 21(a), 21(b) to the disconnected point 130 or half-disconnected point 131 (including the end point area 135 processed into the approximately tapered shape in the Al wiring in the width of 10 μm, thickness of 0.2 to 0.3 μm, length of the disconnected area of about 10 to 30 μm) of the upper wiring 120 on the TFT substrate 220 accurately positioned from the metal complex supplying section 240 comprising the microridge or capillary of which end point diameter is squeezed to 1 μm to 2 μm (as shown in FIG. 23, it is preferable that the metal complex solution 132 is supplied so that the contact length t becomes 2 μm between the Pd film and upper wiring (Al pattern)). The amount of solution (amount of coating) is adjusted or controlled depending on input information from a manual or input arrangement 213 or a command issued from a control apparatus 214 based on an image information from a TV camera 211 in accordance with concentration of the metal complex solution 132, coating condition and scale of disconnection, etc., but in this embodiment, the acetonitrile solution (metal complex solution, organic solvent solution) 132 including 20 to 30 wt % of the palladium trifluoroacetic acid complex has been supplied (coated) in the amount of about $1 \times 10^{-12}$ l to the disconnected point 130 including the end point area 135 of the approximately tapered shape 136. In this case, the coating film of the metal complex solution 132 is changed to the condition of film through natural drying process or the pre-annealing process (baking process) for 0.5 to an hour at the temperature of about 50° C. and thereafter it is measured with a step meter to determine the thickness H1 of the coating film of the metal complex solution (organic solvent solution) of about 0.1 to 5 μm. Spreading R of the metal complex solution (organic solvent solution) 132 can be set to 40 μm or less which is sufficiently allowable for avoiding contact with an adjacent picture element electrode 124. Here, since the picture element electrode 124 exists as shown in FIGS. 18(a) and 18(b) in the periphery of the disconnected point 131 or half-disconnected point 131 of the upper wiring 120 of the TFT substrate 220, the wiring width is 10 μm and length of the disconnected area is about 10 to 20 μm, fluctuation of spreading of metal complex solution must be within 5 μm or less including the amount of coating of the metal complex solution 132 and positioning of the coating. Therefore, it is very important to accurately control the amount of single coating supplied from the metal complex supplying section 240 with the control apparatus 214 and the positioning of the end point of the metal complex supplying section 240 to the disconnected point 130 or half-disconnected point 131 of the upper wiring 120. Although described later in detail, in the present invention, the content (determining a ratio k=Hm/H1 of the thickness Hm of metal thin film such as Pd precipitated by thermal decomposition reaction by irradiating the thickness H1 of the metal complex solution (organic solvent solution) supplied with the laser beam) of thin film metal such as Pd contained in the metal complex solution (organic solvent solution) 132 supplied (coated) from the metal complex supplying section 240 and the viscosity of the metal complex solution 132 (determining thickness H1 of the metal complex solution for the spreading R of the metal complex solution (organic solvent solution) supplied) are important.

Next, the disconnected point 130 or half-disconnected point 131 of the upper wiring 120 of the TFT substrate 220 which is positioned accurately (on the coating film of the metal complex solution (organic solvent solution) 132) is irradiated with an argon laser beam 241 which is emitted from the argon laser beam source 260 and is focused with the condenser lens 290 as a focused argon laser beam through the scanning with rotation or movement of the galvano mirror (not illustrated) or movement of the table or stage 210 so that the thin film metal 138 such as Pd, as shown in FIG. 21(c), 21(d), is continuously precipitated by the thermal decomposition reaction in the thickness Hm of about 0.08 to 0.15 μm between the end points 135 covering the end point area 135 of the upper wiring 120 in order to connect the disconnected or half-disconnected upper wiring 120. In this case, the condensed laser beam flux to be projected can be adjusted and controlled by manually controlling the variable aperture 215 or by controlling it with the control apparatus 214. An output of the argon laser beam is determined considering amount of coating and irradiation area of the metal complex solution 132. However, in the present embodiment, the argon laser beam 241 emitted from the argon laser source 260 is condensed with a condenser lens (objective lens) 290 of 40 times to continuously irradiate the metal complex solution or coating film 132 for several seconds to several tens of seconds. The intensity of the argon laser beam is set to about $1 \times 10^4 \text{w/cm}^2$ at the surface of the substrate. Here, there is no problem in irradiation of the argon laser beam when it is intermittently applied like a pulse so long as it has an energy equivalent to that in the continuous irradiation. Moreover, another kind of laser source or heat source other than the argon laser may also be used when it easily realizes precipitation of the metal from the metal complex solution or coating film 132. As shown in FIGS. 21(c), 21(d), the metal complex solution or coating film 132 irradiated with the argon laser beam is heated and thereby acetonitrile which is contained as the solvent is vaporized and a metal thin film 138 such as Pd is precipitated by the thermal decomposition reaction. In this case, the thickness Hm of the metal thin film 38 is reduced to about 1/k (k=about 10 to 5) in comparison with the thickness H1 of the metal complex coating film 132 before irradiation of argon laser beam and in some cases becomes thinner (about 0.1 µm) than the thickness Ht of the upper wiring (Al wiring) 120. However, it is of course possible that since the end point area 135 of the disconnected point 130 of the upper wiring (Al wiring) 120 in contact with the metal thin film 138 is processed in the tapered shape 136, the precipitated metal thin film 138 sufficiently covers, as shown in the enlarged view of FIG. 21(c), i.e. FIG. 21(e), the end point area 135 of the disconnected point 130 of the upper wiring 120 without generating a broken or nearly broken condition. As described above, when a metal thin film 138 is formed at the disconnected point 130 of the upper wiring (Al wiring), the electrical resistance across the upper wiring 120 is about 100 Ω or lower (about 20 to 50 Ω) including a contact resistance between the upper wiring 120 and metal thin film 138 and it can be confirmed that the disconnected point 130 is repaired with the low resistance metal thin film 138 such as Pd.

As enlarged in FIG. 21(e), since the end point area 135 of the upper wiring 120 at the disconnected point 130 or half-disconnected point 131 is formed in the tapered shape 136, the disconnected point can be connected with a very low contact resistance of 30 to 20 Ω as shown in FIG. 23 without generating a broken or nearly broken condition in the metal thin film 138 of Pd. As is apparent from FIG. 23, the contact resistance can be set to about 100 Ω or lower by setting the contact area in length of 0.7 µm or longer between the Pd film 138 and the end point area 135 of the upper wiring (Al pattern) 120. Thus, even when the thickness Hm of the metal thin film 138 is about 0.08 to 0.15 µm which is ½ or less to the thickness Ht=about 0.2 to 0.3 µm of the upper wiring (Al pattern), the disconnected point can be connected (repaired) with a contact resistance of about 100 Ω unless the metal thin film 138 is in the broken or nearly broken condition.

Figure 22:
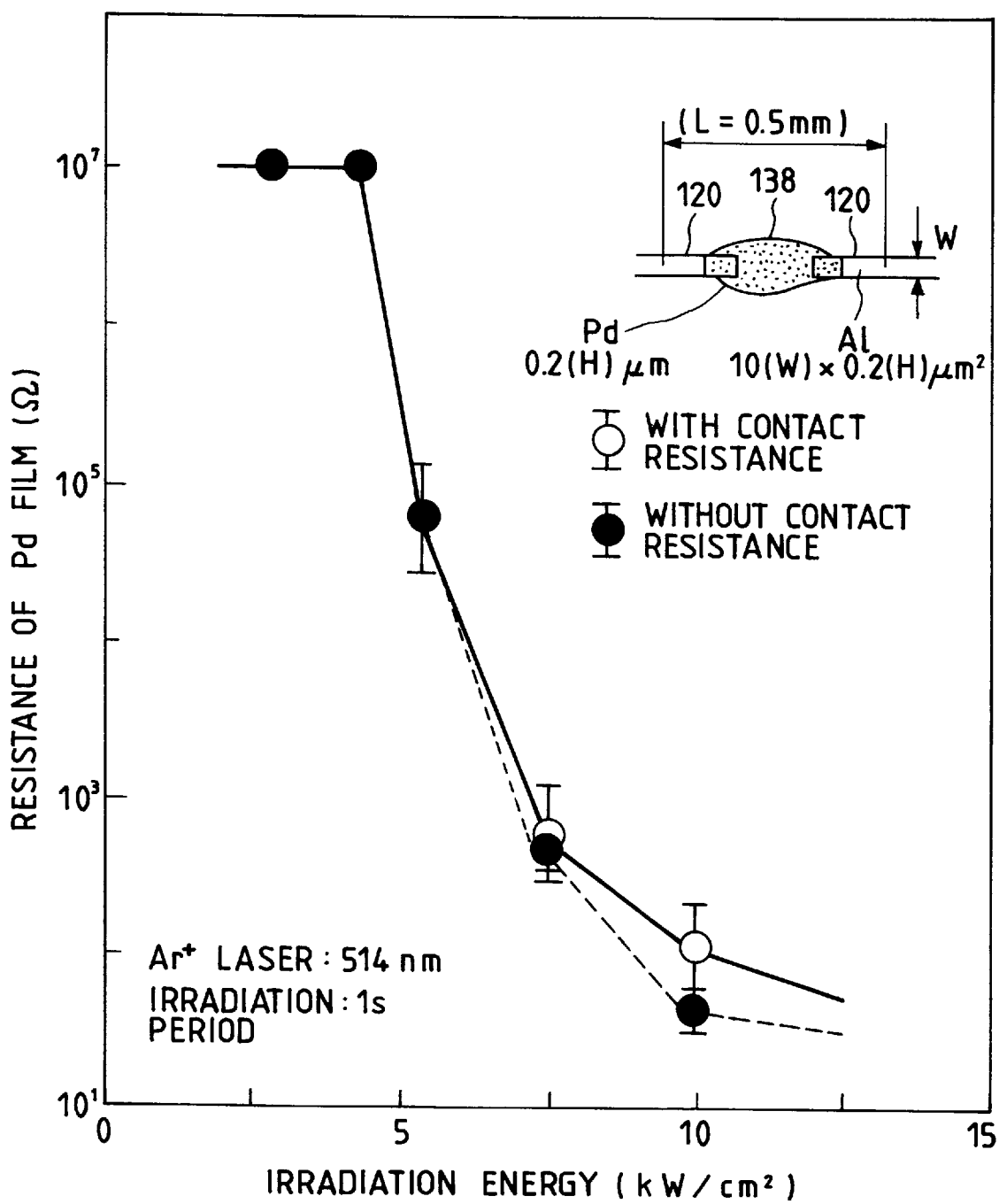
FIGS. 22 shows a relationship between irradiation energy (kw/cm$^2$) of an argon laser beam and a resistance value ($\Omega$) of Pd film in accordance with the present invention.

FIG. 22 shows a relationship between a resistance (resistance of Pd film) (Ω) and irradiation energy (kW/cm$^2$) of the argon laser (wavelength=514 nm) at a resistance measuring point in the area in length of L=0.5 mm including both sides of the disconnected point. The mark ● represents a resistance not including the contact resistance, while the mark ○ represents a resistance including the contact resistance. As is apparent from FIG. 22, a resistance value becomes about 100 Ω or lower when the irradiation energy becomes about 10 kW/cm$^2$ or higher. A contact resistance is about 20 Ω. As described above, the disconnected point 130 or half-disconnected point 131 can be surely connected with higher reliability, in separation from the adjacent picture element electrode 124, with a metal thin film of Pd, etc. which is thinner than a thickness Ht of the upper wiring (Al pattern) 120, sufficiently satisfying the target resistance of the upper wiring 120 from one end to the other end of about 0.1 kΩ to 1 kΩ (about 1 kΩ in maximum).

The palladium trifluoroacetic acid complex (Pd (CF$_3$COO)$_2$) used in this embodiment contains carbonic acid including fluorine atom as the ligand and easily forms a uniform amorphous film because of a small force between molecules. Moreover, since a small amount of organic element is contained, the precipitated film easily forms a dense and low resistance film. As a result, the disconnected and half-disconnected upper wiring can be connected with a low resistance. In addition, the palladium trifluoroacetic acid complex can be obtained by dissolving it into an organic solvent such as acetonitrile, toluene or alcohol and a small amount of this complex can be supplied (coated) from the metal complex supplying section 240 having a microridge or capillary.

Next, the end point area 135 of the disconnected point 130 or half-disconnected point 131 of the upper wiring 120 which is not processed into the approximately tapered shape will be described for comparison purposes. Namely, when the organic solvent 132 is supplied in very small amount to the disconnected point 130 or half-disconnected point 131 from the microridge or capillary after this organic solvent is set to 70 to 80 wt % to make very lower the viscosity and content of metal is also set lower (for example, acetonitrile solution including 20 to 30 wt % of the palladium trifluoroacetic acid complex) in order to make it easier to supply a small amount (about 1×10$^{-12}$ l) of organic solvent 132 from the metal complex supplying section 240 having the microridge or capillary of which end point diameter is reduced to 1 µm to 2 µm, spreading of the organic solvent solution 132 becomes about 10 times the thickness H1 thereof as shown in FIGS. 24(a), 24(b). However, for example, in the TFT substrate, the picture element electrode 124 is provided adjacently, keeping a separation distance of about 20 µm, to the upper wiring (Al wiring) 120 in the width of about 10 µm and thickness of 0.2 to 0.3 µm as shown in FIG. 18(a). Therefore, spreading R of the organic solvent solution must be kept within about 40 µm in order to be separated from the picture element electrode 124 and thin film transistor 123. As described, when spreading R of the organic solvent solution 132 is kept within about 40 µm, it has the thickness H1 of about 1 µm. Here, it has been confirmed that when the area having the width of 40 µm or less and length of about 40 µm of the organic solvent solution 132 is irradiated with the argon laser beam, a metal thin film 133 of palladium precipitated by the thermal decomposition reaction is formed as shown in FIGS. 24(c)–24(e), the thickness Hm of the metal thin film 133 becomes as thin as about 0.1 µm in comparison with the thickness Ht of the upper wiring 120 of 0.2 µm to 0.3 µm and the metal thin film 133 is broken or nearly broken, that is, to have the resistance of 100 kΩ or higher to several M Ω at the edge area of the disconnected point of the drain line 120 as shown in the enlarged view in FIG. 24(e). In other words, detail observation to the boundary between the upper wiring (Al wiring) 120 and metal thin film such as Pd 133 with a microscope has proved that this area is in the broken or nearly broken condition because the metal thin film 133 such as Pd is very thin or the metal thin film is not sufficiently precipitated in this area.

However, as is indicated in the embodiment explained above with respect to FIGS. 20(c), 20(d), when an approximately tapered shape 136 is formed at the end point area 135 of the upper wiring 120 at the disconnected point 130 or half-disconnected point 131, the coated metal complex solution (organic solvent solution) 132 is irradiated with an uniform intensity of the argon laser beam and thereby a metal thin film 138 is uniformly precipitated by the thermal decomposition reaction to connect the upper wiring with a contact resistance of about 20 Ω to 30 Ω as shown in FIG.

23. Namely, the broken or nearly broken condition as shown in FIG. 24(e) cannot be observed.

Next, the metal complex coated film 132 at the area not irradiated with the argon laser beam is also heated in a little wider area by the heat conduction but is not sufficiently heated to realize the thermal decomposition reaction of the metal complex and the metal complex coated film of such area maintains the non-conductive condition. However, even when the area not heated to realize the thermal decomposition reaction is heated up to the temperature as low as room temperature, it is convincible that such area may be in contact with the picture element electrode 124 after a long period of use because the reaction of decomposition of metal complex to precipitation of metal gradually proceeds. Therefore, such area must be removed as required. For removal of such area, the solvent of acetonitrile, toluene, alcohol which are solution of metal complex is sufficient.

On the occasion of precipitating metals utilizing compositions which can precipitate conductive substances only under a comparatively higher temperature, in Japanese Patent Application Laid-Open No. Hei 2-19838 (1990) discloses, for example, an organic solvent solution including an organic metal compound such as manganese nitrate and ruthenium and Japanese Patent Application Laid-Open No. 59-177858 (1984) discloses, for example, an organic solvent solution including an organic metal such as bisbenzene chromium and bisbenzene molybdenum. Since a degree of dissolution for an organic solvent of the metal compound explained above is rather small, only an extremely thinner precipitate (metal thin film) generated through thermal decomposition reaction by irradiation of a laser beam can be obtained; and a precipitate is often a metal oxide, for example, manganese dioxide, ruthenium oxide, chromium dioxide and molybdenum dioxide and such a thin film is composed of aggregated particles of a metal oxide in accordance with such disclosure. Since a thin film consisting of such organization and constitution shows an extremely high resistance in comparison with the intrinsic wiring material to be repaired, for example, a thin film of aluminum, it is apparent that such a thin film cannot be suitably applied for repair of a disconnected point of a low resistance fine wiring in a liquid crystal display unit, which is a typical application object of the present invention.

metal hydroxide, followed by deposition thereof after sedimentation. Therefore, it can be concluded that it is not possible for the method of the aforementioned disclosure to form a pure copper thin film and nickel thin film which is required for repair of wirings in the liquid crystal display unit which is a suitable application object of the present invention.

When a plurality of TFTs connected with wirings of the liquid crystal display unit are to be driven, if a metal thin film used for repair of a disconnected point has a high resistance value, a signal current flowing through the wiring including the point to be repaired becomes smaller than the signal current flowing through the adjacent wirings. Therefore, the TFTs connected to the wiring can no longer be kept within a sufficient operating condition. Thereby, the liquid crystal cannot sufficiently be oriented and sufficient display characteristic cannot be realized in comparison with TFTs connected to the adjacent wirings, resulting in a fatal disadvantage, so-called nonuniformity in display (nonuniformity in coloration) for the liquid crystal display unit.

When using palladium trifluoroacetic acid [$Pd(CF_3COO)_2$ complex] in accordance with the present invention as described above, since carboxylic acid including fluorine atoms is used as the ligand and a degree of dissolution for organic solvent is large, a precipitated film has a large density and a thick film having a low resistance can be formed easily, and a palladium salt such as $PdCl_2$ shows a small degree of dissolution for organic solvent and can easily form palladium oxide like a material described in the aforementioned disclosure of Japanese Patent Application Laid-Open Nos. Hei 2-19838 and Sho 59-17735B. Further, since an inter-molecule force is small, when the complex solution is coated and then dried up, a uniform film can be formed and this film easily converted to a metal film when heated.

Table 1 shows the results of the degree dissolution of palladium compound based upon dissolution when a solvent of 100 ml is added to the palladium compound of 20 mg.

TABLE 1

| Compound | Solvent | | | | | |
|---|---|---|---|---|---|---|
| | Water | Ethanol | Acetone | Acetontrile | Tetrahydro-furan | Dimethyl sulfoxide |
| $PdCl_2$ | × | × | × | × | × | × (Reaction) |
| $Na_2PdCL_4$ | ○ | Δ | × (Reaction) | × (Reaction) | × | Δ |
| $Pd(NO_3)_2$ | Δ | × | Δ | × | × | × |
| $Pd(CH_3COO)_2$ | × | × | × | × | × | Δ |
| $Pd(CF_3COO)_2$ | ○ | ○ | ○ | ○ | ○ | ○ |
| $PdCl_2(CH_3CN)_2$ | × | × | × | × | × | × |

Moreover, in the case of forming a metal thin film by utilizing chemical reaction (plating method) in the sequence of solution including metal ions→reduction by a reducing agent→precipitation of a metal material, disclosed in Japanese Patent Application Laid-Open No. Hei 2-101188 (1990), a copper plating solution consisting of copper sulfate or ethylenediamine sodium tetraacetate or nickel plating solution consisting of nickel sulfate or sodium citrate, for example, is used as the ordinary plating solution, but these solutions have a higher pH value (=12) to easily generate a The results shown in Table 1 can also be observed when palladium pentafluoropionic acid is used and moreover similar results can also be obtained when a material other than palladium, for example, gold and platinum is used as the metal. It is also possible, in addition, to use hexamethylene diamine di-gold or dimethyl bromide gold as a gold-based material, while iodotrimethyl platinum or bis(1, 5-cyclooctadiene) platinum can be used as a platinum-based material.

As a result of observation with an optical microscope or an electronic microscope, it has been proven that a precipitated metal thin film 138 of Pd is a continuous film of a metal such as Pd and is not an aggregation of metal particles. Therefore, such metal thin film can connect the disconnected point 130 or half-disconnected point 131 with a low resistance as shown in FIG. 22.

After the disconnected point 130 or half-disconnected point 131 is repaired by connection with the metal thin film 138 such as Pd, a protection film (SiN) 127 is formed by the CVD process for the TFT part including at least the upper wiring 120 as shown in FIG. 21(e). Thereby, the TFT substrate 220 having repaired the disconnected point 130 or half-disconnected point 131 of the upper wiring 120 can be obtained.

In this embodiment, as the metal complex, the palladium trifluoroacetic acid $(Pd(CF_3COO)_2)$ complex has been described, but similar effect has been obtained using palladium complex of carbonic acid including fluorine atom such as palladium pentafluoropropionic acid $(Pd(CF_3CF_2COO)_2)$ complex. Moreover, aluminum wiring is described in the present invention as the wiring material, but similar effect can also be obtained even when another metal wiring such as chromium and molybdenum is used.

A method of repairing a disconnected Cu circuit pattern of a printed circuit board is described in Japanese Patent Application Laid-Open No. Hei 2-101188. In this method, after an end part of a wiring is processed to provide an inclination, the region including such inclined part is placed in contact with plating solution to precipitate a metal thin film. However, since the plating solution is an intensive acidic solution, not only a metal (wiring) itself placed in contact with the plating solution is dissolved, but an oxide or a precipitate of its hydroxide is deposited on the surface. These elements are electrically nonconductive. Therefore, even if a metal film can be formed on the processed end part of the wiring, it is so far not possible to assure a good connecting condition (a resistance of the precipitated metal thin film including a contact resistance between the end part of the wiring and the metal precipitated by the plating is low). Moreover, impurities included in the plating solution contaminate the processed surface before precipitation of a metal to cause disadvantages.

Therefore, at the time of repairing the disconnected point of the wiring, when a resistance value of such point determines the display characteristic itself of a liquid crystal display, it can be concluded that it is extremely difficult for the aforementioned disclosure to assume that the intrinsic function can be satisfied only when not only a thin metal film is precipitated at the end part of the wiring but a satisfactory low contact resistance condition can be realized.

The present invention has overcome, the problem that a contact resistance between the end part of the wiring and the precipitated metal can be reduced, which cannot be realized with the aforementioned disclosures. Namely, a wiring pattern is formed through the process of formation of metal film→coating of resist→exposure→development→separation→cleaning→metal etching→cleaning, or repetition of this process and thereafter adequacy of the pattern is inspected. At this time, it is often observed that the disconnected part of the wiring shows bad close contactness between the metal film and the resist film due to a disadvantage (contamination, etc) during the process and the pattern which should intrinsically remain is also often removed due to diffusion thereto of the etching solution. Accordingly, the disconnected point may often be already contaminated or oxidized and it is no longer possible to assure a good connecting condition even when a metal is precipitated thereto. Therefore, first, the end part (disconnected part) of the wiring is irradiated with the YAG laser to remove contamination or an oxide film at the wiring surface and this process is executed under the atmosphere of inactive gas or reducing gas to prevent additional oxidation of the surface. Thereafter, a palladium film is precipitated by irradiation of the Ar laser after coating of the palladium complex solution. This process should be executed under the atmosphere of inactive gas or reducing gas to avoid unwanted oxidation of metal during the precipitation of a palladium film.

As explained above, the present invention allows additional formation of a pure metal film on the clean surface of the wiring by executing a series of processes including the process for the end part of the wiring and the formation of a metal thin film, under the atmosphere of inactive gas or reducing gas. During this process, since a contact resistance between the end part of the wiring and the precipitated metal thin film can be extremely reduced, there is no difference between the signal currents flowing into the wiring including the repaired point and the adjacent normal wiring and therefore generation of disadvantage so-called "nonuniformity in display" as disclosed above can be eliminated.

A method for preventing the broken or nearly broken condition of the metal thin film and also preventing contact thereof with the adjacently provided picture element electrode 124 as shown in FIGS. 24(c)–24(e) without forming the approximately tapered shape 136 at the end point area 135 of the upper wiring 120 at the disconnected point 130 or half-disconnected point 131 will be explained. Namely, even when a reduction rate k is to 10, the thickness Hm of the metal thin film 138 of Pd precipitated at the disconnected point 130 or half-disconnected point 131 can be set almost equal to or thicker than the thickness Ht=0.2 to 0.3 $\mu$m of the upper wiring 120 by making large (2 $\mu$m to 3 $\mu$m) the thickness H1 of the metal complex solution (organic solvent solution) 132 for spreading R (40 $\mu$m or less) of the metal complex solution 132 through increase of viscosity of the metal complex solution (organic solvent solution) 132 supplied (coated) from the metal complex supplying section 240. Moreover, the reduction rate k can be lower as low as 2 to 3 by increasing the content of the metal such as Pd included in the metal complex solution (organic solvent solution) 132 supplied (coated) from the metal complex supplying section 240. As a result, even when thickness H1 of the metal complex solution (organic solvent solution) 132 is as small as about 1 $\mu$m for the spreading R (40 $\mu$m or less) of the metal complex solution (organic solvent solution), the reduction rate k can be set to 2 to 3. Accordingly, the thickness Hm of the metal thin film 138 such as Pd precipitated at the disconnected point 130 or half-disconnected point 131 can be set equal to or thicker than the thickness Ht=0.2 to 0.3 $\mu$m of the upper wiring 120. When the thickness Hm of the metal thin film 138 such as Pd precipitated at the disconnected point 130 or half-disconnected point 131 can be set equal to or thicker than the thickness Ht=0.2 to 0.3 $\mu$m of the upper wiring 120, the broken or nearly broken condition of the metal thin film can be prevented as shown in FIG. 24(c) and a contact resistance is set to 20 $\Omega$ to 30 $\Omega$ as shown in FIG. 23 to repair (connect) the disconnected or half-disconnected point of the upper wiring 120.

However, as explained above, a small amount (about $1 \times 10^{-12}$ l) of metal complex solution (organic solvent solution) 132 of which viscosity is enhanced or content of metal such as Pd is increased must be supplied (coated) from the metal complex supplying section 240 having a microridge or capillary. That is, it is sufficient when a small amount (about $1 \times 10^{-12}$ l) of metal complex solution obtained by dissolving the metal complex (50 to 70 wt %) such as palladium trifluoroacetic acid complex into an organic solvent (30 to 50 wt %) such as acetonitrile, toluene and alcohol can be supplied (coated) from the metal complex supplying section 240 having the microcylinder or capillary. For this purpose, as shown in FIG. 19, for example, an electromagnetic coil 242 connected with a power supply 246 is provided around the capillary and a small amount of metal complex solution (organic solvent solution) 132 of which viscosity or metal content is increased can be supplied depending on a magnetic force by controlling a current of the electromagnetic coil 242 with the supply section control apparatus 245 via the power supply 246. Moreover, a small amount of metal complex solution (organic solvent solution) 132 of which viscosity or metal contact is increased can be supplied with a charging force by providing a grounded internal electrode 244 in the capillary and a lead electrode 243 connected to the power supply 246 at the periphery of the end part and by applying a voltage between the internal electrode 244 and the lead electrode 243 to control this voltage with the supplying section control apparatus 245 via the power supply 246. The supplying section control apparatus 245 is connected with the control device 214 to control the amount of the metal complex solution (organic solvent solution) 132 supplied from the metal complex supplying section 240 in accordance with an instruction from the control device 214.

As a method to supply a small amount (about $1 \times 10^{-12}$ l) of metal complex solution (organic solvent solution) 132, it has also been proposed that the end point of an ultra-fine needle or a rod type stick (end point diameter φ is about 10 μm) is coated with the metal complex solution and such metal complex is transferred to the disconnected point of wiring to be repaired. The same amount of solution as that when the microridge or capillary is used as explained above can also be supplied by adjusting viscosity or amount of the metal complex solution. (Note: As an ultra-fine needle, a microprobe (made of tungsten with the end point diameter φ of about 0.1 μm) as used in an electron microscope can be applied, as described in Micromanipulation under electronic microscope realizing three-dimensional observation by Yotaro Hatamura, Proceedings of Japan Society of Robots, Vol. 8, No. 4 (1990), pp. 110 to 113).

As described above, after formation of the lower wiring (gate wiring) 121 and a lower electrode (gate electrode), formation of a thin film transistor section (TFT section) consisting of insulating films 125, 126 and a semiconductor film 123, formation of picture element electrode 124 and formation of the upper wiring (drain wiring: data wiring) 120 and upper electrode (source electrode 122, drain electrode) on a glass substrate 220 as shown in FIGS. 18(a) and 18(b), wirings are electrically tested to check continuation thereof using, for example, an electric tester or a curve tracer. In this case, if a resistance shows an abnormally higher value in comparison with an ordinary resistance value, such defective point is confirmed with a microscope or a pattern testing device. Moreover, a metal thin film 138 is formed on such defective point with the method explained above. Thereby a disconnected point 130 or half-disconnected point 131 can be connected (repaired). Thereafter, the continuity test is performed again electrically to the connected wiring. The TFT substrate which has shown the predetermined wiring resistance is sent to the next step, namely to the CVD process where a protection film (for example, SiN film) 127 is formed on the TFT element. Thereby, the TFT substrate 220 not including disconnected or half-disconnected wirings can be obtained.

However, it is also permitted to perform the continuity test of wirings after formation of the protection film 127 in view of avoiding an inconvenience of continuity test of wirings, for example, deterioration of characteristics due to contamination of surface of the TFT element. In this case, repair of the wirings is performed in the following manner. That is, the method for repairing the disconnected point 130 or half-disconnected point 131 of the upper wiring 120 after covering the TFT section and upper wiring 120 of TFT substrate with the protection film (SiN) 127 in the CVD process will then be explained with reference to FIGS. 25(a)–25(h). As in the case of repairing the wiring before covering by the protection film (SiN) 127, the disconnected point 130 or half-disconnected point 131 of the upper wiring 120 is detected by a continuity test or visual inspection across the upper wiring (drain wiring) 120 and lower wiring (gate wiring) 121 or to the upper wiring (drain wiring) 120, although these are not illustrated. Next, the approximate coordinate (picture element position) data and data indicating the type of disconnection are stored in a disc, etc. When this disc information is applied to the input arrangement 213, the stage 210 is moved under the control of the control device 214 and thereby the disconnected point 130 or half-disconnected point 131 is almost located at the position on the laser beam axis. Further, the control device 214 executes fine adjustment of stage 210 depending on the image signal picked up by the TV camera 211 for accurately locating the disconnected point 130 or half-disconnected point 131 of the upper wiring 120. Moreover, the laser beam flux used for irradiation is adjusted with the variable aperture 215. Here, the control device 214 can automatically control the variable aperture 215 depending on the image of variable aperture 215 and the image of the surface of the TFT substrate picked up by the TV camera 211.

As shown in FIGS. 25(a), 25(b), the area near the disconnected point 130 or half-disconnected point 131 of the upper wiring 120 in the accurately positioned TFT substrate 220 is irradiated with an excimer laser beam flux 251 which is condensed, for example, narrower than the width of the upper wiring with the condenser lens 290 from the excimer laser beam (wavelength: 248 nm or 193 nm) emitted from an excimer laser source 248 by changeover of the mirror 249 with the scanning (scanning is unnecessary when the aperture is projected simultaneously) through rotation of the galvano mirror (not illustrated) or movement of the table or stage 210 to form a recess 152 by partially removing the SiN protection film 127 having the thickness of about 0.6 μm. The region (recess) 152 to be removed is restricted by the variable aperture 215 or amount of scanning. When the width of the upper wiring is about 10 μm and the space of the upper wiring 120 is about 120 μm, it is preferable to remove the region in such a length as to sufficiently expose the end point area 135 of the wiring in the width of about 120 μm. In this case, the irradiation condition of the excimer laser is adjusted so that the wiring itself is not damaged by the excimer laser beam flux 251. According to an experiment by the inventors of the present invention, only the SiN protection film on the upper wiring can be removed by vaporization leaving the wiring through repeated irradiation up to several tens of times of the excimer laser in the output of 0.1 to 10 J/cm$^2$ and a pulse width of several tens to several hundreds ns for removal of the SiN film in the thickness of about 1 μm. However, since the actual SiN protection film has the thickness of about 0.6 μm, the irradiation condition of the excimer laser beam must be lowered. Thereafter, the approximately tapered shape 136 may be formed in a manner similar to FIG. 20(c) to the end point area of the disconnected point 130 or half-disconnected point 131 of the upper wiring, as shown in FIGS. 25(c), 25(d).

After a content of metal such as Pd included in a metal complex solution (organic solvent solution) supplied (coated) from the metal complex supplying section 240 is increased, such a small amount (about $0.6 \times 10^{-12}$ l=about 600 $\mu m^3$) of solution so as not to overflow from the recess 152 is supplied as shown FIGS. 25(e), 25(f). In this case, the coating film of the metal complex solution 132 is subjected to natural drying or a pre-annealing process (baking process) for 0.5 to 1 hour at the temperature of about 50° C. to become a film layer. That is, since a film of the metal complex solution 132 does not overflow from the recess 152, if a metal thin film 154 such as Pd is precipitated, it does not give any influence on the picture element electrode 124 even when the adjacent picture element electrode 124 is not covered with the protection film (SiN) 127.

The film of metal complex solution 132 embedded in the recess 152 in the accurately positioned TFT substrate 220 is irradiated with a condensed argon laser beam 241 which is condensed with the condenser lens 290 from the argon laser beam 241 emitted from the argon laser source 260 with the scanning through rotation of the galvano mirror (not illustrated) or movement of the table or stage 210, while an inactive gas or reducing gas is injected thereto from the nozzle 270a, so that a metal thin film 154 of Pd is continuously precipitated, as shown in FIGS. 25(g), 25(h), by the thermal decomposition reaction in the thickness Hm of about 0.2 to 0.3 $\mu$m between the end points 135 of the disconnected point 130 or half-disconnected point 131 covering the end point area 135 of the upper wiring 120 in the length of 2 $\mu$m or longer to electrically connect the disconnected or half-disconnected upper wiring 120. In this case, the projected condensed laser beam flux can be adjusted and controlled by controlling the variable aperture 215 manually or with the control device 214. An output of the argon laser beam is determined considering amount of coating of the metal complex solution 132 or irradiation area, but in the embodiment of the present invention, the argon laser beam 241 emitted from the argon laser source 260 is reduced and projected using a condenser lens 290 of 40 times and the metal complex solution 132 is irradiated continuously for several seconds to several tens of seconds. Irradiation intensity of the argon laser beam is set to about $1 \times 10^4$ w/cm$^2$ on the substrate surface. In this case, any kind of laser source or heat source other than the argon laser beam may be used so long as the metal complex solution 132 precipitates easily a metal. Particularly, in the case of the present embodiment, since the thickness Hm of the metal thin film 154 precipitated is set as small as about 0.2 to 0.3 $\mu$m which is equivalent to or larger than the thickness Ht=0.2 to 0.3 $\mu$m of the upper wiring 120, a disconnected point can be connected (repaired) keeping the contact resistance in the range from about 20 $\Omega$ to 30 $\Omega$ as shown in FIG. 23 without generation of the broken or nearly broken condition of the metal thin film 154. The disconnected point 130 including the metal film 154 described above is covered, as required, using an adequate protection material, for example, an acrylic-based resin or epoxy-based resin which results in the upper surface being identical to the protection film 127 (not shown).

Thereafter, the continuity test is performed for the wiring including the repaired point to confirm the desired wiring resistance. Next, an organic material such as polyimide is implanted to the area from which the SiN is removed and it is then hardened by the baking process. The surface of SiN film 127 is flattened. Finally, the TFT substrate is then transferred to the liquid crystal sealing process. The excimer laser for removing the SiN film may be replaced by YAG laser (wavelength: 266 nm). Moreover, the SiN film can also be removed using a focused ion beam irradiated from a high luminance ion source such as a liquid metal ion source.

In above embodiment, a metal thin film of Pd is precipitated from the metal complex solution by the thermal decomposition reaction through irradiation of laser beam, but it is also possible that a CVD material gas (metal carbonyl such as $Cr(CO)_6$, $W(CO)_6$, $Ni(CO)_4$, a halogen compound such as $MoF_6$, $WF_6$, an alkyl compound such as $Al(CH_3)_3$, $Cd(CH_3)_2$) is supplied to the disconnected point 130 or the half-disconnected point 131 from a nozzle as in the case of inactive gas or reducing gas supplying section 270 and then this point is irradiated with a focused laser beam with scanning to precipitate a metal thin film of Al to connect the disconnected or half-disconnected upper wiring. The desired film thickness can be obtained by controlling the irradiation time of the focused laser beam, that is, the energy or dose of the focused laser beam.

The embodiment described above refers to repair of the disconnected or half-disconnected point of the upper layer wiring (upper wiring) 120 of the TFT substrate 220 and can also be applied to repair of the disconnected or half-disconnected point in the wiring pattern of a printed wiring substrate or multilayer wiring substrate. However, in the printed wiring substrate or multilayer wiring substrate, since a density of wirings is high because the width of the wiring pattern is about 10 $\mu$m or less and the space (interval) between the wiring patterns is about 20 $\mu$m or less and moreover, the thickness becomes 0.3 $\mu$m to 1.0 $\mu$m which is thicker than the upper wiring, it is required in some cases to remove an extra amount of the metal thin film which has rushed out from the wiring pattern and is precipitated in a large amount by the thermal decomposition reaction from the metal complex solution 132 through irradiation of the laser beam.

The present invention provides the effect that the disconnected or half-disconnected point of wiring can be repaired with a low resistance and higher reliability without giving any adverse effect on the peripheral area by irradiating the metal complex solution supplied to the disconnected or half-disconnected point of the wiring of the TFT substrate, printed wiring substrate or multilayer thin film substrate used for the liquid crystal display device with a laser beam to precipitate a metal thin film through thermal decomposition reaction.

The present invention also provides the effect that a disconnected or half-disconnected signal wiring in the TFT substrate used particularly in the liquid crystal display device is repaired with a low resistance and higher reliability without giving an influence on the adjacently located picture element electrode and resulting in any change in brightness of display so that the TFT substrate can recover the worth as a product by eliminating a fatal defect such as a line fault due to disconnection of signal lines. That is, the present invention can improve the yield of the TFT substrate in view of saving the resources and reducing product cost.

The present invention is also directed to the correction of a disconnected portion of a wiring on an electronic circuit substrate which disconnected portion is relatively small and often results from the presence of a foreign particle.

As the liquid material supplied to the disconnected portion to enable connection, a solution is used which is obtained by dissolving palladium trifluoroacetic acid complex ($Pd(CF_3COO)_2$) in a combined liquid of an organic solvent of acetonitrile and N-methyl-2-pyrrolidone at a ratio of 35:32.5:32.5 in weight ratio. Also, for locally supplying this palladium complex solution on a substrate, a micropipet made of hard glass is used, whose tip has been formed into 1 to 2 $\mu$m in inside diameter by heat treatment. Then, this pipet is filled with about 1 $\mu$l of the solution with a microsyringe to bring the tip of the pipet into contact with the surface of the electronic circuit substrate, and applying only 0.05 s of nitrogen gas into the pipet at a supply pressure of, for example, 100 KPa for thus discharging a very small amount of the above-described solution through the tip of the pipet.

Figure 26A:
FIGS. 26(a)–26(j) show a process for showing correcting a small disconnection defect according to the present invention.
Figure 26C:
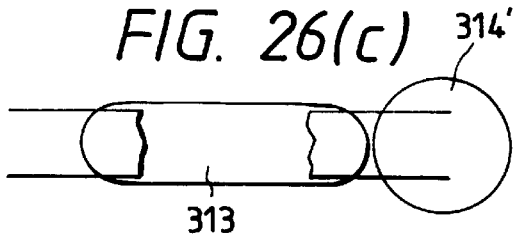
Figure 26B:
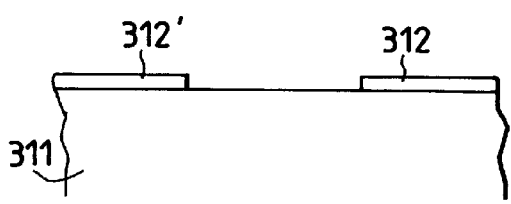
Figure 26D:
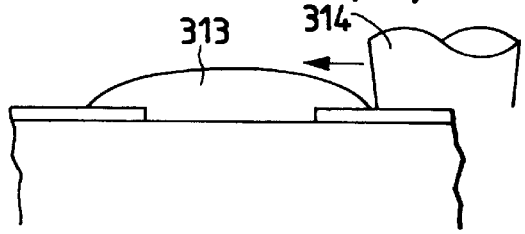

FIGS. 26(a) and 26(b) show in plan view and cross-sectional view state of a disconnection defect in a circuit wiring occurring in a manufacturing process of a TFT substrate for a liquid crystal display, wherein the formed wiring has a width of 15 $\mu$m, and a thickness of 2000 Å and is made of Al on an SiN insulating film 311, and a wiring pattern lacks about 50 $\mu$m between end portions 312 and 312' of the wiring, causing a disconnection defect. The tip of the micropipet is brought into contact with this wiring disconnected portion to discharge the palladium complex solution through the pipet tip by using the above-described method so that only one drop of the solution adheres to the disconnected portion. According to the above-described method, it is possible to supply it with high accuracy by suppressing the wet-spread diameter of the palladium complex solution on the SiN insulating film to 10 to 15 $\mu$m (as a supply amount, 100 fl=$10^{-7}$ $\mu$l). This operation is repeated to supply the palladium complex solution 313 to the wiring disconnected portion in such a shape as shown in FIGS. 26(c) and 26(d).

Figure 26E:
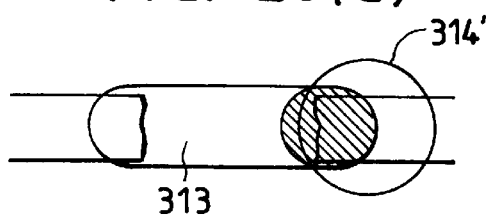
Figure 26G:
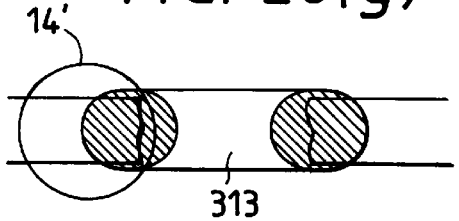
Figure 26F:
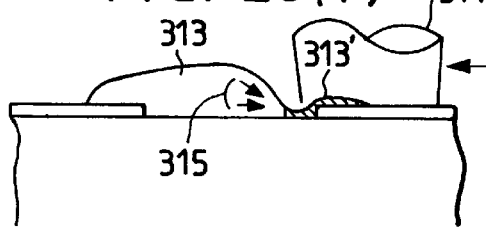

Thereafter, an Ar laser light 314, which has been formed into a size at least larger than the supply width of the palladium complex solution 313, is irradiated onto a laser irradiation region 314' on the wiring, as shown in FIG. 26(c). In the present embodiment, the irradiation size (laser irradiation region 314') of the Ar laser was set to 30 $\mu$m in diameter and the laser irradiation power to 4.0 to 10.0 KW/cm$^2$. While moving the Ar laser light 314 at a speed of 30 to 60 $\mu$m/min for scanning on the wiring, it is brought close to the disconnected end portion 312 to heat the palladium complex solution 313 on one disconnected end portion 312 and in its vicinity. The materials used as the wiring in the electronic circuit substrate including Al have generally high thermal conductivity, and therefore, the temperature at the disconnected end portion 312 rises due to conductive heat caused by the irradiation of the laser light 314. Thus, the organic solvent of the palladium complex solution 313 evaporates, and further the complex is decomposed to precipitate a palladium film 313' near the disconnected end portion 312 as shown in FIGS. 26(e) and 26(f) so that the connection between the disconnected end portion 312 and the precipitated palladium film 313' can be satisfactorily performed. That is, heating the disconnected end portion 312 provides a secured connecting capability between the end portion 312 and the precipitated palladium film 313'.

Figure 26H:
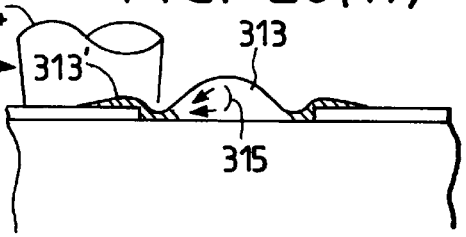
Figure 26I:
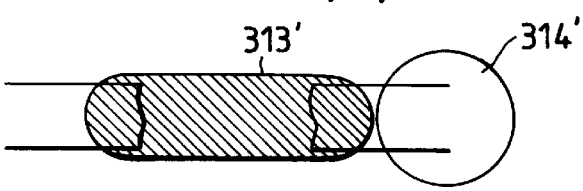
Figure 26J:
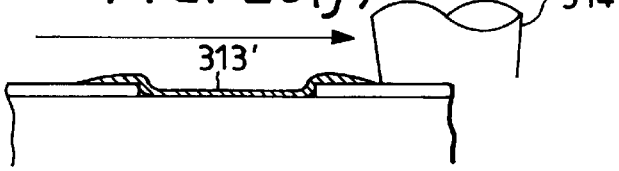

However, the volume ratio of pure metal contained in the solution 313 containing the palladium complex by 35% in weight ratio is only about 1% of the whole, and extremely great volume shrinkage occurs when the supplied solution 313 is heated to become a palladium film. For this reason, the palladium complex solution 313 before being heated flows to cause an influx 315 on the precipitated palladium film 313', which, however, does not affect the connecting capability at the disconnected end portion 312. At this point of time, after stopping the irradiation of the laser light 314 once, a palladium film 313' is caused to precipitate at the other disconnected end portion 312', as shown in FIGS. 26(g) and 26(h) by using the same procedure in FIGS. 26(e) and 26(f). Thereafter, the scanning direction of the laser light 314 is reversed so as to scan from the disconnected end portion 312' toward end portion 312 and the laser light 314 precipitates the palladium film 313' between the disconnected end portions 312 and 312', as shown in FIGS. 26(i) and 26(j).

In this way, without being affected by the flow of the palladium complex solution 313 near the disconnected end portions 312 and 312', it is possible to secure the connecting capability between the palladium film 313' and the ends 312 and 312', and also to uniformize the film thickness distribution of the palladium film 313' between the ends 312 and 312', resulting in highly reliable correction of disconnection, it being noted that the thickness of the palladium film on the ends 312 and 312' is greater than the thickness of the film between such ends.

Thereafter, while further spraying an inactive gas such as nitrogen to the wiring joints through a nozzle (not shown), an Ar laser light is irradiated to the palladium film again for annealing. At this time, the laser irradiation size, the intensity and the scanning rate may be the same as those when the palladium film was caused to precipitate. The laser irradiation method is to start scanning with one side of the precipitated palladium film, and to irradiate the entire precipitated film with a laser light successively. This irradiation for annealing re-heats a portion of the complex where it has been insufficiently decomposed to complete the precipitation of the palladium, and at the same time, to reduce the oxidized palladium film 313', thereby improving the electric characteristics of the precipitated palladium film.

By using the above-described method, a good palladium film having an average film thickness of 250 to 350 Å and a resistivity of 100 to 200 $\mu\Omega$·cm is precipitated, thereby making it possible to electrically connect the disconnected portions with a connected resistance of 100 to 200 $\Omega$ satisfactorily.

In this respect, concerning the liquid material supplied to the wiring disconnected portion, while the palladium to trifluoroacetic acid solution has been described as an example so far, the present invention is not restricted thereto, but as other materials, there can be used metal complex solution obtained by dissolving metal complex such as Au and Pt including palladium pentafluoropropionic acid complex in organic solvent such as acetonitrile, N-methyl-2-pyrrolidone, toluene, xylene and alcohol. For heating the liquid material supplied to the wiring disconnected portion, in addition to Ar laser light of a wavelength of 488 nm and 514.5 nm, there can be used a fundamental wave (1064 nm) of continuous excitation YAG laser, second higher harmonic (532 nm) and a $CO_2$ laser (10.6 $\mu$m). Further, regarding an inactive gas to be supplied at the irradiation for annealing, it is not restricted to only nitrogen, but an inactive gas such as argon, helium, xenon and neon can be applied.

Figure 19:
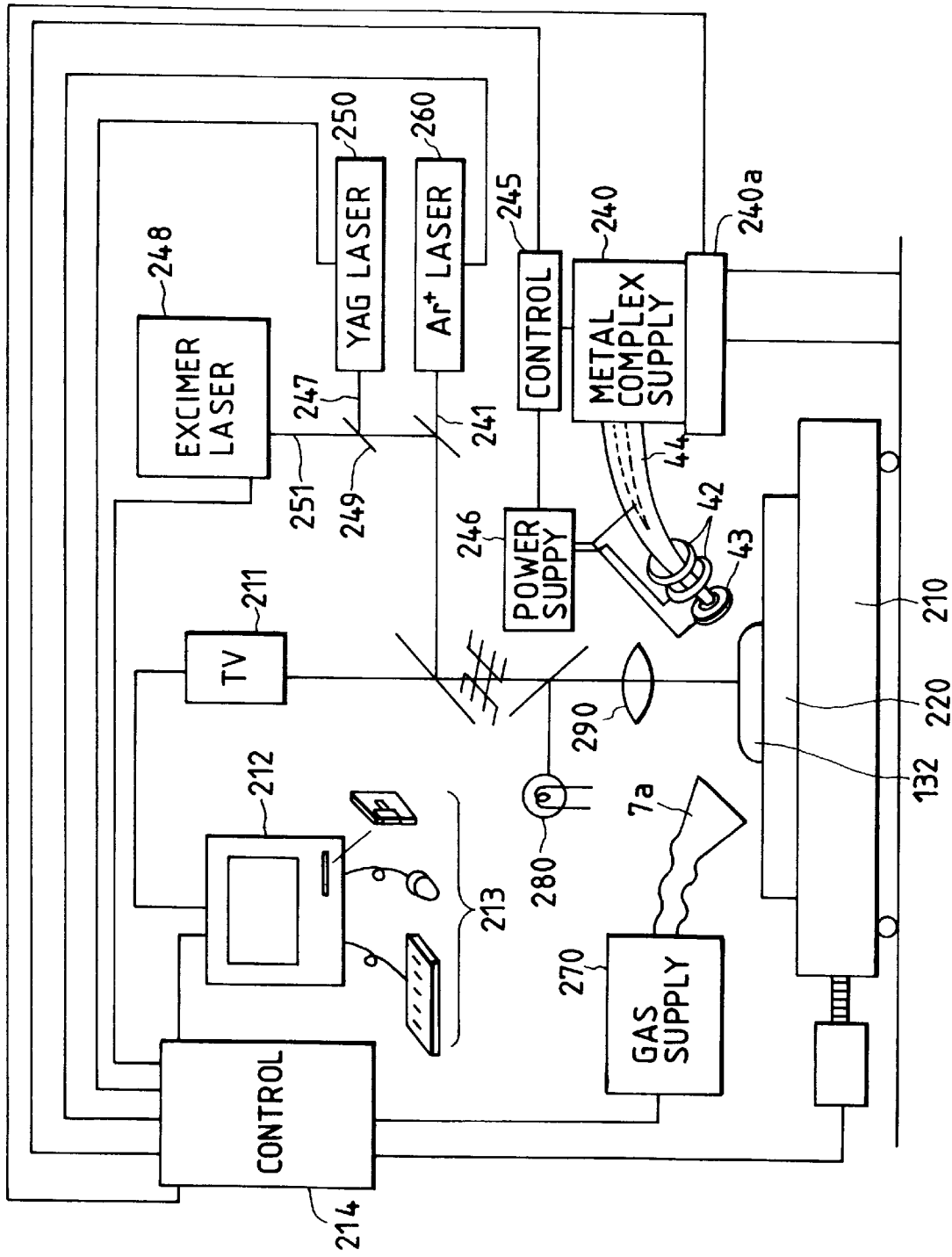
FIG. 19 shows apparatus for repairing a disconnected wiring of the present invention.
Figure 27:
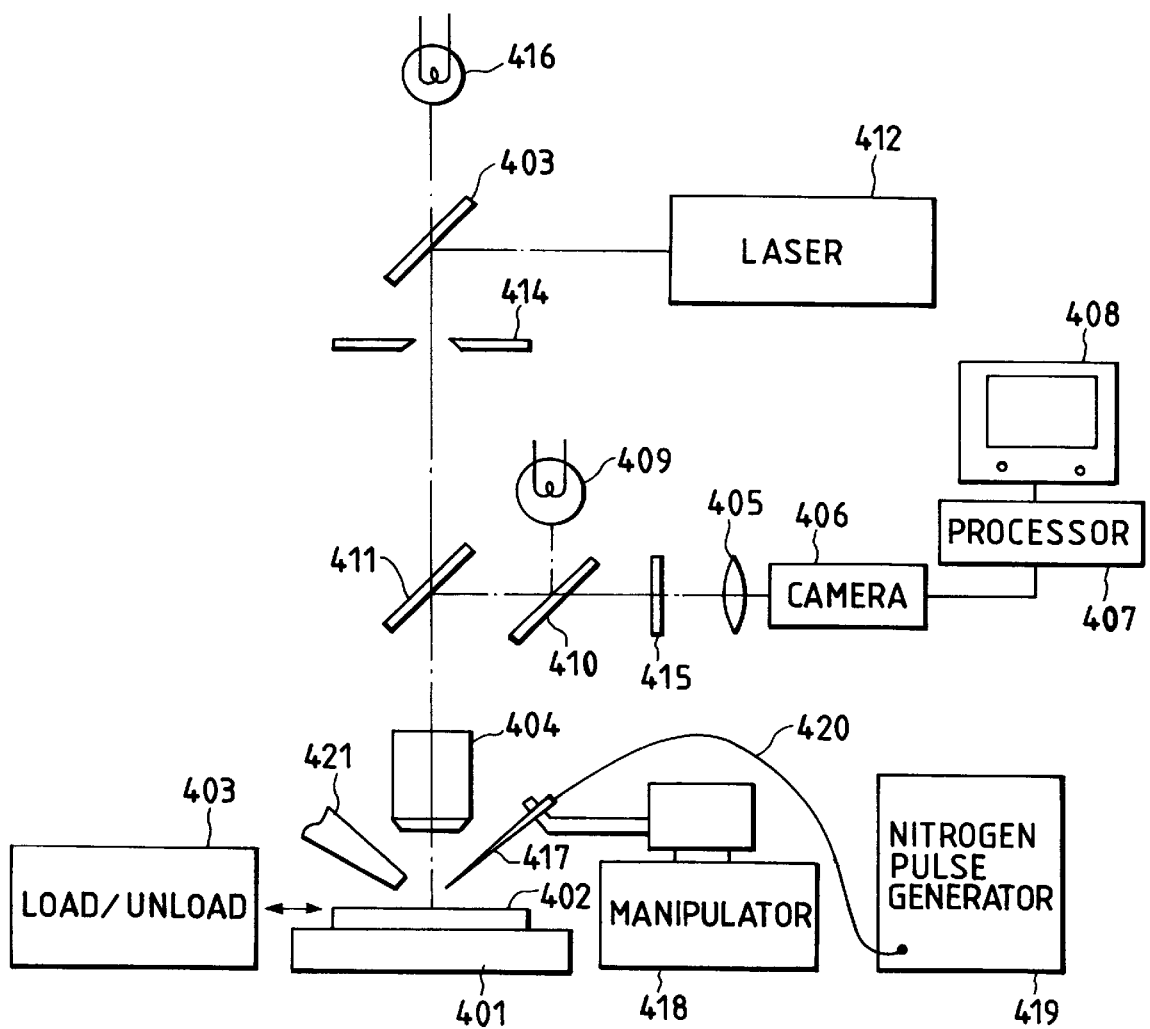
FIG. 27 shows an apparatus for implementing the process of FIGS. 26(a)–26(j) in accordance with the present invention.
Figure 28A:
FIGS. 28(a)–28(j) show a process for correcting a disconnection defect according to the prior art.
Figure 28B:
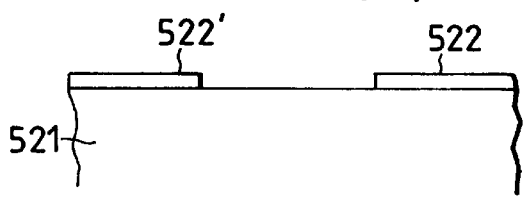
Figure 28C:
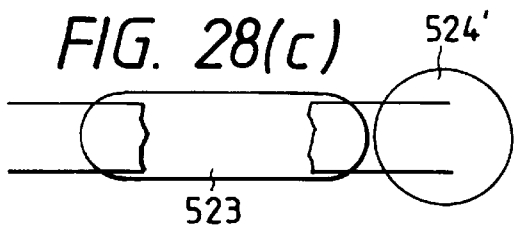
Figure 28D:
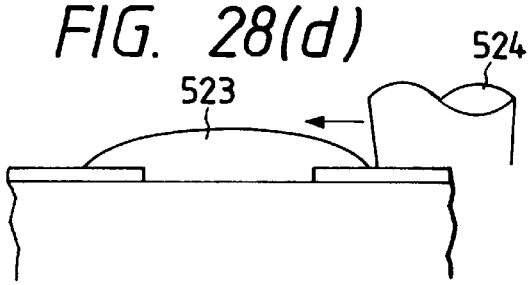
Figure 28E:
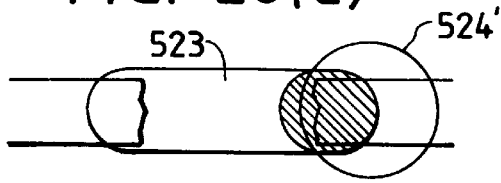
Figure 28F:
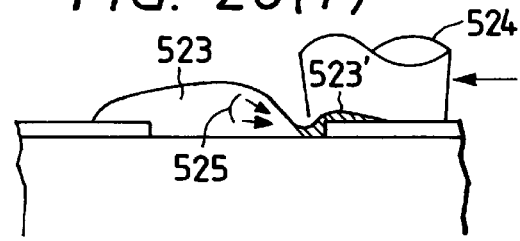
Figure 28G:
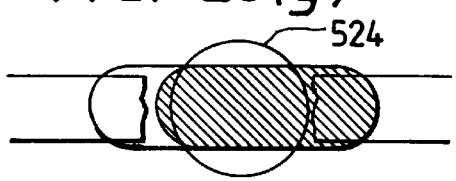
Figure 28H:
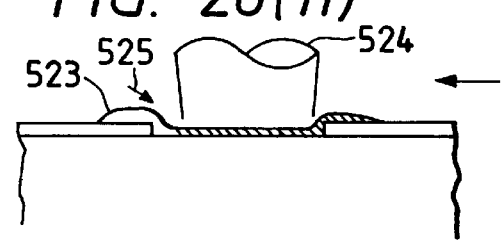
Figure 28I:
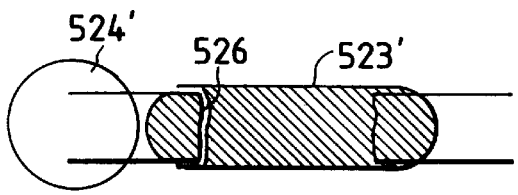
Figure 28J:
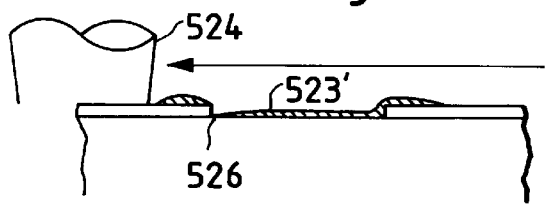

FIG. 27 shows an embodiment of an apparatus adapted to correct the disconnected wiring which is similar to the apparatus of FIG. 19 and comprises a stage 401 for carrying a TFT substrate 402 thereon for positioning the substrate; a loader/unloader 403 for loading the TFT substrate 402 on the stage 401, or for unloading the substrate from the stage 401; an objective lens 404, an imaging lens 405 and a CCD camera 406 for observing the surface of the TFT substrate 402; an image processing apparatus 407; a monitor 408; an illumination source 409; half mirrors 410, 411; an Ar laser oscillator 412; a laser reflection mirror 413; a slit 414 for forming the laser light into a desired shape and dimension; a laser cut filter 415 for preventing the incidence of the laser light into the CCD camera 406; a reference light source 416 for referring to the laser irradiation position on the monitor 408; a glass pipet 417 filled with liquid material for connecting the wiring; a manipulator 418 for holding the glass pipet 417 to position the pipet; nitrogen pulse generation equipment 419 for supplying nitrogen gas into the glass pipet 417 in a pulse fashion via Teflon tube 420; and a nozzle 421 for spraying inactive gas onto the Teflon tube 420 and the TFT substrate 402. In the objective lens 404, two types of lenses of 20-power and 100-power are mounted to a revolver (changeover mechanism) (not shown). The operations of the stage 401, the loader/unloader 403, the image processing apparatus 407, an Ar laser oscillator 412 and the revolver (not shown) for the objective lenses are controlled by a controller (not shown).

In the manufacturing process for TFT substrates, circuit characteristic inspection is first performed for all the products to select any substrates having a disconnection defect in their circuit wiring, which will be taken out from the process. The substrates thus taken out are housed in the loader/unloader 403 in a disconnection correcting apparatus in units of about 10 sheets, and at the same time, the inspection information (information on defective positions on each substrate) from an inspection device is inputted into the controller (not shown).

After carrying the TFT substrate 402 from the loader/unloader 403 on the stage 401, the controller (not shown) vertically moves the stage 401 to focus on the surface of the TFT substrate 402 by an auto-focus function of the image processing apparatus 407. Thereby, an image of the surface of the TFT substrate 402 is enlarged on the monitor 408 for observation. At this time, the observed magnification for the objective lens 404 is preferably 20× magnification, and the magnification on the monitor 408 is about 700× magnification.

Then, on the basis of the inspection information inputted in the controller (not shown), the stage 401 is moved to such a position that the disconnection defect appears within the field of the monitor 408. Thereafter, the operator performs fine adjustment of the stage 401 while observing the monitor 408, and drives the manipulator 418 to mate the tip of the pipet 417 with the field of the monitor 408. Further, the tip of the pipet 417 is brought into contact with the surface of the TFT substrate 402 to supply the nitrogen pulse into the pipet 417 through the trigger switch of the nitrogen pulse generation equipment 419. The liquid material is discharged through the tip of the pipet 417 to supply a very small amount thereof to the disconnected portion on the TFT substrate 402. In this way, by using the manipulator 418 and the nitrogen pulse generation equipment 419 while observing the monitor 408, the operator supplies the liquid material to the disconnected portion with high accuracy. Thereafter, the operator drives the manipulator 418 to retract the tip of the pipet 417 from the region of the stage 401.

The liquid material thus supplied is irradiated with a laser light. The controller (not shown) rotates the revolver (not shown) to set the magnification of the objective lens 404 to 100, and moves the stage 401 up and down to focus on the surface of the TFT substrate 402 by the auto-focus function of the image processing apparatus 407. Thereafter, the operator inputs the laser irradiation start and completion positions on the monitor 408 for starting laser irradiation.

The laser light is formed into a beam of 3 mm in diameter through the slit 414 to be incident on the objective lens 404, and as a result, it is projected on the TFT substrate 402 in a size of 30 µm in diameter. The output of the laser oscillator 412 is assumed to have been set in advance so that the power on the laser irradiated surface is 5 KW/cm$^2$. Also, with the start of laser irradiation, the laser is scanned relative to the TFT substrate 402 by moving the stage 401 at a rate of 30 µm/min. The above operation heats the liquid material supplied onto the TFT substrate 402 to precipitate a metal film on the disconnected portion in the manner described in connection with FIGS. 26(a)–26(j). Thereafter, on the basis of the information on the laser irradiation start and completion positions previously inputted on the screen of the monitor 408, the laser light is irradiated again under the same laser condition and under the same moving condition of the stage 401 for annealing. At this time, it is possible to reduce the oxidized, precipitated metal film by spraying nitrogen gas through the nozzle 421 onto the laser irradiated portion at 5 1/min. Thus, the correction of the wiring disconnected portion on the TFT substrate 402 is completed.

Finally, the TFT substrate 402 on the stage 401 is unloaded into the loader/unloader 402. When the correction for all the TFT substrates is completed by repeating the above-described operation, the corrected substrates are returned to the TFT manufacturing process again.

As described above, the present invention enables the connecting capability between the disconnected end portion and the precipitated metal film in the wiring disconnected portion to be improved, thus enhancing the reliability of the disconnected portion thus connected.

According to the present invention, since there is no need for any treatment such as forming a groove pattern in the ground film (insulating film) of the wiring in order to secure the connecting capability between the disconnected end portion and the precipitated metal film, the present invention does not require any ultraviolet laser for working the insulating film so that the defect can be corrected at low cost and that time required for the correction can be shortened.

According to the present invention, after locally supplying liquid material for correction of disconnection to the wiring disconnected portion on an electronic circuit substrate, a laser light is successively irradiated upon the both disconnected end portions to heat the liquid material on the disconnected end portions and in their vicinity, and also the laser light is scanned to precipitate a metal film between the disconnected end portions, whereby the connecting capability between the both disconnected end portions and the precipitated metal can be improved by uniformizing the film thickness distribution of the precipitated metal film between the disconnected end portions, thus providing the enhanced reliability of the joints.

Also, after locally supplying liquid material for correction of disconnection to the wiring disconnected portion on an electronic circuit substrate, a laser light, which has been formed into a size at least larger than the supply region for the liquid material, is collectively irradiated onto the liquid material, whereby the connecting capability between the both disconnected end portions and the precipitated metal can be improved by uniformizing the film thickness distribution of the precipitated metal film between the disconnected end portions, thus providing the enhanced reliability of the joints.

Also, after irradiating a laser light upon the liquid material supplied to the wiring disconnected portion to precipitate a metal film, the laser light is irradiated again in atmosphere of inactive gas, thereby improving the electric characteristics of the precipitated metal film.

Further, when an electronic circuit substrate is corrected by using a method according to the present invention, the effects of the greatly improved yield of product and the reduced product cost are exhibited.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A TFT substrate comprising:

a glass substrate;

a lower wiring formed on the glass substrate;

an insulating film formed on the glass substrate and covering the lower wiring;

a plurality of picture element electrodes formed on the insulating film;

an upper wiring formed on the insulating film and connected to the plurality of picture element electrodes through a semiconductor film; and a protection film formed on the plurality of picture element electrodes and the upper wiring;

wherein the upper wiring has initially at least one disconnected or partially disconnected portion therein which is connected by a metal thin film.

2. A TFT substrate according to claim 1, wherein the upper wiring is Al and the metal thin film contains at least one of Pd, Au and platinum.

3. A TFT substrate according to claim 1, wherein the upper wiring is Al and a contact resistance between the upper wiring of the disconnected or partially disconnected portion and the metal thin film connecting the disconnected or partially disconnected portion is no greater than 300 Ω.

4. A TFT substrate according to claim 1, wherein end points of the disconnected or partially disconnected portion of the upper wiring have a tapered shape.

5. A TFT substrate according to claim 1, wherein a thickness of the metal thin film connecting the disconnected or partially disconnected portion is less than a thickness of the upper wiring.

6. An electronic circuit substrate comprising:

a substrate; and a wiring provided in a layer on the substrate and having initially a wiring disconnected portion therein which is corrected by reconnection thereof with a conductive film provided at least in the layer of the wiring;

wherein the conductive film has end parts proximate to disconnected end portions of the wiring disconnected portion having a thickness larger than a thickness of a middle part of the conductive film provided between the disconnected end portions of the wiring disconnected portion.

7. An electronic circuit substrate according to claim 6, wherein the conductive film is precipitated from a solution including a metal complex selected from at least one of Pd, Au and platinum.

8. An electronic substrate according to claim 6, wherein the substrate is a glass substrate and the wiring having the initially disconnected portion is a wiring provided on the substrate intended for establishing electrical connection to at least one electrical device on the substrate and which is initially unable to establish the electrical connection due to improper formation of the wiring as a result of the initially disconnected portion therein, the wiring and the conductive film being formed of different conductive materials.

9. A TFT substrate comprising:

a glass substrate;

a gate wiring formed on the glass substrate;

an insulating film formed on the glass substrate and covering the gate wiring;

a plurality of picture element electrodes formed on the insulating film;

a drain or data wiring formed on the insulating film;

a source electrode connected to the plurality of picture element electrodes and connected to the drain or data wiring through a semiconductor film;

a protection film formed on the plurality of picture element electrodes and the upper wiring;

wherein said drain or data wiring has initially at least one disconnected or partially disconnected portion therein which is connected by a metal thin film.

10. A TFT substrate according to claim 9, wherein the drain or data wiring is Al and the metal thin film contains at least one of Pd, Au and Pd.

11. A TFT substrate according to claim 9, wherein the drain or data wiring is AL and a contact resistance between the drain or data wiring of the disconnected or partially disconnected portion and the metal thin film connecting the disconnected or partially disconnected portion is less than 300 Ω.

12. A TFT substrate according to claim 9, wherein end points of the disconnected or partially disconnected portion of the drain or data wiring have a tapered shape.

13. A TFT substrate according to claim 9, wherein a thickness of the metal thin film connecting the disconnected or partially disconnected portion is less than a thickness of the drain or data wiring.

* * * * *